(12) United States Patent
Moteki et al.

(10) Patent No.: US 7,378,777 B2
(45) Date of Patent: May 27, 2008

(54) DRIVE APPARATUS AND DEVICE WITH SAME

(75) Inventors: Masatoshi Moteki, Shiojiri (JP); Tadahiro Mizutani, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/480,353

(22) Filed: Jul. 5, 2006

(65) Prior Publication Data

US 2006/0250048 A1    Nov. 9, 2006

Related U.S. Application Data

(62) Division of application No. 10/460,653, filed on Jun. 13, 2003, now Pat. No. 7,116,037.

(30) Foreign Application Priority Data

| Jun. 14, 2002 | (JP) | ............................. 2002-174963 |
| Sep. 24, 2002 | (JP) | ............................. 2002-277968 |
| Mar. 31, 2003 | (JP) | ............................. 2003-096220 |

(51) Int. Cl.
*H01L 41/08* (2006.01)

(52) U.S. Cl. ............................. 310/323.16; 310/323.02

(58) Field of Classification Search ........... 310/323.02, 310/323.12, 323.16, 328

See application file for complete search history.

(56) References Cited

U.S. PATENT DOCUMENTS 6,396,194 B1 *    5/2002   Iino et al. .............. 310/323.16

FOREIGN PATENT DOCUMENTS

JP        H02-41673 A       2/1990

* cited by examiner

*Primary Examiner*—Mark Budd
(74) *Attorney, Agent, or Firm*—Global IP Counselors, LLP

(57) ABSTRACT

A rotary drive device is configured to be reduced in size while still delivering a prescribed torque. The rotary drive device has a base part with a vibrating body and a rotating body attached to the base part. The vibrating body has at least one piezoelectric element that vibrates an abutting part, which rotates the rotating body. Specifically, the rotating body has a contact part that is positioned at a prescribed distance from the rotational center and that is abutted against by the abutting part. When voltage is applied to the piezoelectric element, the vibrating body vibrates to repetitively press the abutting part against the contact part to rotate the rotating body. The vibrating body is positioned in a plane that intersects the rotational axis of the rotating body, and is disposed at least as close to the rotational axis of the rotating body as that of the contact part.

11 Claims, 38 Drawing Sheets

DRIVE APPARATUS AND DEVICE WITH SAME

CROSS-REFERENCE TO RELATED APPLICATION

This application is a divisional application of U.S. patent application Ser. No. 10/460,653 filed on Jun. 13, 2003, which claims priority to Japanese Patent Application Nos. JP2002-174963, 2002-277968, and 2003-096220 filed on Jun. 14, 2002, Sep. 24, 2002, and Mar. 31, 2003 respectively. The entire disclosures of U.S. patent application Ser. No. 10/460,653 and Japanese Patent Application Nos. JP2002-174963, 2002-277968, and 2003-096220 are hereby incorporated herein by reference.

BACKGROUND OF THE INVENTION

1. Field of the Invention

The present invention generally relates to a rotary drive device. More specifically, the present invention relates to a rotary drive device provided with a vibrating body having a piezoelectric element and a rotating body that the vibrating body abuts against, wherein a voltage to the piezoelectric element causing the vibrating body to vibrate and thereby rotating the rotating body. The present invention further relates to a device equipped with such a rotary drive device.

2. Background Information

Rotary drive devices that use a piezoelectric element are already known. For example, Japanese Laid-Open Patent Publication No. 10-080164 discloses a rotary drive device that uses a piezoelectric element as described on pages 2 and 3 and illustrated in FIG. 1 of this Japanese publication. The rotary drive device of this Japanese publication is provided with a base part, a vibrating body and a rotating body. The vibrating body is provided on the base part, and has a piezoelectric element. The rotating body is provided on the base part and abutted against by the vibrating body. The vibrating body is shaped like a circular disc and has an output shaft arranged along its rotational axis. The vibrating body abuts against the outer circumferential surface of the rotating body.

With this kind of rotary drive device, the rotating body can be rotated and drive power can be delivered via an output shaft by applying a voltage to the piezoelectric element, which in turn causes the vibrating body to vibrate. It is difficult to reduce the size of such a rotary drive device beyond a predetermined limit.

However, it has been discovered that since a vibrating body is provided on the outer circumference of the rotating body, the size of the rotary drive device is at least as large as the sum of the sizes of the rotating body and the vibrating body. Therefore, there is a limit to how small the device can be made when a prescribed drive torque is to be delivered.

The magnitude of the drive torque T of the rotary drive device is expressed as the product of the rotary force F and the distance r from the rotational center of the rotary shaft to the point where the rotary force F acts (here, the radius of the rotating body). Therefore, if the required torque is T1 and the rotary force F has a fixed magnitude, e.g., F1, then the radius R1 of the rotating body can be calculated and the size of the rotating body can be determined.

In view of the above, it will be apparent to those skilled in the art from this disclosure that there exists a need for an improved rotary drive device. This invention addresses this need in the art as well as other needs, which will become apparent to those skilled in the art from this disclosure.

SUMMARY OF THE INVENTION

One object of the present invention is to provide a rotary drive device that can be reduced in size while still delivering a prescribed torque and also to provide a device equipped with such a rotary drive device.

The rotary drive device and device equipped therewith of the present invention basically comprises a base part, a rotating body, and a vibrating body. The rotating body has a contact part disposed about a rotational center axis. The vibrating body has an abutting part and a piezoelectric element configured to vibrate upon application of a voltage so that the abutting part repeatedly abuts the contact part to rotate the rotating body. The vibrating body is located in at most the same distance as the first contact part from a rotational center axis of the rotating body.

An apparatus of the present invention is provided with any of the previously described rotary drive devices. Since it is provided with the previously described rotary drive device, this invention can achieve the previously described effects and allows the previously described rotary drive device to be utilized for such applications as the following: liquid supply apparatuses (tube pump), camera film winding mechanisms, camera lens drive mechanisms, vibration motors, floppy disc drive (FDD), record players, CD players, electric bicycles, electric scooters, electric automobiles, cooling fans, small electronic devices, small pumps, toys, piping inspection devices (robots), etc.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
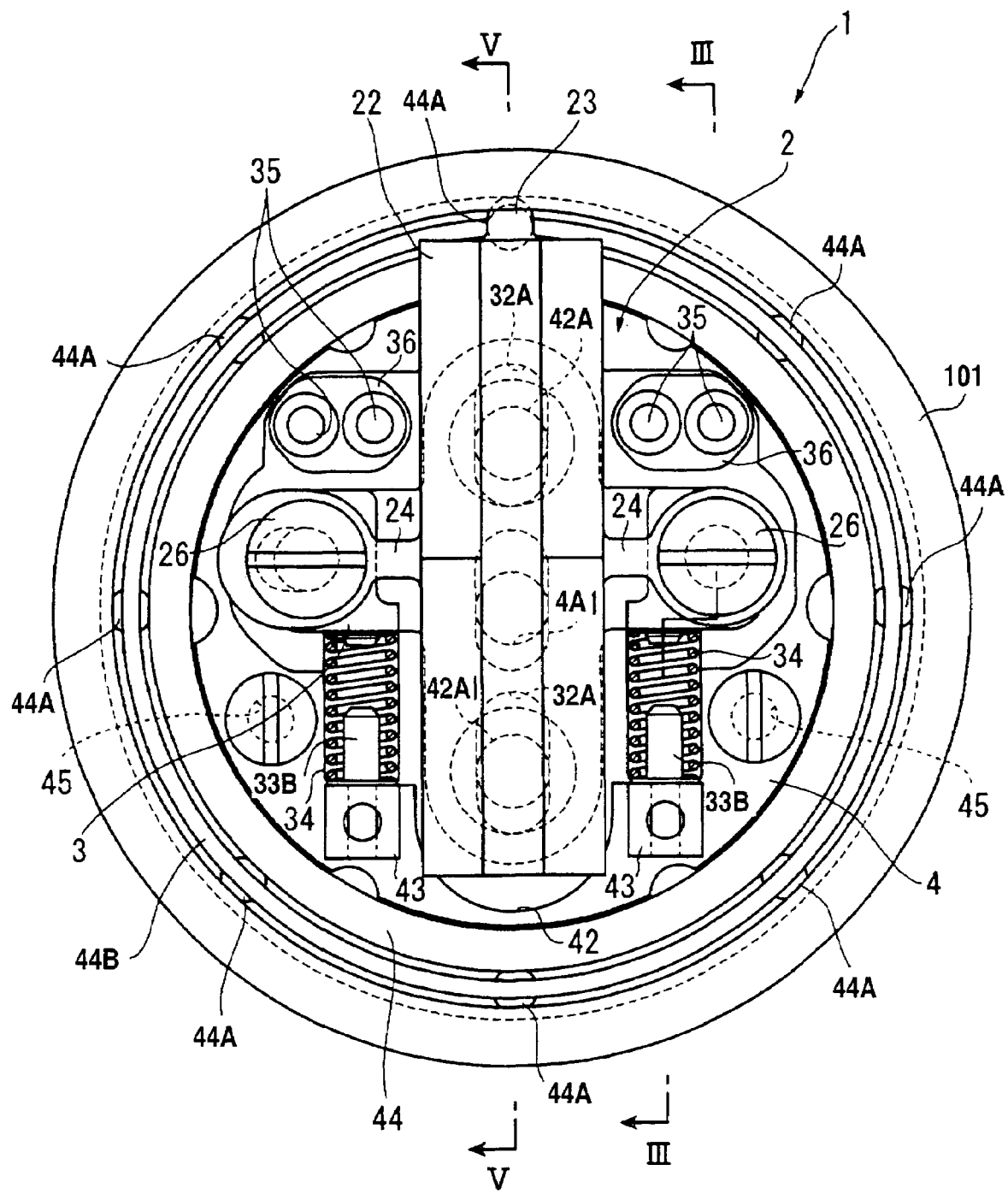
FIG. 1 is a top plan view of a rotary drive device in accordance with a first embodiment of the present invention.

The rotary drive device of the present invention, including configurations as noted above, is assumed to be employed to deliver the same drive torque T1 as a conventional rotary drive device using a vibrating body having the same performance as that used in the conventional rotary device. Thus, the rotary force F is the same and the distance r1, i.e., the size of the rotating body, is the same.

In the present invention, the vibrating body is positioned in a plane that intersects the rotational axis of the rotating body, and is disposed at least as close to the rotational axis of the rotating body as that of the contact part. Therefore, it is not necessary to provide a space for installing the vibrating body on the outside of the rotating body, as is the case in conventional rotary drive devices, and the rotary drive device can be reduced in size accordingly. In short, the rotary drive device can be reduced in size while still delivering a prescribed drive torque.

In general, piezoelectric elements are not always durable against physical shock. By comprising the vibrating body so as to include a flat reinforcing plate and a piezoelectric element installed on the front and rear surfaces of the reinforcing plate and providing the abutting part on the reinforcing plate, impact forces and other excessive forces acting on the rotating body from the outside are prevented from being transmitted directly to the piezoelectric element. Thus, the shock resistance of the rotary drive device can be improved.

In the present invention, it is preferred that the abutting part of the vibrating body has a convex arc shaped free end, and the contact part of the rotating body has a concave arc shaped contact surface with respect to the direction in which the abutting part abuts against the contact part. This aspect of the present invention makes it possible to secure the contact surface between the abutting part and the contact part when the angle at which the abutting part and contact part touch each other changes due to movement of the rotational axis of the rotating body. As a result, the rotary drive device can be driven in a stable manner.

In the present invention, it is preferred that the vibrating body be plural in number and arranged at equal intervals along the contact part of the rotating body and that the abutting parts abut against the contact part from the rotational center. This aspect of the present invention makes it possible for the abutting parts to press against the contact part of the rotating body from the rotational center with equal forces in a balanced manner. As a result, the rotational axis of the rotating body is prevented from deviating off center and the rotary drive device can be driven in a stable manner.

Also, since the rotating bodies can be supported by the abutting parts, it is not necessary to support the rotating bodies with the rotary shaft and the space inside the rotating bodies can be utilized effectively. For example, when the rotating bodies are supported by the rotary shaft, it is necessary to arranged parts in a manner that avoids the rotary shaft. However, with this invention, it is not necessary to arrange the vibrating bodies so as to avoid the rotary shaft. Consequently, the same vibrating bodies can be used while making the rotating bodies smaller than in the case of rotating bodies that are supported by the rotary shaft. Thus, the rotary drive device can be further reduced in size.

In the present invention, it is preferred that the vibrating body be plural in number and arranged at equal intervals along the contact part of the rotating body and that the abutting parts abut against the contact part in a direction generally parallel to the rotational axis. This aspect of the present invention makes it possible for the abutting parts to press against the contact part of the rotating body in a direction generally parallel to the rotational axis with equal forces in a balanced manner. As a result, the rotational axis of the rotating bodies is prevented from deviating off center and the rotary drive device can be driven in a stable manner.

In the present invention, it is preferred that the vibrating bodies be driven by one drive signal. This aspect of the present invention enables reducing manufacturing costs and operating costs because the vibrating bodies are driven by a single drive signal (e.g., a voltage applied by a single driving device that is connected to all of the vibrating bodies) and it is not necessary to provide a separate signal generating device (e.g., driving device) for each vibrating body.

In the present invention, it is preferred that there be provided a pressing force applying member that presses the abutting part of the vibrating body against the contact part of the rotating body. This aspect of the present invention enables the abutting part to press reliably against the contact part and the rotating body to be reliably rotated. As a result, the rotary drive device can be driven in a stable manner.

Also, when the rotating body is in a stopped state, unnecessary rotation of the rotating body can be suppressed when an external rotary force acts thereon because the abutting part touches against the contact part of the rotating body and act as a stopper that resists rotation of the rotating body.

In the present invention, it is preferred that the vibrating body be supported by a support body that can move toward and retract away from the rotating body along a prescribed linear direction. This aspect of the present invention restricts the direction in which the support body advances and retracts to a single linear direction and thereby causes the abutting part of the vibrating body to always abut against the contact part of the rotating body at a prescribed angle. As a result, the rotary drive device can be driven in a stable manner even when it has been used for a long period of time and the vibrating body has become somewhat worn.

In the present invention, it is preferred that there is a pressing force adjusting member that adjusts the pressing force applied by the pressing force applying member.

Conventionally, when a body is driven by the vibration of a vibrating body equipped with a piezoelectric element, the driven speed (movement speed) of the driven body can be adjusted by continuously or intermittently applying a pulse voltage to the piezoelectric element. With this method, the driven body is moved at a high speed by applying the pulse voltage to the vibrating body continuously. Meanwhile, the driven body is moved at a low speed by applying the pulse voltage to the vibrating body continuously and then discontinuing the pulse voltage for a prescribed amount of time. Thus, by intermittently applying the pulse voltage to the vibrating body and intermittently driving the driven body, the driven body can be driven at the desired average movement speed.

However, when a pulse voltage is applied to the vibrating body in an intermittent manner as just described, the vibrational state is unstable during the initial period when the vibrating body starts to vibrate from a state of rest. Thus, during this initial period, good power transmission to the driven body cannot be accomplished and the driving force tends to decline. Particularly when the driven body is a rotating body, the driven body attempts to continue rotating due to inertia. Consequently, frictional forces act on the portions where the driven body and the vibrating body contact each other when the vibrating body is stopped and the rotational torque declines. When this occurs, wear occurs at the contacting portions of the two bodies and the durability of the device cannot be improved.

With this invention, the pressing force applied against the vibrating body is adjusted by the pressing force adjusting member. As a result, the driving force applied against the rotating body by the vibrating body can be changed, and thus, the rotational speed of the rotating body can be changed. Since the driving force is changed by adjusting the force with which the vibrating body presses against the rotating body, the vibrating body can be vibrated continuously while constantly maintaining a stable vibrational state, thereby preventing the decline in driving force that occurs with the conventional method of obtaining the desired movement speed by vibrating the vibrating body intermittently.

In the present invention, it is preferred that the pressing force adjusting member be configured in such a manner that the pressing force can be adjusted manually. This aspect of the present invention simplifies the structure of the pressing force adjusting member because the pressing force is adjusted manually. Consequently, maintenance of the rotary drive device is easier and manufacturing costs are reduced.

In the present invention, it is preferred that the pressing force adjusting member be configured in such a manner that the pressing force can be adjusted automatically. This aspect of the present invention enables the pressing force of the vibrating body against the rotating body to be adjusted dynamically even while the rotating body is rotating because the pressing force is adjusted automatically. Consequently, the rotational speed can be adjusted in a flexible manner.

In the present invention, it is preferred that the pressing force adjusting member be configured such that the pressing force of the abutting part against the contact part can be adjusted in a continuously variable manner. This aspect of the present invention enables the pressing force to be adjusted in a continuously variable manner and thus the rotational speed of the rotating body to be set in a continuous (stepless) manner. As a result, fine tuning of the rotational speed can be accomplished with ease.

In the present invention, it is preferred that there is a plurality of pressing force adjusting members provided with respect to the vibrating body. This aspect of the present invention adjusts the pressing force of the vibrating body with a plurality of pressing force adjusting members, thereby reducing the load acting on a single pressing force adjusting member. As a result, the durability of each pressing force adjusting member is improved. This invention also makes it easy to fine tune the pressing force because the amount by which a single pressing force adjusting member changes the pressing force can be set to a small amount.

In the present invention, it is preferred that there be a plurality of vibrating bodies provided with respect to one pressing force adjusting member. This aspect of the present invention makes it possible to adjust a plurality of vibrating bodies with a single pressing force adjusting member. As a result, the number of parts is reduced and the cost of manufacturing the rotary drive device is lowered. Furthermore, the pressing forces of the vibrating bodies against the rotating body are uniform and the efficiency of the power transmission to the rotating body is improved.

In the present invention, it is preferred that there be a guide that is provided on the base part and that guides the rotating body by abutting against the rotating body. In this aspect of the present invention the guide that guides the rotating body prevents the rotational axis of the rotating body from deviating off center. Thus, the rotary drive device can be driven in a stable manner.

Also, by arranging the vibrating bodies and guides in positions corresponding to the vertices of an equilateral triangle or isosceles triangle, the vibrating bodies and guides can press against the rotating body with equal forces in a balanced manner and the rotary drive device can be driven in an even more stable manner.

In the present invention, it is preferred that the rotating body be supported by the abutting part and the guide be located at positions that are a prescribed distance from the rotational center. In the past, for example, it was necessary to arrange parts so as to avoid the rotational axis when the rotating body was supported about its rotational axis. However, with aspect of the present this invention, the vibrating bodies can be arranged on the rotational axis. Consequently, the space inside the rotating body can be utilized more effectively than in cases where the rotating body is supported about its rotational axis and the size of the rotary drive device can be reduced further.

In the present invention, it is preferred that the rotating body be arranged around the outer circumference of the base part. With this aspect of the present invention, the size of the rotating body can be maximized with respect to the size of the base part and thus the driving force can be maximized with respect to the size of the rotary drive device.

In the present invention, it is preferred that the rotating body be provided such that it can be attached to and detached from the base part. Since this aspect of the present invention is configured such that the rotating body can be attached to and detached from the base part, the rotary drive device can be used for a long time by replacing the rotating body or vibrating body when the contact part of the rotating body or abutting part of the vibrating body becomes somewhat worn due to long-term use. As a result, the service life of the rotary drive device is improved. Furthermore, the general applicability of the rotary drive device can be improved because a variety of different rotating bodies can be installed.

In the present invention, it is preferred that the base part and/or the rotating body has a cooling-purpose opening that communicates between the outside and the inside of the space that is formed around the vibrating body as a result of the vibrating body being substantially surrounded by the base part and/or the rotating body. Heat is generated in the area surrounding the vibrating body due to the vibration of the vibrating body itself and the contact of the abutting part of the vibrating body against the contact part of the rotating body. Since the properties of the piezoelectric element change depending on the ambient temperature, there is the risk that the properties of the vibrating body will change due to the heat surrounding the vibrating body and the rotary drive device will not operate in a stable manner. With this aspect of the present invention, the heat can be radiated through the openings in the base part and/or the rotating body. As a result, the inside temperature, particularly the temperature in the area surrounding the piezoelectric element, can be prevented from rising rapidly and the rotary drive device can be driven in a stable manner. This arrangement also improves the ease of assembly because internal parts of the rotary drive device can be assembled by inserting hands and tools through the openings.

In the present invention, it is preferred that a conductive terminal that connects to the vibrating body be provided on the face of the base part that is on the opposite side of the base part as the vibrating body. Since this aspect of the present invention provides a conductive terminal on the base part, the vibrating body is easy to connect when the rotary drive device is installed into another device. Since the conductive terminal is provided on the opposite side of the base part as the vibrating body, the space of the base part can be utilized effectively and a reliable connection can be made without hindering the vibration of the vibrating body.

In the present invention, it is preferred that the outer circumferential part of the rotational body be capable of transmitting power. A moment that acts about an axis perpendicular to the rotational axis of the rotating body, i.e., a moment that acts in such a direction as swing the rotational axis of the rotating body out of position, is expressed as the product of an external force and the perpendicular distance from the point where the rotating body is supported by the base part to the line along which the external force acts. When an output shaft is provided along an extension line of the rotational shaft of the rotating body, the aforementioned perpendicular distance will be longer and the moment will be larger when an external force acts on the output shaft in a radial direction of the rotating body. This is a problem in that the rotary shaft will easily shift off center. With this aspect of the present invention, power is transmitted with the outer circumferential part of the rotating body. Thus, even if an external force acts on the outer circumferential part of the rotating body in the radial direction of the rotating body, the perpendicular distance from the point where the base part supports the rotating body to the line along which the external force acts can be kept short. As a result, the magnitude of moments acting about axes perpendicular to the rotational axis of the rotating body can be reduced and the rotary drive device can be driven in a stable manner.

In the present invention, it is preferred to have a driving device that is provided on the base part and serves to drive the vibrating body. When the driving device is provided separately from the rotary drive device, it is necessary to use lead wires to carry the drive signal from the driving device to the rotary drive device. With this aspect of the present invention, it is not necessary to draw lead wires from the rotary drive device in order to deliver the drive signal. Thus, the structure is simplified and the device is easier to handle. Also, since the rotary drive device can be driven in a standalone manner, it is more portable and can be used outdoors and other places where it is difficult to secure a power source.

Selected specific embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

In the subsequent descriptions of the second embodiment and other embodiments, the descriptions of the component parts that are the same or have similar functions as corresponding component parts of the first embodiment may be simplified or omitted.

First Embodiment

Referring initially to FIG. 1, a rotary drive device 1 is illustrated in accordance with a first embodiment of the present invention. FIG. 1 shows a top plan view of the rotary drive device 1 in accordance with the first embodiment. The rotary drive device 1 basically includes a vibrating body 2, a support body 3, a base part 4 and an annular rotating body 101. The rotating body 101 is driven by the vibrations of the vibrating body 2. The vibrating body 2 is mounted to the base part 4 by the support body 3 that fixes the vibrating body 2 in such a manner that the vibrating body 2 can vibrate. The rotating body 101 is provided on the outer circumference of the base part 4 in such a manner that it can rotate relative to the vibrating body 2.

The rotary drive device 1 is installed into, for example, a camera unit and used as part of a film winding mechanism by placing a belt around the outer circumference of the rotating body 101 to transfer the rotational motion of the rotating body 101 so as to wind the film of the camera via the belt.

Figure 2:
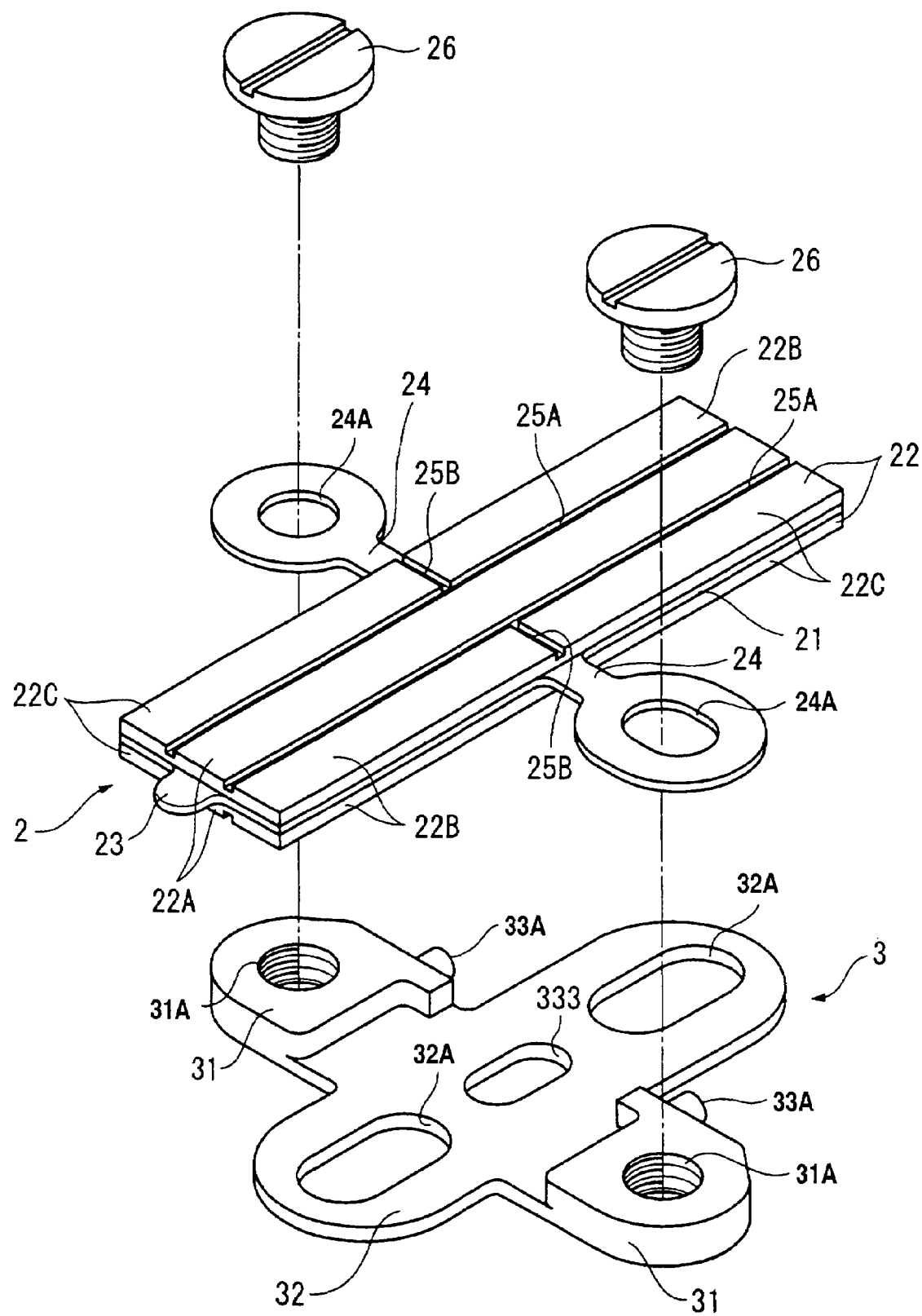
FIG. 2 is an enlarged, exploded perspective view of a vibrating body of the rotary drive device in accordance with the first embodiment.

FIG. 2 shows an exploded view of the vibrating body 2 and the support body 3. As shown in both FIGS. 1 and 2, the vibrating body 2 comprises a reinforcing plate 21 that is generally rectangular in shape, and a pair of flat plate-shaped piezoelectric elements 22 that are provided on the front and back surfaces of the reinforcing plate 21.

Figure 5:
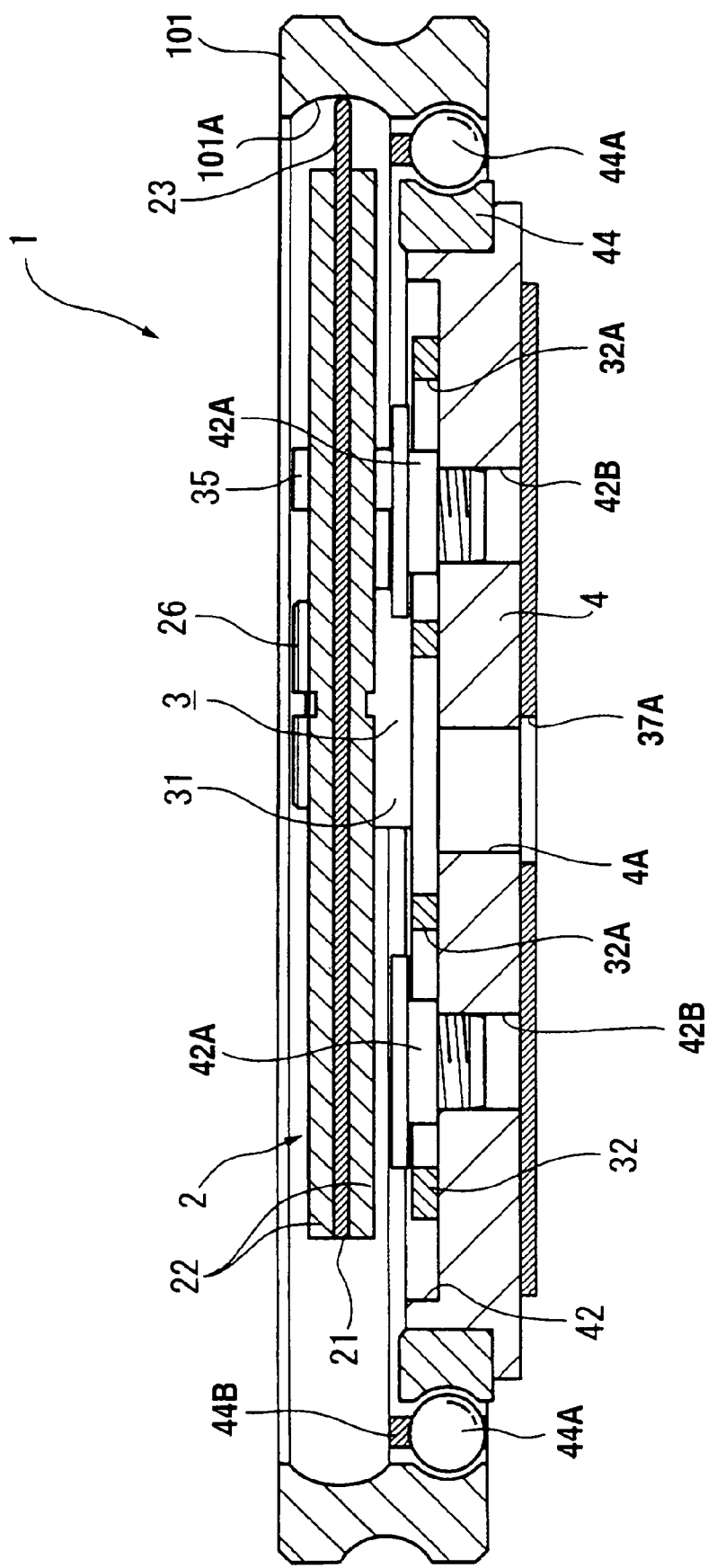
FIG. 5 is a cross sectional view of the rotary drive device taken along line V-V of FIG. 1 in accordance with the first embodiment.

The reinforcing plate 21 is preferably made of stainless steel or other suitable materials. The reinforcing plate 21 has an abutting part 23 formed integrally on one of the short ends of the reinforcing plate 21, and a pair of arm parts 24 formed integrally on the long sides of the reinforcing plate 21. Preferably, the abutting part 23 is disposed at a position approximately midway in the widthwise direction of the reinforcing plate 21. The free edge of the abutting part 23 has a cross sectional shape that is preferably generally a convex arc shape as best seen in FIG. 5. As best seen in FIG. 5, the reinforcing plate 21 is arranged such that the tip of the abutting part 23 abuts against an inside circumference surface or contact part 101A of the rotating body 101. The reinforcing plate 21 is further arranged to extend substantially perpendicular to a line that is tangent to the inside circumference surface or contact part 101A. In other words, the reinforcing plate 21 is aligned in a substantially radial direction of the rotating body 101. In short, the vibrating body 2 is disposed in a plane that perpendicularly intersects the rotational axis of the rotating body 101. The vibrating body 2 is closer to the rotational axis of the rotating body 101 than the position where the abutting part 23 abuts against the rotating body 101.

The arm parts 24 extend widthwise in opposite directions from the long sides of the reinforcing plate 21 at positions approximately midway in the lengthwise direction of the reinforcing plate 21. The arm parts 24 protrude substantially orthogonally from the reinforcing plate 21. Each of the arm parts 24 has a hole 24A formed in the free end thereof.

The piezoelectric elements 22 are bonded to both surfaces of the generally rectangular portion of the reinforcing plate 21. There are no particular limitations on the material of the piezoelectric device 22. For example, any of the following materials can be used: lead zirconate titanate (PZT®), crystalline quartz, lithium niobate, barium titanate, lead titanate, lead meta-niobate, vinylidene polyfluoride, lead zinc niobate, and lead scandium niobate.

Electrodes are formed on both surfaces of each piezoelectric element 22 by plating, sputtering, or vapor depositing such metals as nickel and gold. The electrodes on the inner surfaces of the piezoelectric elements 22 that face the reinforcing plate 21 are formed over the entire surfaces of the piezoelectric elements 22. On the outer surfaces of the piezoelectric elements 22 that do not face the reinforcing plate 21, a plurality of electrodes electrically insulated from one another by grooves are arranged symmetrically with respect to the lengthwise centerline of the piezoelectric element 22. In short, as seen in FIG. 2, two grooves 25A are provided on the outer surface of each piezoelectric element 22 so as to divide the piezoelectric element 22 lengthwise into three substantially equal sections to define three electrodes. Among the three electrodes defined by the grooves 25A, the two outside electrodes are further divided crosswise into substantially equal sections by grooves 25B. Thus, on the outer surface of the piezoelectric element 22, the grooves 25A and 25B form an electrode 22A and two pairs of electrode pairs 22B and 22C. The electrode 22A is located substantially in the center of the piezoelectric element 22 relative to its crosswise direction such that the electrode 22A extends in a longitudinal direction. One of the electrode pairs 22B and 22C is located on each side of the electrode 22A. The electrodes 22B are arranged to be diagonally opposite each other. Similarly, the electrodes 22C are arranged to be diagonally opposite each other. Lead wires (not shown) connect the electrodes 22A, 22B and 22C to one of a plurality of conductive pins 35 mounted on the base part 4. Here, there are four conductive pins 35 with the electrodes 22A of the piezoelectric elements 22 being connected to a first of the four conductive pins 35, the electrodes 22B of the piezoelectric elements 22 being connected to a second of the four conductive pins 35, and the electrodes 22C of the piezoelectric elements 22 being connected to a third of the four conductive pins 35. The reinforcing plate 21 is also provided with a lead wire (not shown) that connects the reinforcing plate 21 to the fourth conductive pin 35, i.e., the conductive pin 35 not connected with any of the aforementioned electrodes.

These electrodes 22A, 22B and 22C are provided in the same manner on both of the piezoelectric elements 22, i.e., on both the front and back sides of the reinforcing plate 21. For example, the electrode 22A on the front side of the reinforcing plate 21 is in a position corresponding to the position of the electrode 22A on the back side of the reinforcing plate 21.

The dimensions, thickness, electrode arrangement, etc., of the piezoelectric element 22 are selected as appropriate such that when voltage is alternately applied to the piezoelectric element 22, the piezoelectric element 22 simultaneously exhibits longitudinal vibration in which it elongates and contracts in the lengthwise direction and bending vibration in which it bends in a direction perpendicular to the longitudinal vibration in a manner that is point-symmetrical with respect to the planar center thereof. It is preferred that the resonance frequency for longitudinal vibration and the resonance frequency for bending vibration be in close proximity of each other and that the ratio of the resonance frequency for bending vibration to the resonance frequency for longitudinal vibration be greater than 1.00 and less than or equal to 1.03. It is also preferred that the length ratio of the short side of the piezoelectric element 22 to the long side be such that the length of the short side is equal to 0.274 or greater when the length of the long side is equal to 1.

If the length of the short side of the piezoelectric element 22 is less than 0.274 when the length of the long side is equal to 1, the resonance frequency for longitudinal vibration will exceed the resonance frequency for bending vibration, i.e., the ratio of the resonance frequency for bending vibration to the resonance frequency for longitudinal vibration be less than 1.00, and the abutting part 23 will not follow a satisfactory elliptical path. Meanwhile, if the ratio of the resonance frequencies is greater than 1.03, the resonance point for longitudinal vibration and the resonance point for bending vibration will be too far apart and it will not be possible to set a vibrational frequency for which the amplitudes of both types of vibration become large simultaneously.

The frequency of the voltage applied to the piezoelectric elements 22 is selected to be between the resonance frequency for longitudinal vibration and the resonance frequency for bending vibration or, more preferably, between the anti-resonance frequency and the resonance frequency for bending vibration. The frequency of the applied voltage is selected appropriately such that both types of vibration are exhibited in a satisfactory manner. There are no particular limitations on the waveform of the voltage applied to the piezoelectric elements 22; such waveforms as sine waves, square waves, and trapezoidal waves can be used.

Figure 3:
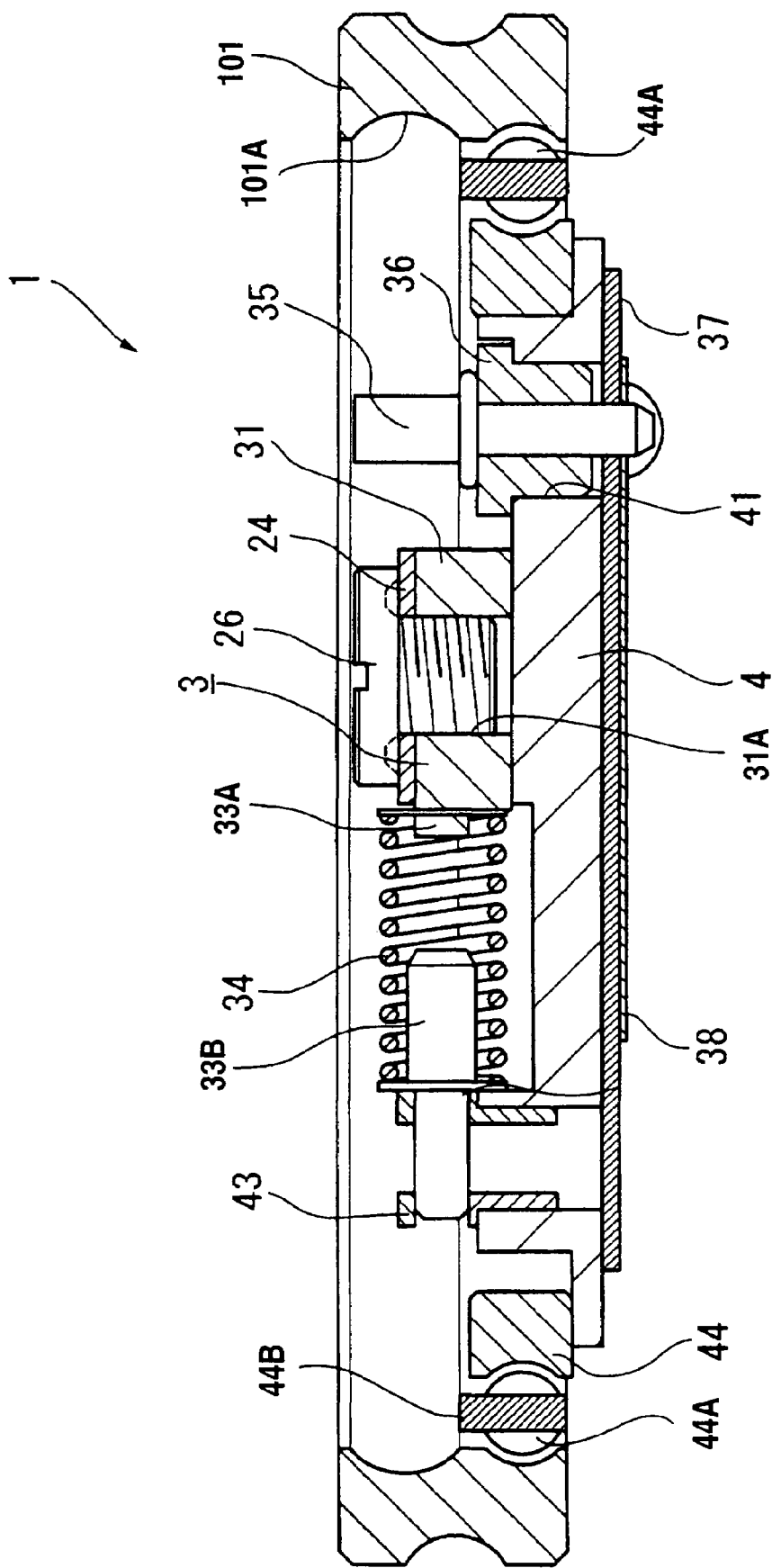
FIG. 3 is a cross sectional view of the rotary drive device taken along line III-III of FIG. 1 in accordance with the first embodiment.
Figure 4:
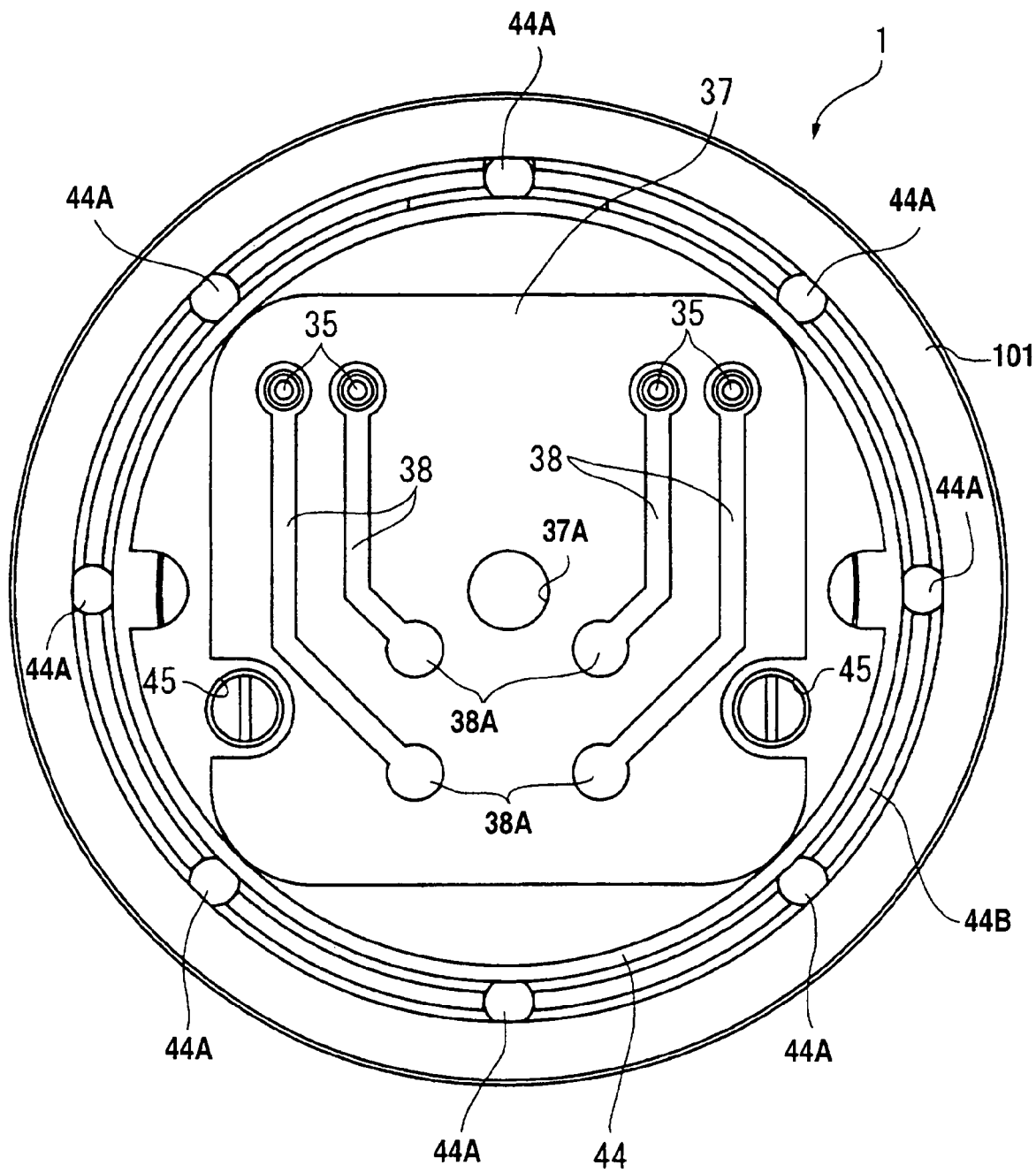
FIG. 4 is a bottom plan view of the rotary drive device in accordance with the first embodiment.

FIG. 3 is a lateral cross sectional view of the rotary drive device 1 taken along line III-III of FIG. 1. FIG. 4 is a bottom plan view of the rotary drive device 1. As shown in FIGS. 1, 3 and 4, the conductive pins 35 (made of metal or other material), which are connected to the electrodes of the piezoelectric element 22, are arranged such that two of the conductive pins 35 are provided on both lateral sides of the vibrating body 2. In this embodiment, there are a total of four pins, with two on each lateral side of the vibrating body 2. Each of the conductive pins 35 passes through a through hole 41 that is provided in the base part 4. Each of the conductive pins 35 protrudes through the base part 4 to the side of the base part 4 where the vibrating body 2 is not provided. Preferably, metal plating is applied to the surfaces of the conductive pins 35 to reduce the electrical resistance. An insulating member 36 is disposed in each of the through holes 41 such that the insulating members 36 are disposed between the through holes 41 and the conductive pins 35 to insulate the base part 4 from the conductive pins 35.

A substrate 37 is provided on the surface of the base part 4 where the vibrating body 2 is not provided. The substrate 37 has conductive patterns 38 of rolled copper or the like formed therein. The conductive pins 35 also pass through this substrate 37. The substrate 37 is made of, for example, polyamide resin or other material that is flexible and electrically insulating. The conductive patterns 38 each have an end formed at the periphery of a through hole through which a conductive pin 35 passes. These ends conductive patterns 38 are connected to the conductive pins 35 in an electrically conductive manner with solder or other means. The other ends of the conductive patterns 38 are arranged in closely adjacent positions on the substrate 37 and form conductive terminals 38A.

Thus configured, the four conductive terminals 38A are electrically connected to electrodes 22A, 22B, 22C and the reinforcing plate 21, respectively. The conductive terminals 38A are configured to be connected to a driving device (not shown) that applies AC voltage to the piezoelectric elements 22. The vibrating body 2 can be connected to the driving device easily by providing a substrate having a conductive pattern with terminals in positions corresponding to the conductive terminals 38A and then clamping that substrate of the driving device face-to-face with the substrate 37 using fasteners that are threaded into the mounting holes 45. This arrangement enables the two substrates to be readily connected together in such a manner that the four conductive terminals 38A are simultaneously connected to the driving device by pressure contact.

FIG. 5 shows another lateral cross sectional view of the rotary drive device 1 taken along line V-V of FIG. 1. As seen in FIG. 5, the substrate 37 has a positioning hole 37A at a position that corresponds to the rotational center of the rotating body 101. Likewise, the base part 4 has a positioning hole 4A at a position that corresponds to the rotational center of the rotating body 101. The positioning holes 37A and 4A are positioned at the rotational center of the rotating body 101 so that when the rotary drive device 1 is installed in an external device, the rotational center of the rotating body 101 can be easily determined.

Referring to FIGS. 2 and 5, the support body 3 is made of hard plastic or other material, and comprises a pair of fixing parts 31 to which the vibrating body 2 is fixed, and a sliding part 32 that is formed integrally between the fixing parts 31. The sliding part 32 is supported on the base part 4 in such a manner that it can slide in a reciprocating manner when voltage is applied to the piezoelectric elements 22. Each fixing part 31 has a threaded hole 31A located at a position that corresponds to one of the holes 24A in one of the arm parts 24. The vibrating body 2 is fixed to the fixing parts 31 by passing a pair of screws 26 through the holes 24A of the arm parts 24, and then screwing the screws 26 into the threaded holes 31A. Consequently, the vibrating body 2 can be detached from the support body 3, which is fixed to the base part 4, by removing the screws 26.

The sliding part 32 is arranged in a sliding groove 42 (FIG. 5) provided in the base part 4. The sliding part 32 has a plurality of elongated holes or slots 32A (two in this embodiment). The slots 32A are provided at a plurality of positions (two in this embodiment) located substantially along the lengthwise centerline. Thus, the support body 3 is supported to move parallel to a radial direction that approaches toward and retracts from the rotating body 101. The sliding part 32 is attached to the base part 4 by a plurality of screws 42A (two in this embodiment). The screws 42A pass through the slots 32A, and are screwed into a pair of threaded holes 42B formed in the base part 4. Thus, the support body 3 can only slide in the lengthwise direction of the slots 32A, i.e., along a radial direction of the rotating body 101 from the position where the abutting part 23 abuts against the rotating body 101.

The fixing parts 31 and the sliding part 32 are formed such that their surfaces that face away from the base part 4 are disposed at different levels. More specifically, the fixing parts 31 and the sliding part 32 are configured such that a recessed portion is formed in the middle of the support body 3. The depth of this recessed portion of the support body 3 is slightly larger than the thickness of one of the piezoelectric elements 22. As a result, a gap is formed between the vibrating body 2 and the sliding part 32 when the vibrating body 2 is mounted to the fixing parts 31. Also the vibrating body 2 is arranged in this recessed portion of the support body 3 such that the vibrating body 2 does not interfere with the sliding part 32 or the screws 42A when it vibrates.

Referring now to FIGS. 1-3, the vibrating body 2 is urged by a pair of coil compression springs 34 relative to the base part 4 such that the abutting part 23 of the vibrating body 2 is pressed against the contact part 101A on the inside portion of the rotating body 101. The springs 34 form a biasing or pressing force applying member. As seen in FIGS. 2 and 3, the support body 3 has a pair of spring mounting parts 33A. One of the spring mounting parts 33A supports one end of each of the springs 34. In other words, one end of each of the springs 34 is fitted onto one of the spring mounting parts 33A. In particular, each of the spring mounting parts 33A has a circular rod shape that protrudes from on each of the two fixing parts 31 of the support body 3 on the sides thereof that face away from the abutting part 23 of the vibrating body 2. A circular rod-shaped abutting pin 33B is inserted into the other ends of each of the springs 34. The abutting pins 33B are fixed to a pair of stopping pieces 43 that are fixed to the base part 4. Thus, the springs 34 are arranged such that they elongate and contract along a direction parallel to the direction along which the vibrating body 2 approaches toward and retracts from the rotating body 101.

Accordingly, one end of each spring 34 abuts against the support body 3 and the other end of each spring 34 abuts against an abutting pin 33B such that the springs 34 press the support body 3 toward the rotating body 101. In short, the abutting part 23 of the vibrating body 2 is pressed against the contact part 101A on the inside portion of the rotating body 101 with an appropriate pressing force.

As shown in FIGS. 1, 3 and 5, the rotating body 101 is rotatably supported on an inner ring 44, which is adhesively secured to the outer circumference of the base part 4, with a plurality of balls 44A (eight in this embodiment) arranged at equal intervals between the rotating body 101 and the inner ring 44. A cylindrical ball holding part 44B made of synthetic resin or the like is provided between the inner ring 44 and the rotating body 101 to hold the balls 44A in place. The ball holding part 44B has substantially semicircular notches formed in the side of the ball holding part 44B that is closer to the substrate 37. These notches of the ball holding part 44B are equal in number to the number of the balls 44A and are arranged at equal intervals in the circumferential direction. Each ball 44A is fitted into one of the notches such that the balls 44A are held at a fixed spacing along the outer circumference of the inner ring 44. The rotating body 101, the inner ring 44 and the balls 44A are preferably made of stainless steel or other highly rigid material.

As best seen in FIG. 3, on the inside portion of the rotating body 101 is formed the contact part 101A, which has a concave arc shape as viewed in a cross sectional view with respect to the direction in which the abutting part 23 abuts. Thus, the convex arc shape of the abutting part 23 of the vibrating body 2 abuts against the concave arc shape of the contact part 101A. The surface of the contact part 101A is finished smooth so as to reduce wear of the abutting part 23. The contact part 101A serves to prevent the abutting part 23 from losing its mated condition with respect to the rotating body 101 when it shifts toward the rotational axis of the rotating body 101 due to vibration of the vibrating body 2.

Here, the rotating body 101 is provided such that it can be attached to and detached from the base part 4. To remove the rotating body 101 from the base part 4, the balls 44A are removed from the notches of the ball holding part 44B and the ball holding part 44B is removed from between the inner ring 44 of the base part 4 and the rotating body 101. The balls 44A will then be able to move freely between the inner ring 44 and the rotating body 101. Next, the balls 44A are gathered at one location on the outer circumference of the inner ring 44, and then the inner ring 44 is moved toward the rotating body 101 at the opposite side from where the balls 44A are located. When this is done, a gap that is larger than the balls 44A is formed between the inner ring 44 and the rotating body 101 such that the rotating body 101 can be removed from the inner ring 44 by taking the balls 44A out one by one through the gap.

Figure 6:
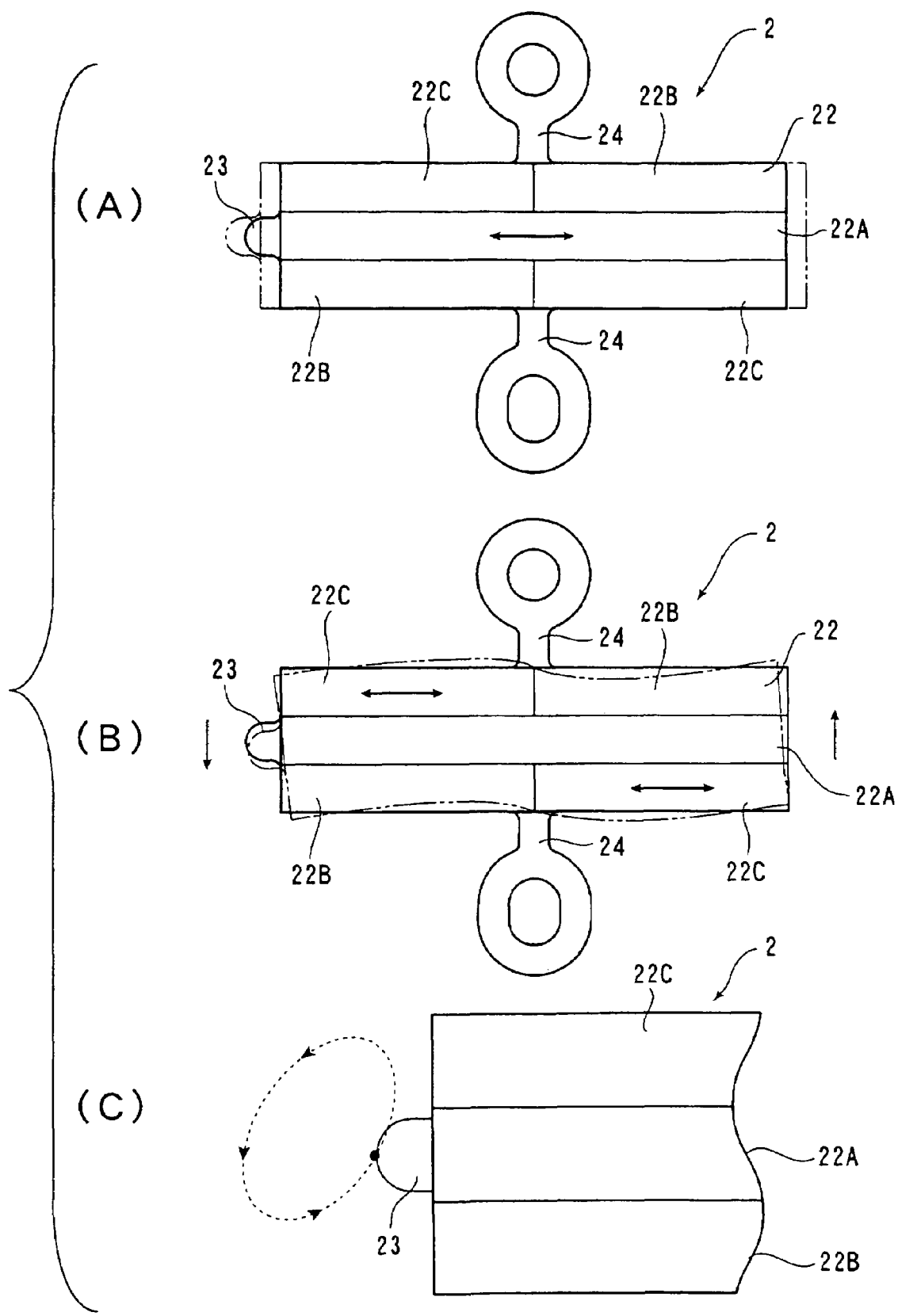
FIG. 6 is a series of top plan views of the vibrating body of the rotary drive device illustrating the operation of the vibrating body of the rotary drive device in accordance with the first embodiment.

Referring now to FIG. 6, a series of diagrammatic views are shown that illustrates how the vibrating body 2 operates. The view (A) of FIG. 6 illustrates the longitudinal vibration of the vibrating body 2, while the view (B) FIG. 6 illustrates the bending vibration. The view (C) of FIG. 6 illustrates the vibrational path of the abutting part 23.

When a driving device is used to apply an AC voltage between the reinforcing plate 21 of the vibrating body 2 and selected ones of the electrodes 22A, 22B and 22C of the piezoelectric elements 22, this causes the vibrating body 2 to vibrate as seen in the views of FIG. 6. When voltage is applied to the electrodes 22A, the vibrating body 2 will exhibit longitudinal vibration in which the piezoelectric elements 22 elongate and contract in the longitudinal direction due to the energization of the electrodes 22A, as shown in view (A) of FIG. 6. When voltage is applied to the electrodes 22C, the vibrating body 2 will exhibit lateral bending vibration in which the piezoelectric elements 22 elongate and contract asymmetrically on both sides due to the energization of the electrodes 22C, as shown in view (B) of FIG. 6. In other words, the piezoelectric elements 22 bend in a direction perpendicular to the longitudinal vibration in a manner that is point-symmetrical with respect to its center plane, as shown in view (B) of FIG. 6. When voltage is applied to the electrodes 22B, the vibrating body 2 will exhibit lateral bending vibration in which the piezoelectric elements 22 elongate and contract asymmetrically on both sides in an opposite direction from that shown in view (B) of FIG. 6. In other words, the piezoelectric elements 22 bend in a direction perpendicular to the longitudinal vibration in a manner that is point-symmetrical with respect to its center plane due to the energization of the electrodes 22B. Thus, if only electrodes 22A and 22C of the piezoelectric elements 22 are selected for voltage application, the vibrating body 2 will exhibit both longitudinal vibration, as shown in view (A) of FIG. 6, and lateral bending vibration, as shown in view (B) of FIG. 6, such that the abutting part 23 moves as shown in view (C) of FIG. 6. In other words, by exciting the vibrating body 2 such that it exhibits the aforementioned longitudinal and lateral bending vibrations simultaneously, the abutting part 23 is made to vibrate through a generally elliptical path as shown in view (C) of FIG. 6. Along a portion of this elliptical path, the abutting part 23 presses against the contact part 101A of the rotating body 101 to cause the rotating body 101 to rotate. By repeating this movement at a prescribed frequency, the rotating body 101 is made to rotate in a single direction at a prescribed speed.

When the rotating body 101 is to be rotated in the opposite direction, the electrodes of the piezoelectric element 22 to which the voltage is applied are switched in a linearly symmetrical manner with respect to the longitudinal centerline of the vibrating body 2. In other words, a voltage of a prescribed frequency is applied to the electrodes 22A and 22B of the piezoelectric elements 22 such that the abutting part 23 is made to vibrate through an elliptical path oriented in the opposite direction to that shown in view (C) of FIG. 6. As a result, the rotating body 101 rotates in the opposite direction.

Figure 7:
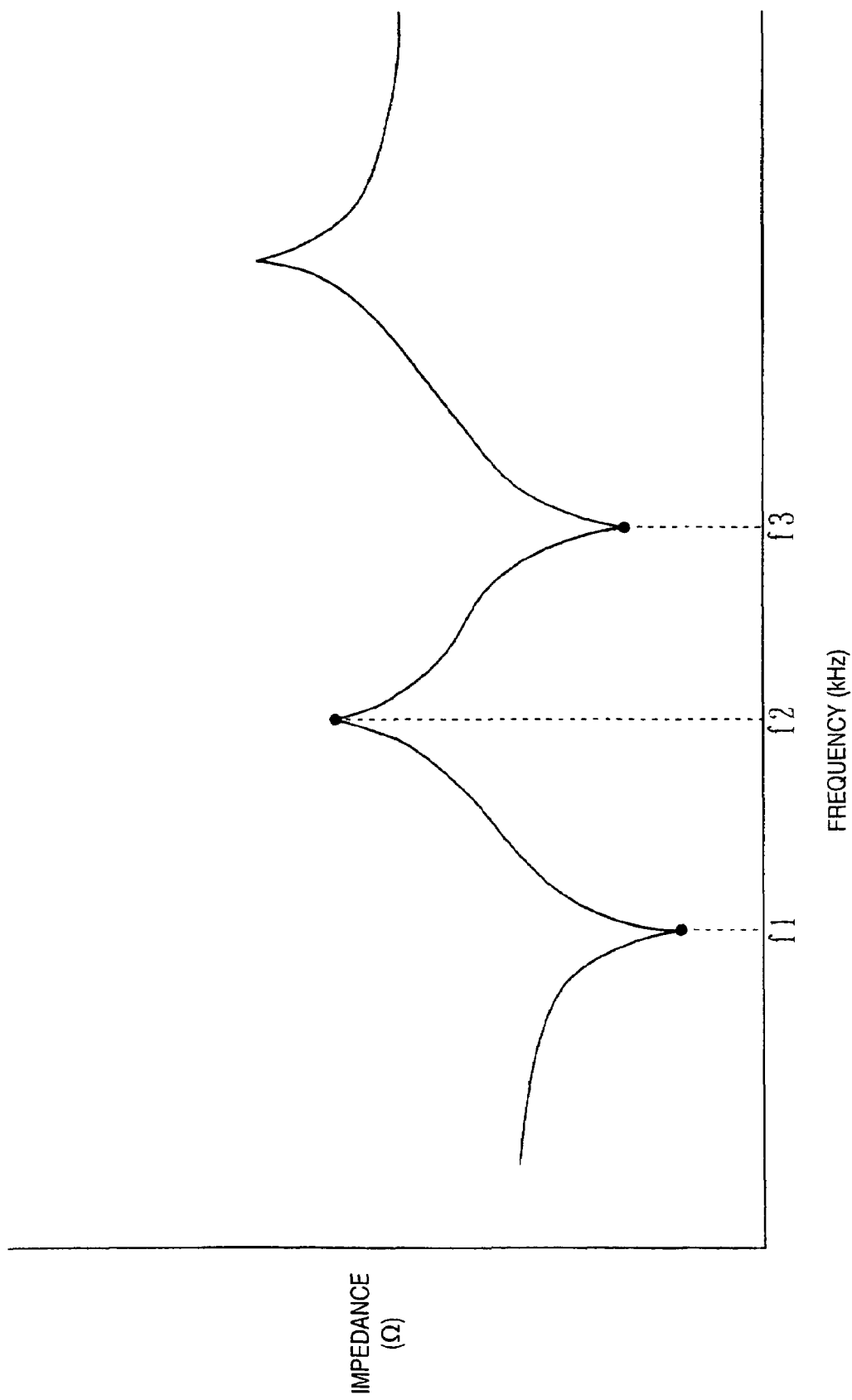
FIG. 7 is a graph that illustrates the vibration characteristic of the vibrating body of the rotary drive device in accordance with the first embodiment.

FIG. 7 shows the impedance of the piezoelectric elements 22 versus the frequency at which the vibrating body 2 is driven. As shown in FIG. 7, the impedance exhibits two minima with respect to the frequency of the voltage applied to the piezoelectric elements 22. The minimum of the impedance that occurs at the lower frequency is the resonance point at which the amplitude of the longitudinal vibration is the largest and the frequency corresponding to this point is the longitudinal vibration resonance frequency f1. The minimum of the impedance that occurs at the higher frequency is the resonance point at which the amplitude of the bending vibration is the largest and the frequency corresponding to this point is the bending vibration resonance frequency f3. The anti-resonance frequency f2 appears between the resonance frequencies f1 and f3.

As illustrated by FIG. 7, the piezoelectric elements 22 can be driven in a highly efficient manner while obtaining both longitudinal vibration and bending vibration at large amplitudes by driving the piezoelectric elements 22 at a frequency that lies between the longitudinal and bending resonance frequencies f1 and f3.

Therefore, the following effects can be obtained with the first embodiment of the present invention.

(1) Since the position of the vibrating body 2 in a plane that intersects the rotational axis of the rotating body 101 and is positioned closer to the rotational center than the position of the contact part 101A, it is not necessary to provide a space for installing the vibrating body 2 on the outside of the rotating body 101, as is the case of conventional rotary drive devices. Also the rotary drive device 1 can be reduced in size accordingly. In short, the rotary drive device 1 can be reduced in size while still delivering a prescribed drive torque.

(2) Since the vibrating body 2 is arranged and configured so as to include a flat reinforcing plate 21 with the piezoelectric elements 22 installed on the front and rear surfaces of the reinforcing plate 21 and the abutting part 23 being provided on the reinforcing plate 21, the physical shock resulting from impact forces and other excessive forces acting on the rotating body 101 from the outside is prevented from being transmitted directly to the piezoelectric elements 22. Thus, the shock resistance of the rotary drive device 1 can be improved.

(3) Since the springs 34 are provided so as to press the vibrating body 2 toward the rotating body 101, the abutting part 23 can be made to abut reliably against the contact part 101A and the rotating body 101 can be made to rotate in a reliable manner. As a result, the rotary drive device 1 can be driven in a stable manner.

Also, when the rotating body 101 is stopped, unnecessary rotation of the rotating body 101 can be suppressed when an external rotary force acts thereon because the abutting part 23 touches against the contact part 101A of the rotating body 101 and act as a stopper that resists rotation of the rotating body 101.

(4) Since the support body 3 is guided by the slots 321 such that it can advance and retract along a direction that is perpendicular to the contact part 101A of the rotating body 101, the advancement and retraction of the vibrating body 2 is likewise restricted to the same direction and the abutting part 23 always abuts against the contact part 101A at a prescribed angle. As a result, the rotary drive device 1 can be driven in a stable manner even when, for example, it has been used for a long period of time and the abutting part 23 has become somewhat worn because the abutting part 23 can be made to abut against the contact part 101A in a stable manner.

(5) A driving force can be applied to the rotating body 101 in one direction at all times because the abutting part 23 of the vibrating body 2 is made to move through a generally elliptical path and the rotating body 101 is rotated during a portion of the generally elliptical path. In other words, since the pressing force of the abutting part 23 against the rotating body 101 decreases along the portion of the elliptical path where the abutting part 23 moves in the opposite direction as the rotation of the rotating body 101, hindering of the rotation of the rotating body 101 can be prevented. Additionally, decreases in the rotational torque of the rotating body 101 can be prevented because it is difficult for the driving force of the abutting part 23 to be transmitted in the direction opposite the direction in which the inertial force acts. Also, since the pressing force acting against the rotating body 101 decreases when the abutting part 23 is on a portion of the path where it moves in the opposite direction as the rotation of the rotating body 101, wear of the abutting part 23 and the rotating body 101 can be prevented and the durability of the rotary drive device 1 can be improved.

(6) Since the abutting part 23 of the vibrating body 2 has a convex arc shaped free end and the contact part 101A of the rotating body 101 has a concave arc shaped surface that is recessed in the direction in which the abutting part 23 abuts, the contact surfaces between the abutting part 23 and the contact part 101A can be secured when the angle at which the abutting part 23 and the contact part 101A touch each other changes due to movement of the rotational axis of the rotating body 101. As a result, the rotary drive device 1 can be driven in a stable manner.

(7) Since the rotating body 101 can be attached to and detached from the base part 4, the service life of the drive device 1 as a product can be improved because when, for example, the abutting part 23 or the contact part 101A becomes worn after a long period of use, one or the other can be replaced and the unworn part can continue to be used. Furthermore, the general applicability of the rotary drive device 1 can be improved because differently shaped rotating bodies 100 can be interchanged depending on the application.

(8) The substrate 37 has the conductive patterns 38 and the conductive terminals 38A, which are connected to the electrodes of the vibrating body 2, provided on the opposite side of the base part 4 as the side on which the vibrating body 2 is provided. Consequently, when a driving device or other external device is to be connected to the rotary drive device 1, the vibrating body 2 can be connected to the external device easily by using a substrate having conductive patterns that correspond to the conductive terminals 38A. As a result, the space of the base part 4 can be used effectively.

(9) Since the rotating body 101 is provided around the outer circumference of the base part 4, the size of the rotating body 101 can be maximized relative to the size of the base part 4. As a result, the drive force can be maximized relative to the size of the rotary drive device 1.

(10) The dimensions of the piezoelectric elements 22 are appropriate, i.e., the length of the short side is 0.274 or greater when the length of the long side is equal to 1, and ratio of the resonance frequency for bending vibration to the resonance frequency for longitudinal vibration is greater than 1.00 and less than or equal to 1.03. As a result, longitudinal vibration and bending vibration can be obtained simultaneously such that the abutting part 23 moves along a satisfactory elliptical path to drive (rotate) the rotating body 101. Since the resonance points for longitudinal vibration and bending vibration are close together, the amplitudes of both vibrations are large as a result of operating near the resonance points and the rotary drive device 1 can be driven in a highly efficient manner.

(11) Since the electrodes 22B and 22C are arranged in a linearly symmetrical manner with respect to the longitudinal centerlines of the piezoelectric elements 22, the direction in which the rotating body 101 is driven can be changed by changing the electrodes to which the voltage is applied, i.e., switching from the electrodes 22B to the electrodes 22C (or vice versa), and thereby causing the abutting part 23 to follow an elliptical path oriented in the opposite direction. As a result, the operating range of the vibrating body 2 is expanded and the general applicability of the rotary drive device 1 is improved.

Now a specific working example of the first embodiment will be described. The piezoelectric elements 22 are made of PZT® and their dimensions are 1.98 mm wide, 7 mm long, and 0.15 mm thick. The reinforcing plate 21 is made of stainless steel (SUS301) with a thickness of 0.1 mm. In a top plan view, the abutting part 23 has a generally semicircular shape with a width of 0.5 mm and a protruding length of 0.45 mm and has a mass of approximately 0.16 mg. The portions of the arm parts 24 that protrude from the piezoelectric elements 22 are 0.4 mm wide and 0.5 mm long.

When the vibrating body 2 is thus configured, the longitudinal vibration resonance frequency f1 is approximately 279 kHz, the bending vibration resonance frequency f3 is approximately 285 kHz, and the anti-resonance frequency is approximately 283 kHz when the abutting part 23 is not touching against the rotating body 101 and the vibrating body 2 is not receiving a reaction force from the rotating body 101. Hence, the ratio of the bending vibration resonance frequency f3 to the longitudinal vibration resonance frequency f1 is approximately 1.015. If a voltage whose frequency is between the longitudinal vibration resonance frequency f1 and the bending vibration resonance frequency f3 or, more preferably, between the anti-resonance frequency f2 and the bending vibration resonance frequency f3 is applied to the vibrating body 2, the vibrating body 2 will vibrate with a large amplitude in the vicinity of both the longitudinal vibration resonance point and the bending vibration resonance point and the abutting part 23 will move along a satisfactory elliptical path.

Second Embodiment

Referring now to FIGS. 8-11, a rotary drive device 200 in accordance with a second embodiment will now be explained. In view of the similarity between the first and second embodiments, the descriptions of the parts of the second embodiment that are identical or substantially identical in function to the parts of the first embodiment may be omitted for the sake of brevity.

Figure 8:
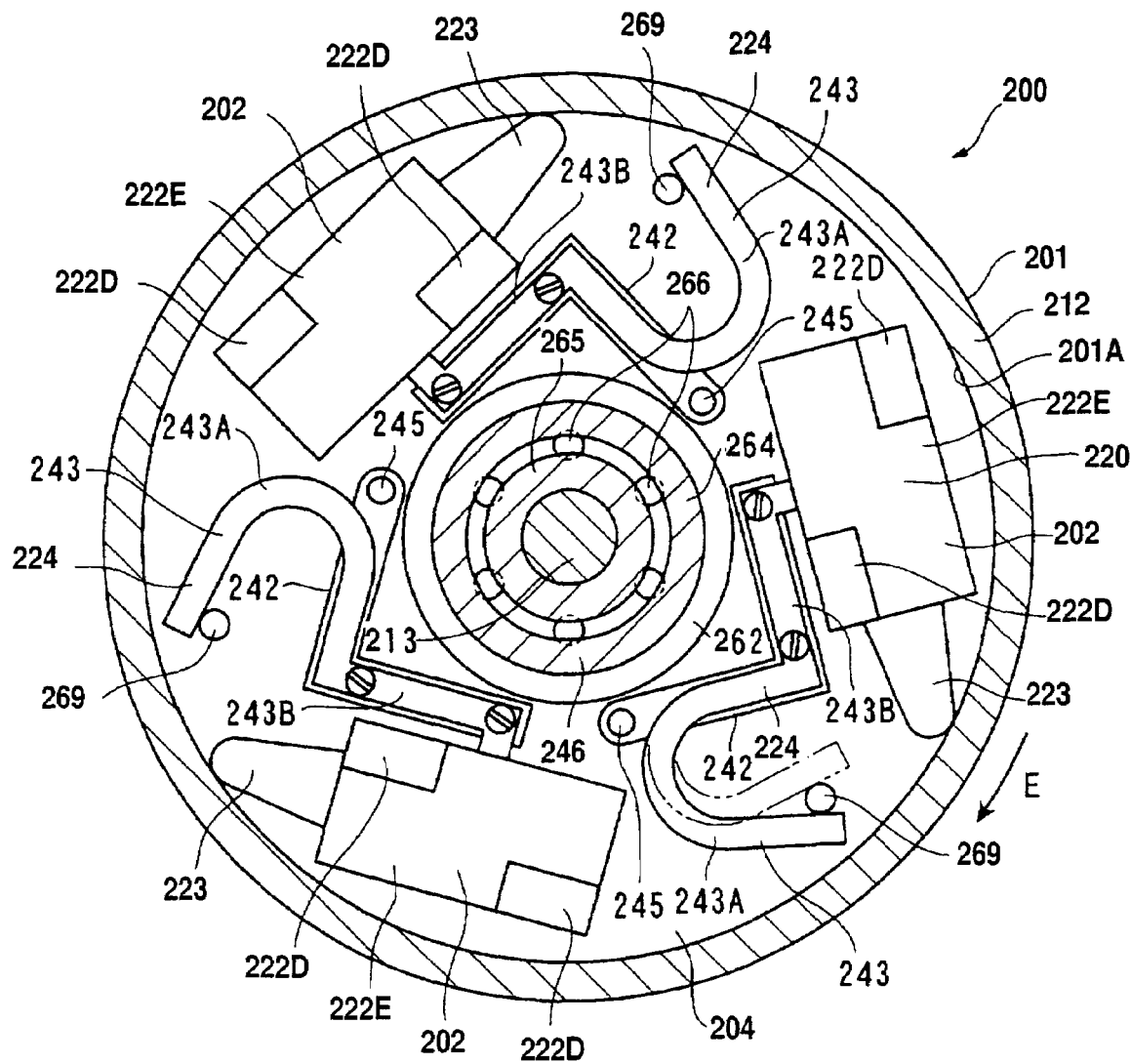
FIG. 8 is a top plan view of a portion of a rotary drive device in accordance with a second embodiment of the present invention, with selected portions omitted or broken away for purposes of illustration.
Figure 9:
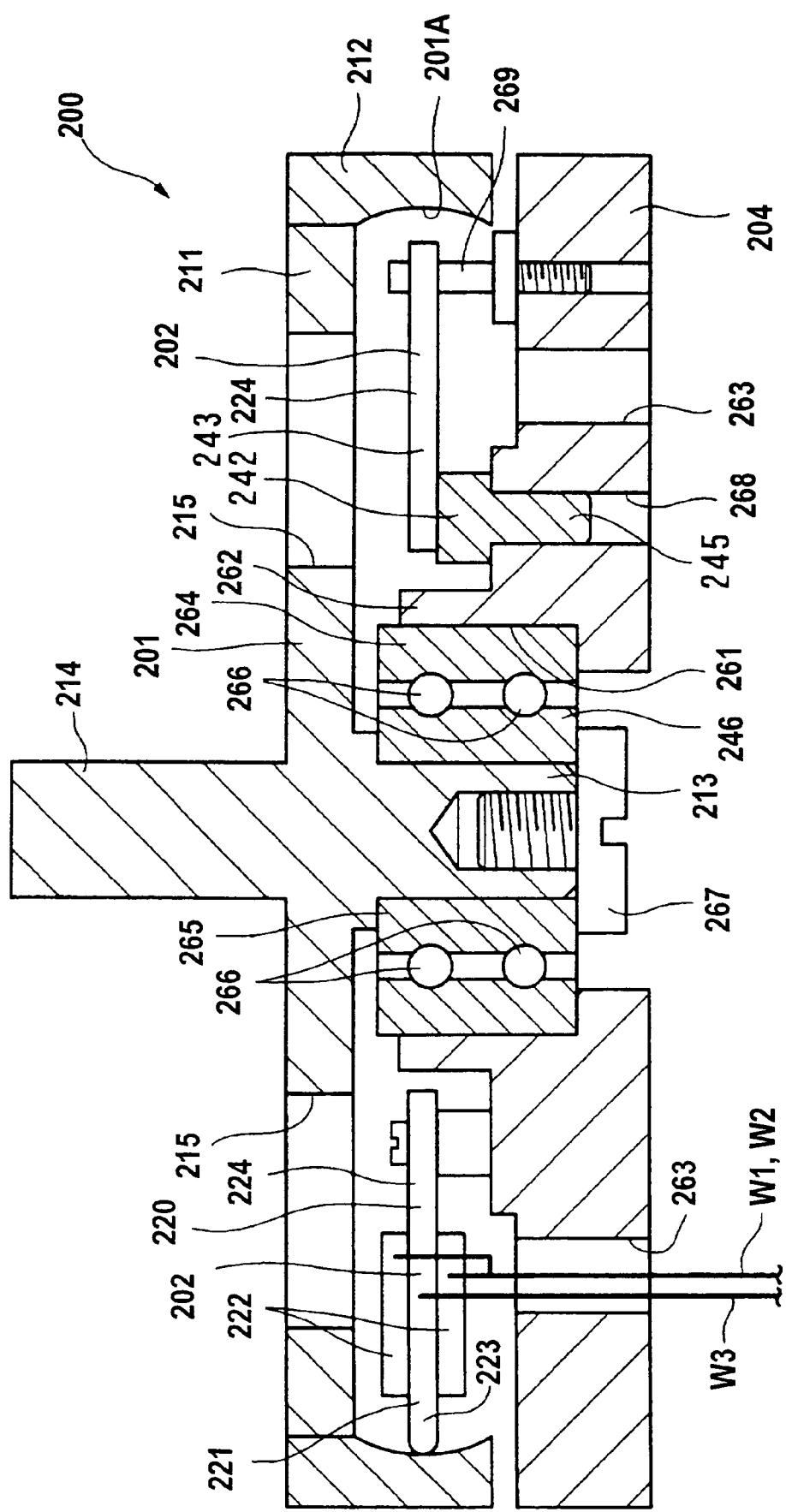
FIG. 9 is a cross sectional view of the rotary drive device in accordance with the second embodiment.

FIG. 8 is a top plan view of the rotary drive device 200 in accordance with the second embodiment of the present invention. FIG. 9 is a lateral cross sectional view of the rotary drive device 200 shown in FIG. 8. In the following description, such directional words as "upper" and "above" refer to the upper side of the rotary drive device 200 and such words as "lower" and "below" refer to the lower side of the rotary drive device 200 as it is shown in FIG. 9.

As shown in FIGS. 8 and 9, the rotary drive device 200 has a base part 204, a rotating body 201 rotatably provided on the base part 204 via a shaft part or ball bearing assembly 246, and a vibrating mechanism 220 that is provided on the base part 204 and serves to rotate the rotating body 201. The vibrating mechanism 220 comprises three vibrating bodies 202 as discussed later.

This rotary drive device 200 delivers rotational motion via, for example, an output shaft 214 formed at the rotational center of the rotating body 201. The output shaft 214 is used in small pumps that pump liquids.

The base part 204 is shaped like a circular disc that is provided with a shaft hole 261, a protruding part 262, and a plurality of openings 263. The shaft hole 261 is formed at the center of the base part 204 such that the output shaft 214 is support therein for rotation. The protruding part 262 is formed around the shaft hole 261 and protrudes upward to further support the output shaft 214 within the shaft hole 261 for rotation. The openings 263 are formed around the protruding part 262 and pass from one side of the base part 204 to the other side of the base part 204. The diameter of the shaft hole 261 is larger at the portion closer to the upper surface of the base part 204 than the portion of the shaft hole 261 that closer to the lower surface of the base part 204.

The ball bearing assembly 246 comprises a cylindrical bearing 264, a cylindrical journal 265 that is arranged on the inside of the bearing 264, and a plurality of balls 266 arranged between the bearing 264 and the journal 265. As a result, the journal 265 rotates freely with respect to the bearing 264 about the center axis of the bearing 264.

The rotating body 201 has a disc-shaped main rotating body portion 211 and an annular part 212 fixed by, for example, pressure fitting onto the outer circumference of the main rotating body portion 211. The main rotating body portion 211 is preferably made of a resin, such as PC (polycarbonate). The main rotating body portion 211 has a supported part 213 that protrudes downward along the rotational center thereof, an output shaft 214 that protrudes upward along the rotational center thereof, and a plurality of openings 215 that pass from one side surface to the other side surface of the main rotating body portion 211. The base part 204 also has the openings 263 passing from one side surface to the other side surface of the base part 204. Thus, the base part 204 and the main rotating body portion 211 form an interior space that substantially surrounds the vibrating mechanism 220 with the openings 215 and 263 communicating between the inside of this space and the outside of this space.

The annular part 212 is preferably made of an iron or stainless steel alloy and has a contact part 201A formed on the inner circumferential surface thereof. The contact part 201A is positioned at a prescribed distance from the rotational center such that the contact part 201A abuts against the three vibrating bodies 202 of the vibrating mechanism 220 (discussed later) from a substantially radial direction of the rotational center. The contact part 201A has a concave arc shaped contact surface as viewed in cross section. The concave arc shaped contact surface of the contact part 201A is concaved with respect to the direction in which the three vibrating bodies 202 abuts against the contact part 201A as discussed later.

The supported part 213 of the rotating body 201 is inserted into the journal 265 of the ball bearing assembly 246 from above, and fixed to the journal 265 by a screw 267 that is inserted into the journal 265 from below and screwed into the supported part 213. The bearing 264 of the ball bearing assembly 246 fits into the shaft hole 261 from the upper surface of the base part 204. As a result, the rotating body 201 is rotatable supported on the base part 204 through the ball bearing assembly 246.

Figure 10:
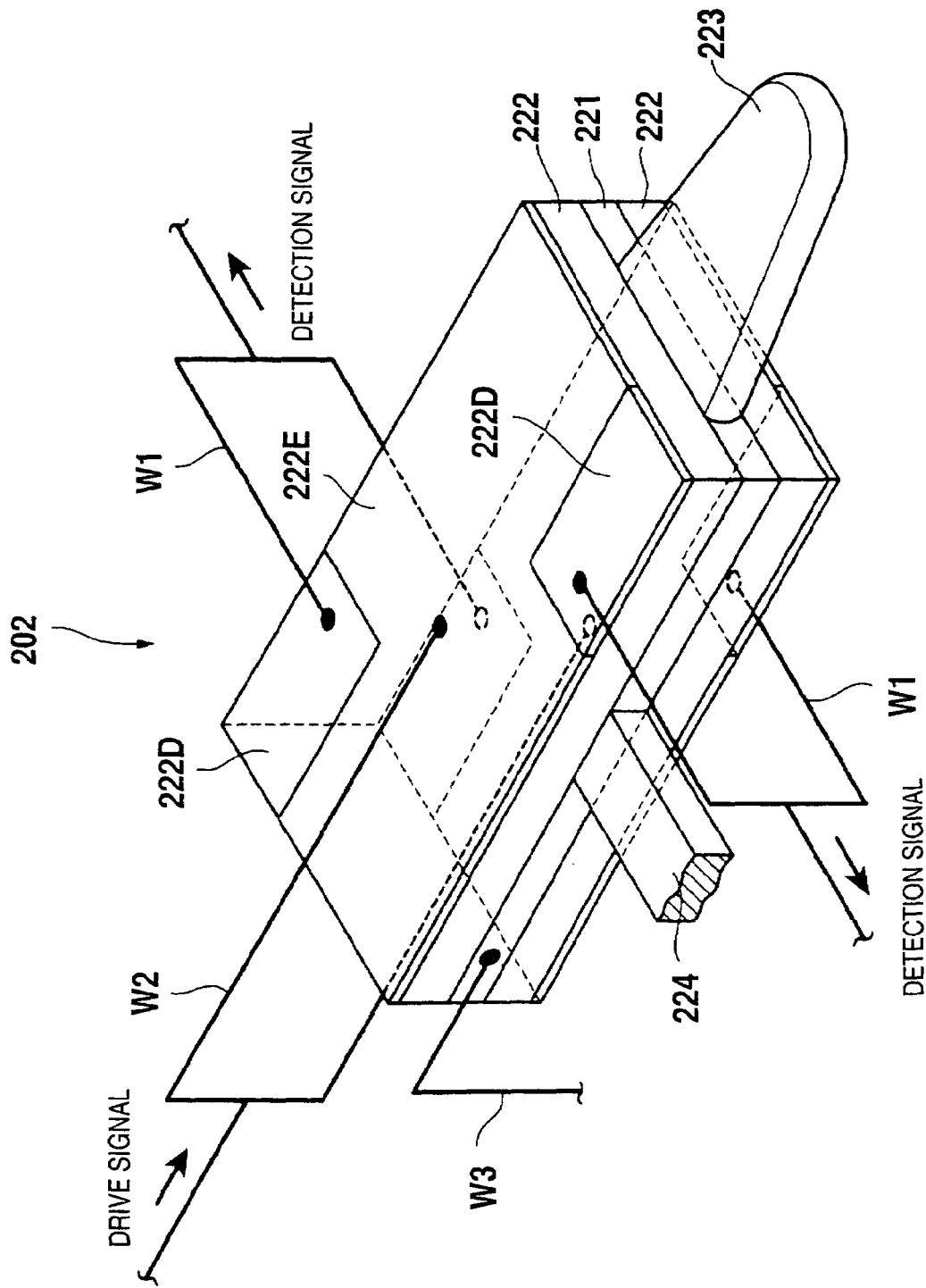
FIG. 10 is an enlarged perspective view of a vibrating body of the rotary drive device in accordance with the second embodiment.
Figure 11:
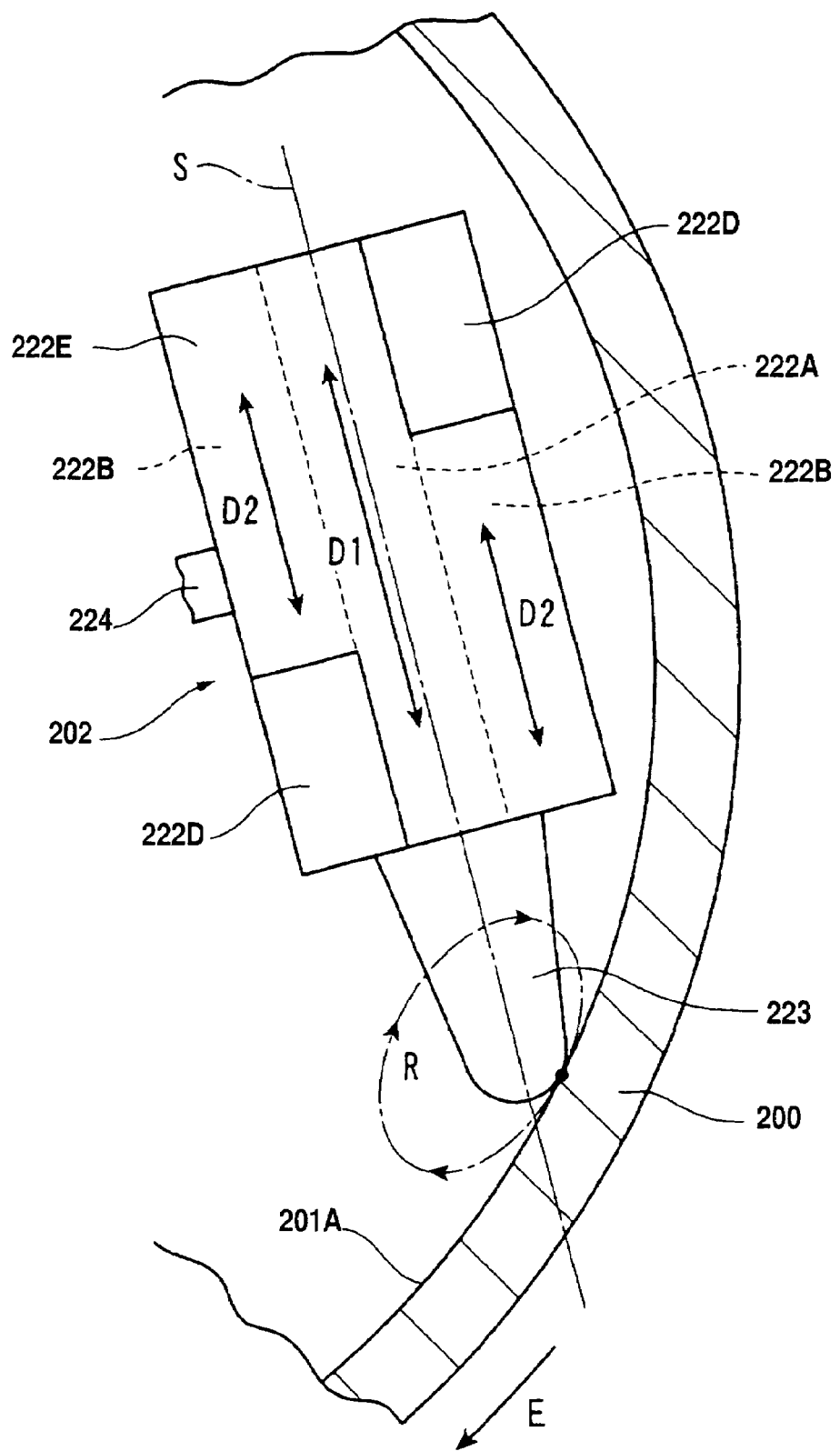
FIG. 11 is an enlarged partial top plan view of the vibrating body in accordance with the second embodiment.

FIG. 10 is an enlarged perspective view of one of the vibrating bodies 202, while FIG. 11 shows an enlarged top plan view of one of the vibrating bodies 202. As shown in FIGS. 10 and 11, each of the vibrating bodies 202 has a flat, generally-rectangular reinforcing plate 221, a pair of flat plate-shaped piezoelectric elements 222 provided on the front and back surfaces of the reinforcing plate 221, an abutting part 223 and three arm parts 224. As discussed below, the piezoelectric elements 222 are basically divided into a center piezoelectric section 222A and two side piezoelectric element sections 222B by electrodes 222D and 222E. Each of the piezoelectric elements 222 has two pairs of the vibration detecting electrodes 222D and two pairs of the drive electrodes 222E. Two of the electrodes 222D and two of the electrodes 222E are provided on each of the opposed surfaces of each piezoelectric element 222. The arm parts 224 rotatably attach the vibrating bodies 202 to the base part 204 such that abutting parts 223 of the vibrating bodies 202 are pressed the against the contact part 201A of the rotating body 201 by a prescribed force.

The vibrating bodies 202 are located at in planes that extend along a direction that intersects the rotational axis of the rotating body 201. Also the vibrating bodies 202 are located closer to the rotational center than the contact part 201A of the rotating body 201. Further, the vibrating bodies 202 are arranged at equal intervals along the contact part 201A. Preferably, the vibrating bodies 202 are arranged so as to be slightly slanted with respect to the rotational direction of the rotating body 201 such that the abutting parts 223 abut against the contact part 201A at a prescribed angle.

As seen in FIG. 11, the vibrating body 202 has a longitudinal centerline S (single-dot chain line), with the abutting part 223 being provided on the centerline S at the free end of the vibrating body 202 that faces the contact part 201A. The abutting part 223 is formed integrally with the reinforcing plate 221 and has a convex arc shaped free end surface as seen in a cross section. The convex arc shaped free end surface of the abutting part 223 abuts against the concave arc shaped contact surface of the contact part 201A.

Regarding the electrodes 222D and 222E, each of the piezoelectric elements 222 has two rectangular vibration detecting electrodes 222D arranged on diagonally opposite corners of each of the piezoelectric elements 222 and one generally Z-shaped drive electrode 222E arranged across the entire surface of each of the piezoelectric elements 222, excluding the portions where the vibration detecting electrodes 222D are located. An empty gap is formed between the vibration detecting electrodes 222D and the drive electrode 222E so that the electrodes 222D and 222E are electrically insulated from each other. The material and dimensions of the piezoelectric elements 222 are preferably the same as in the first embodiment, discussed above.

The opposing pairs of vibration detecting electrodes 222D, which sandwich the piezoelectric elements 222, are connected to a vibration detecting device (not shown) through lead wires W1. Among the three vibrating bodies 202, the two pairs of vibration detecting electrodes 222D of only one vibrating body 202 are connected to the vibration detecting device.

When the vibrating bodies 202 vibrate, the vibration is converted into a detection signal by each piezoelectric element 222, which is sandwiched between the reinforcing plate 221 and the vibration detecting electrodes 222D. This detection signal is sent to the vibration detecting device through the vibration detecting electrodes 222D and the vibrating state of the vibrating bodies 202 is detected.

The reinforcing plate 221 is grounded via a lead wire W3. Opposing pairs of drive electrodes 222E, which sandwich the piezoelectric elements 222, are connected to a driving device (not shown) through lead wires W2. The drive electrodes 222E of all vibrating bodies 202 are connected to one common driving device that selectively applies an AC voltage thereto. The lead wires W1-W3 are drawn to the outside through one of the openings 263 in the base part 204.

When a single drive signal is sent from the driving device, the piezoelectric elements 222 (which are sandwiched between the drive electrodes 222E and the reinforcement plates 221) of the vibrating bodies 202 vibrate. As a result, the abutting parts 223 of the vibrating bodies 202 also vibrate and the rotating body 201 rotates.

Next, the operation of the vibrating body 202 is described in detail. When a drive signal of a prescribed frequency is sent from the driving device to the drive electrodes 222E, the piezoelectric elements 222 (which are sandwiched between the drive electrodes 222E and the reinforcing plate 221) are excited so as to exhibit longitudinal vibration in which they elongate and contract as a whole. The direction of the longitudinal vibration is along the centerline S, i.e., the lengthwise direction of the vibrating body 202.

Now, for the purposes of explanation, each piezoelectric element 222 (which is sandwiched between one of the drive electrodes 222E and the reinforcing plate 221) will be thought of as being divided into a center piezoelectric element section 222A located in the vicinity of the centerline S (i.e., the portion in the middle of the vibrating body 202 relative to the widthwise direction) and two side piezoelectric element sections 222B located on opposite sides of the centerline S (i.e., the portions on both sides of the vibrating body 202 in the widthwise direction), as shown in FIG. 11. The lengths of the piezoelectric element sections 222B are shorter than the length of the piezoelectric element section 222A.

Thus, the longitudinal vibrations of the piezoelectric element sections 222B (indicated by arrows D2 in FIG. 11) are a different movement than the longitudinal vibration of the piezoelectric element section 222A (indicated by arrow D1 in FIG. 11) and a twisting or lateral bending moment develops in the widthwise directions of the piezoelectric elements 222. This moment causes the vibrating body 202 to undergo bending vibration in which it oscillates in the widthwise direction. As a result, the vibrating body 202 exhibits longitudinal vibration and lateral bending vibration simultaneously and the abutting part 223 moves through an approximately elliptical path R, as shown in FIG. 11.

Returning to FIGS. 8 and 9, the arm parts 224 each comprise a rotating member 242 and a pressing force applying member 243. The rotating member 242 is rotatably attached to the base part 204 and the pressing force applying member 243 is fixedly mounted to the rotating member 242 such that the pressing force applying member 243 urges the arm part 224 attached to the rotating member 242 to press the abutting part 223 of the vibrating body 202 against the contact part 201A.

Each of the rotating members 242 is L-shaped, and is arranged along the outside circumference of the protruding part 262. The rotating member 242 has a pin 245 that attaches the base end the rotating member 242 to the base part 204. In particular, each of the pins 245 of each of the rotating member 242 is inserted into a hole 268 provided closely adjacent to the protruding part 262 of the base part 204. As a result, the rotating member 242 is rotatably supported on the base part 204.

The pressing force applying member 243 has the form of a flat plate that is formed integrally with the reinforcing plate 221 of the vibrating body 202. The pressing force applying member 243 comprises a generally U-shaped spring part 243A and a generally L-shaped support part 243B that is provided on the tip end of the spring part 243A. At its base end, the spring part 243A mates with a pin 269 provided on the base part 204. The support part 243B is fixed to the rotating member 242 and the tip end thereof is joined to the lengthwise middle of the reinforcing plate 221 of the vibrating body 202. With an arm part 224 thus constituted, the spring part 243A can cause the abutting part 223 of the vibrating body 202 to rotate clockwise about the pin 245 of the rotating member 242 and be pressed against the contact part 201A.

When the abutting part 223 becomes worn due to repetitive contact with the contact part 201A, the arm part 224 rotates the vibrating body 202 clockwise about the pin 245. As a result, the angle formed between the abutting part 223 and the contact part 201A changes and there is the risk that the state of the contact between the two parts will change. However, since the rotating member 242 is L-shaped and arranged along the outside circumference of the protruding part 262, the distance from the pin 245 to the abutting part 223 can be made as long as possible while avoiding contact with the protruding part 262 (which is provided in the center portion of the base part 204). Therefore, the rotational radius of the vibrating body 202 can be made large and the change in the angle between the abutting part 223 and the contact part 201A can be held to a minimum. As a result, the state of contact between the abutting part 223 and the contact part 201A can be maintained.

Now the method of assembling the rotary drive device 200 will be explained. First, the vibrating mechanism 220 is assembled with the vibrating bodies 202 and the arm parts 224 and the ball bearing assembly 246 is installed in the base part 204. Then, the vibrating bodies 202 are arranged on the base part 204 by inserting the pins 245 of the rotating members 242 into the holes 268 in the base part 204. Each vibrating body 202 is rotated counterclockwise about the pin 245 so that the abutting part 223 is retracted from the path of the contact part 201A of the rotating body 201. When this is done, the spring part 243A of the pressing force applying member 243 is in the state indicated by the double-dot chain line in FIG. 8.

Next, the supported part 213 of the rotating member 200 is inserted into the journal 265 of the ball bearing assembly 246 and fixed with the screw 267, thus attaching the rotating body 201 to the base part 204 from above the vibrating mechanism 220. Then, a tool is inserted through the openings 263 in the base part 204 and the spring part 243A of each pressing force applying member 243 is moved such that it catches on the respective pin 269 of the base part 204.

If the vibrating mechanism 220 is completely installed before attaching the rotating body 201, the spring parts 243A will be mated with the pins 269 and exert pressing forces that cause the abutting parts 223 of the vibrating bodies 202 to enter the path of the contact part 201A, making it impossible to install the rotating body 201. However, this problem can be avoided by using the method described above, i.e., by first installing the rotating body 201 and afterwards putting the abutting parts 223 in contact with the contact part 201A from the general direction of the rotational center.

Now the operation of the rotary drive device 200 will be described. First an AC voltage is applied to the piezoelectric elements 222 using a driving device. The frequency of the applied AC voltage is 200 to 300 kHz. When the voltage is applied, the piezoelectric elements 222 elongate and contract in the lengthwise direction of the vibrating bodies 202, and the vibrating bodies 202 undergo longitudinal vibration and lateral bending vibration simultaneously, causing the abutting parts 223 to move through the path R.

In short, the abutting parts 223 apply a pushing force against the contact part 201A of the rotating body 201 when they move through the portion of the path that is close to the contact part 201A. The friction force generated between the abutting parts 223 and the contact part 201A cases the contact part 201A to be moved in a prescribed direction. Meanwhile, when the abutting parts 223 move through the portion of the path that is far from the contact part 201A, they separate from the rotating body 201 or, if touching the contact part 201A, their pushing force is reduced such that they do not drive the contact part 201A.

By repeating this operation, the abutting parts 223 repetitively push the contact part 201A and thereby rotate the rotating body 201 in the direction of the arrow E shown in FIG. 8.

In addition to effects (1), (2), (5), (6), (7), and (10) of the first embodiment, the second embodiment also provides the following effects.

(12) Since openings 263 and 215 are provided in the base part 204 and the rotating body 201, heat can be dissipated through the holes 263 and 215 and the internal temperature (particularly the temperature of the piezoelectric elements 222) can be prevented from rising severely. As a result, the rotary drive device 200 can be driven in a stable manner. Also, hands or tools can be inserted through the openings 263 and 215 to assemble internal parts of the rotary drive device 200, thus improving the assembly performance.

(13) Since there are three vibrating bodies 202 arranged at equal intervals along the contact part 201A of the rotating body 201 and the abutting parts 223 abut against the contact part 201A from a substantially radial direction of the rotational center, the abutting parts 223 can press against the contact part 201A of the rotating body 201 from the general direction of the rotational center with equal forces in a balanced manner. As a result, the rotational axis of the rotating body 201 is prevented from deviating off center and the rotary drive device 200 can be driven in a stable manner.

(14) Since a single driving device is connected to all of the vibrating bodies 202 such that the three vibrating bodies 202 are driven by a single drive signal, it is not necessary to provide a separate driving device for each vibrating body 202 and manufacturing costs and operating costs can be reduced.

(15) Although the structure is different from the first embodiment, since pressing force applying members 243 are provided so as to press the vibrating bodies 202 toward the rotating body 201, a similar effect to effect (3) of the first embodiment can be obtained in that the abutting parts 223 can be made to abut reliably against the contact part 201A and the rotating body 201 can be made to rotate in a reliable manner. As a result, the rotary drive device 200 can be driven in a stable manner.

Also, when the rotating body 201 is stopped, unnecessary rotation of the rotating body 201 can be suppressed when an external rotary force acts thereon because the abutting parts 223 touch against the contact part 201A of the rotating body 201 and act as stoppers that resist rotation of the rotating body 201.

(16) Costs can be reduced further because the pressing force applying members 243 are formed integrally with the reinforcing plates 221 of the vibrating bodies 202.

(17) Since the vibrating body 202 is fixed directly to the base part 204 (ball bearing assembly 246) and there is no need for the support body 3 like that adopted in the first embodiment, the structure of the rotary drive device 200 can be simplified and the rotary drive device 200 can be manufactured less expensively.

Third Embodiment

Figure 12:
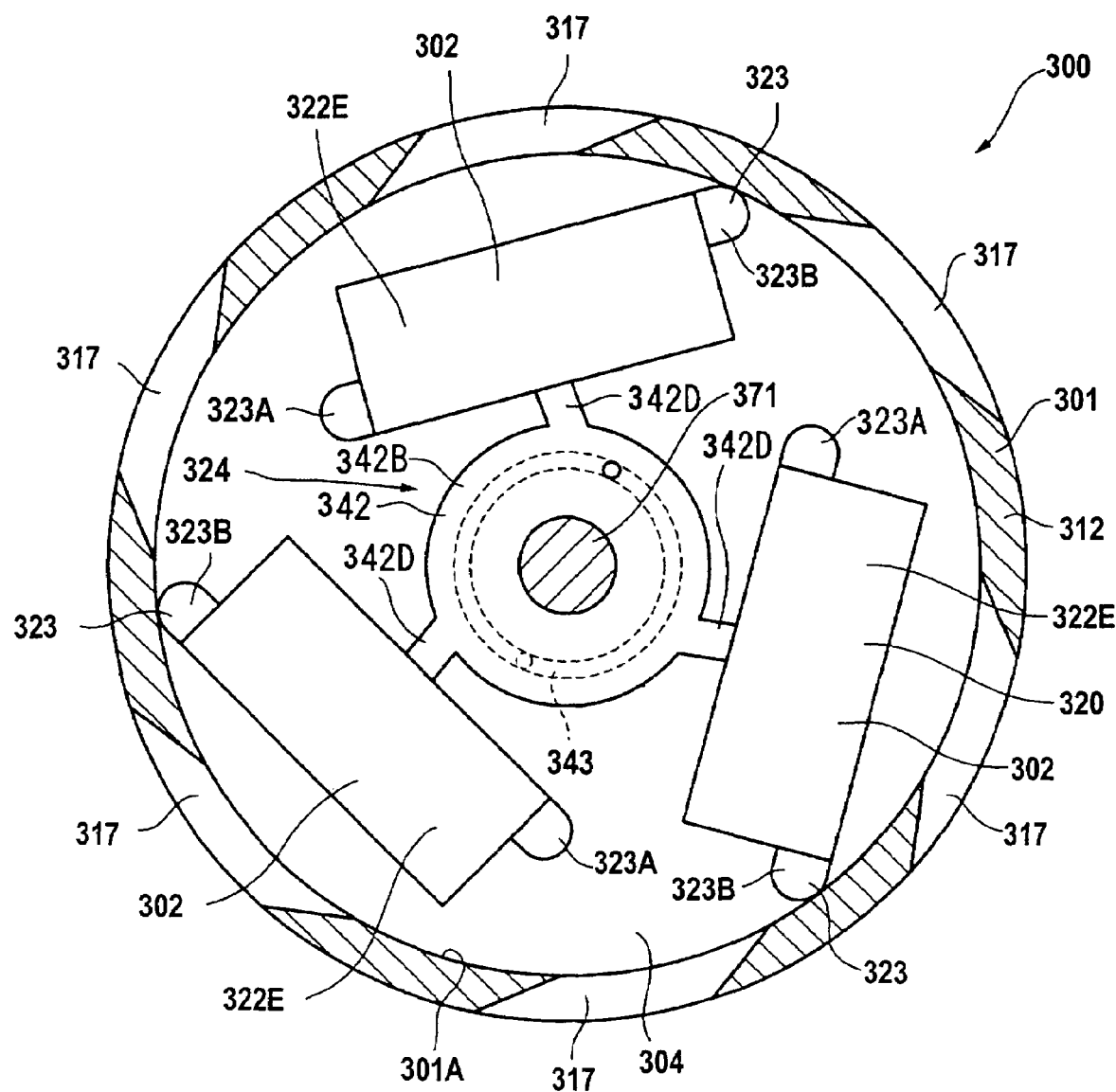
FIG. 12 is a top plan view of a rotary drive device in accordance with a third embodiment of the present invention.
Figure 13:
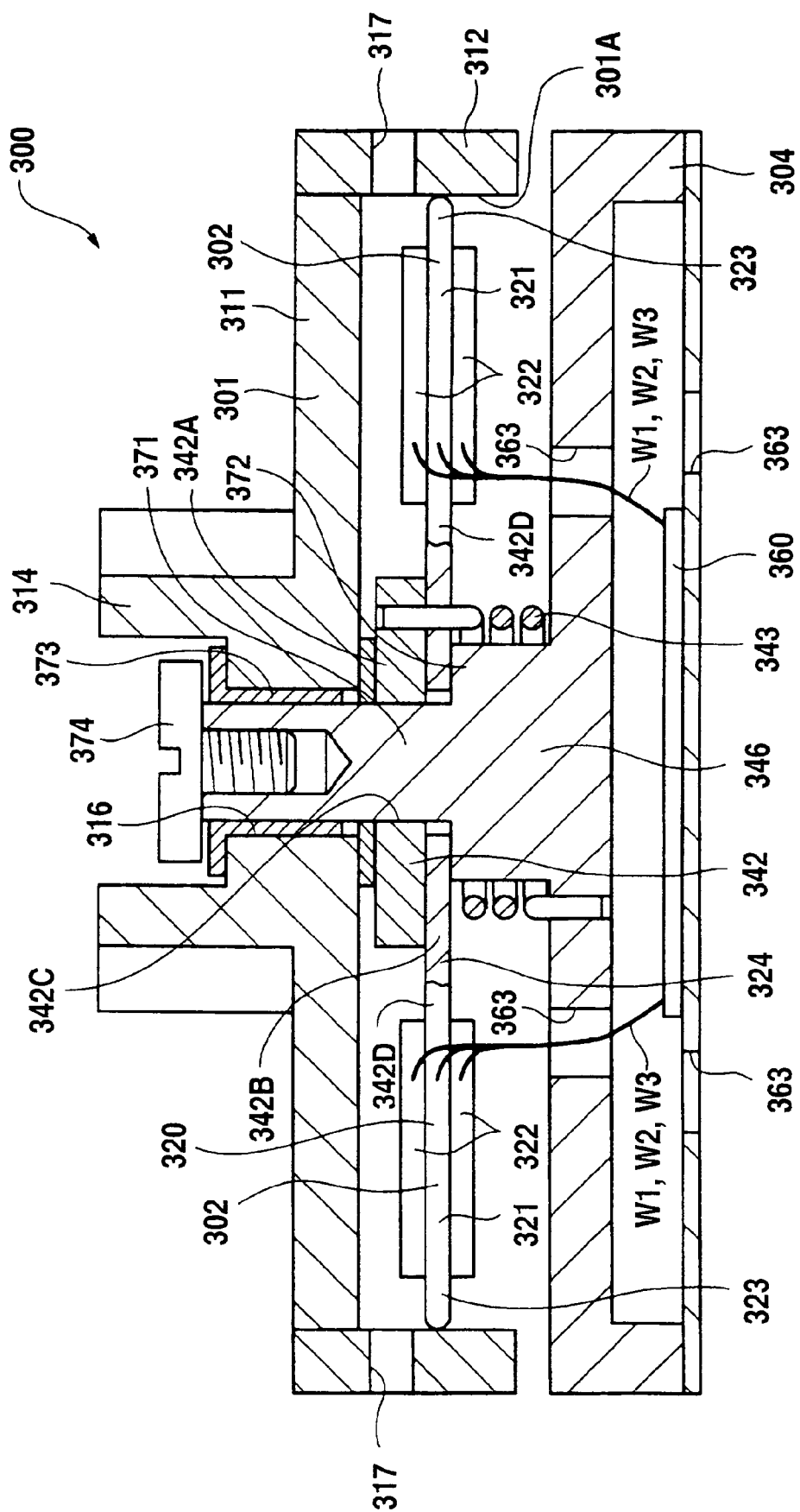
FIG. 13 is a cross sectional view of the rotary drive device in accordance with the third embodiment.

Now a third embodiment of the present invention is described while referring to FIGS. 12 and 13. FIG. 12 shows a top plan view of a rotary drive device 300 in accordance with the third embodiment of the present invention, while FIG. 13 shows a cross sectional view of the rotary drive device 300 shown in FIG. 12. In the following description, such words as "upper," "above," "lower," and "below" refer to the respective directions of the rotary drive device 300 as it is shown in FIG. 13.

This rotary drive device 300 is used as a centrifugal fan that blows air by rotating a rotating body 301 and is installed in, for example, a computer to cool the internal components of the computer. Similarly to the rotary drive device 300 of the second embodiment, this rotary drive device 300 has a base part 304, a bearing assembly 346, the rotating body 301, and a vibrating mechanism 320.

The base part 304 is box-shaped and provided with a plurality of openings 363 and an internal driving device 360. The openings 363 are provide on both the upper surface and the lower surface of the base part 304. The driving device 360 includes a battery and a drive circuit which is connected to some vibrating bodies 302 (discussed later) by lead wires W2 and W3. The driving device 360 sends a single drive signal that causes the piezoelectric elements 322 of the vibrating bodies 302 to vibrate. As a result, the vibrating body 302 vibrates and the rotating body 301 rotates.

The bearing assembly 346 comprises a shaft part main body 371 that is shaped like a circular rod and protrudes upward from the center of the base part 304, a support part 372 that is formed around the outside circumference of the shaft part main body 371, and a cylindrical bushing 373 that is provided around the outside circumferential surface of the shaft part main body 371 above the support part 372.

The material of the bushing 373 can be selected as appropriate in view of the bearing strength and lubrication characteristics. Examples include, but are not limited to, oil-impregnated acetal resin, oil-impregnated polyolefin resin, oil-impregnated polyamide resin, oil-impregnated polyester resin, and ethylene fluoride resin. Other materials such as oil-impregnated metals are also acceptable.

The rotating body 301 is configured in the same manner as the rotating body 201 of the second embodiment, except that the structure of the main rotating body portion 311 is different. In this embodiment, the main rotating body portion 311 does not have a supported part at the rotational center but has a passage hole 316.

The bushing 373 is inserted through the passage hole 316 of the main rotating body portion 311 and a screw 374 is screwed into the upper end face of the shaft part main body 371. As a result, the rotating body 301 and the rotating member 342 (discussed later) are sandwiched between the head part of the screw 374 and the support part 372 of the bearing assembly 346 and thereby supported in a rotatable manner. The play of the rotating body 301 can be adjusted by adjusting the screw 374.

The external surface of the output shaft 314 of the main rotating body portion 311 is provided with teeth that mate with a wheel train (not shown).

The annular part 312 of the rotating body 301 is provided with a plurality of openings 317 that are oriented at an angle with respect to the rotational direction of the rotating body 301. As a result, the rotating body 301 constitutes a centrifugal fan that draws in external air through the openings 317.

The vibrating mechanism 320 has three vibrating bodies 302 coupled to the base part 304 by a single arm part 324. The vibrating bodies 302 are constructed in the same manner as the vibrating bodies 202 of the second embodiment, except that they do not have a vibration detecting electrode 222D. Instead, the drive electrodes 322E cover the entire surfaces of the piezoelectric elements 322.

The reinforcing plate 321 of each vibrating body 302 is provided with two protrusions 323A and 323B that are formed integrally at diagonally opposite positions on the lengthwise-facing ends of the reinforcing plate 321 and are semicircular in shape in a plan view. Of the two protrusions 323A and 323B, the protrusion 323B of each vibrating body 302 includes an abutting part 323 that abuts the contact part 301A.

When the vibrating bodies 302 receive the drive signal from the driving device 360, the piezoelectric elements 322 elongate and contract in the lengthwise direction. Since the two protrusions 323B of each vibrating body 302 are provided in an unbalanced manner, the longitudinal vibration of the piezoelectric element 322 causes the vibrating body 302 undergo bending vibration in which it oscillates in the widthwise direction. As a result, the abutting parts 323 move through the paths R, similarly to the abutting part 223 in the second embodiment.

The arm part 324 is provided with a rotating member 342 and a pressing force applying member 343. The rotating member 342 has a passage hole 342C at its center. The shaft part main body 371 passes through the passage hole 342C such that the rotating member is disposed above the support part 372 and is rotatably supported along with the rotating body 301.

The rotating member 342 also has an annular rotating main body part 342A and a support part 342B that is fixed to the bottom surface of the rotating main body part 342A and supports the vibrating bodies 302. The support part 342B has three arms 342D that support the vibrating bodies 302 and the arms 342D are arranged at equal intervals, 120 degrees apart from each other.

The pressing force applying member 343 is a spiral spring and is arranged along the outside circumferential surface of the support part 372 of the bearing assembly 346. One end of the pressing force applying member 343 is stopped in the vicinity of the support part 372 of the base part 304 and the other end passes through the support part 342B of the rotating member 342 and is stopped against the rotating main body part 342A.

With the arm part 324 thus constituted, the pressing force applying member 343 can cause the abutting parts 323 of the vibrating bodies 302 to rotate clockwise about the rotational axis of the rotating body 301 and be pressed against the contact part 301A.

In addition to effects (1), (2), (5), and (10) of the first embodiment and effects (12) to (15) of the second embodiment, this embodiment also provides the following effects.

(18) Since a driving device 360 is provided inside the base part 304, it is not necessary to draw lead wires from the rotary drive device 300 for delivering the drive signal. As a result, the rotary drive device is simpler in construction and easier to handle. Additionally, since the rotary drive device 300 can be driven in a standalone manner, it is more portable and can be used outdoors and other places where it is difficult to secure a power source.

(19) Since the rotating body 301 is used as a centrifugal fan, the intake and exhaust of air into and out of the rotary drive device can be executed in a forced manner. As a result, the inside of the rotary drive device 300 can be cooled and the area surrounding the piezoelectric elements 322 can be prevented from rising severely, thus allowing the rotary drive device 300 to be driven in a stable manner.

More particularly, since openings 363 are provided in the base part 304, air can pass easily in and out through the openings 363 and the rotary drive device 300 can be driven in an even more stable manner.

Fourth Embodiment

Figure 14:
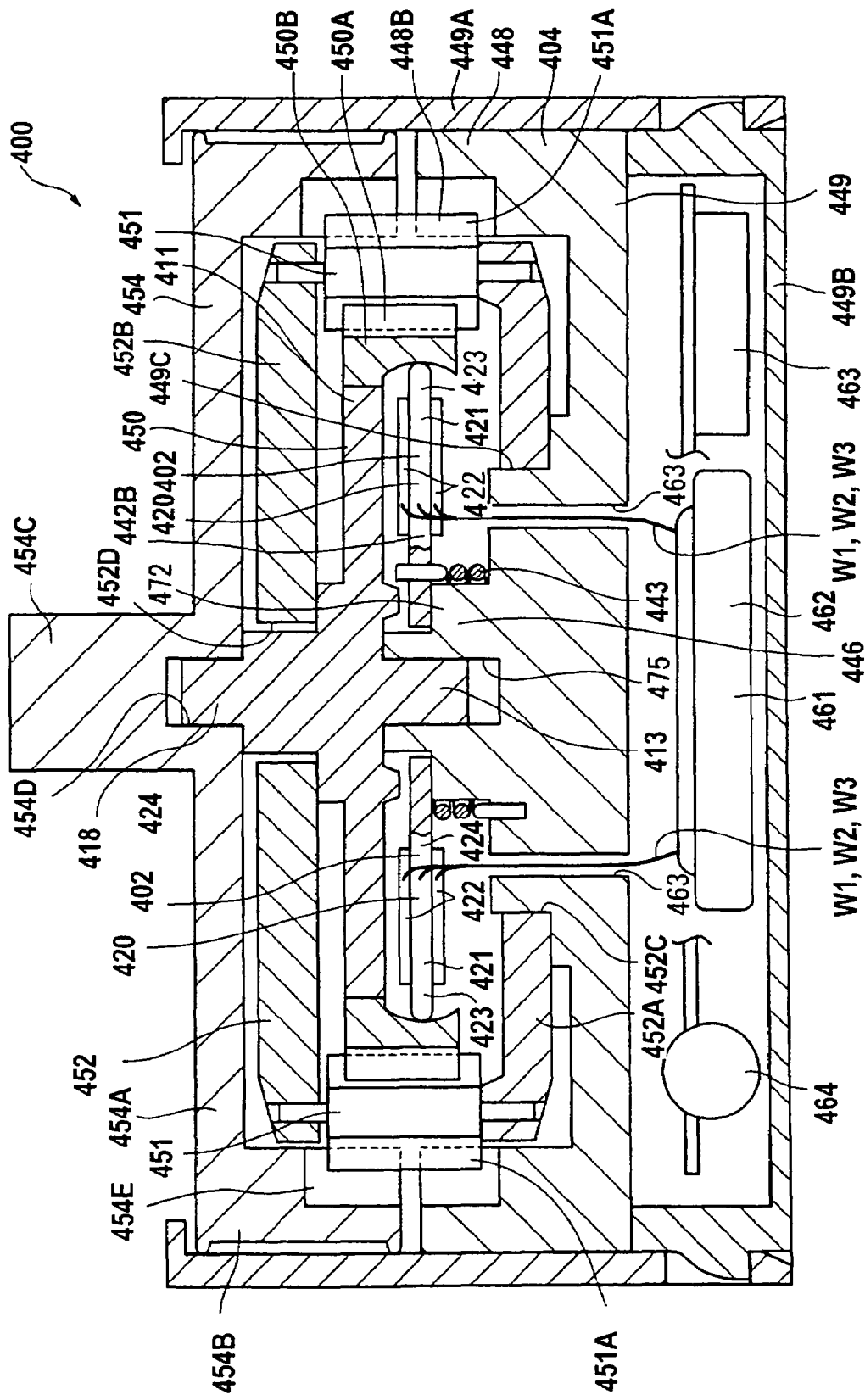
FIG. 14 is a cross sectional view of a rotary drive device in accordance with a fourth embodiment of the present invention.

A fourth embodiment of the present invention is now described in reference to FIG. 14. FIG. 14 is a cross sectional view of a rotary drive device 400 in accordance with the fourth embodiment of the present invention. In the following description, such words as "upper," "above," "lower," and "below" refer to the respective directions of the rotary drive device 400 as it is shown in FIG. 14.

The rotary drive device 400 is a planetary gear mechanism comprising a base part 404 having a stationary internal gear 448, a sun gear 452 rotatably mounted to the base part 404 through a bearing assembly 446, a vibrating mechanism 420 that is mounted on the base part 404 and serves to rotate the sun gear 450, three planet gears 451, a carrier 452, and a movable internal gear 454.

This rotary drive device 400 is installed in, for example, a floppy disc drive (FDD) and the floppy disc drive is rotated by the rotational motion of an output shaft 443 provided at the rotational center of the rotating body 401.

The base part 404 is provided with a circular-disc-shaped main body 449 having the same construction as the base part 204 of the second embodiment, a cylindrical part 449A that covers the outside circumferential surface of the main body 449, and a lid part 449B that closes the bottom of the cylindrical part 449A. A control device 461 is enclosed between the base part main body 449 and the lid part 449B.

The control device 461 includes a battery 462, a drive circuit 463, and a quartz crystal oscillator 464. The control device 461 is connected to the vibrating bodies 402 by lead wires W1-W3, which are passed through the openings 463 of the base part main body 449. The control device 461 has a driving function similar to the driving device 360 of the third embodiment and a vibration detecting function for detecting the vibrational state of the vibrating bodies 402.

The portion of the upper surface of the base part main body 449 surrounding a support part 472 of the bearing assembly 446 (discussed later) is recessed so as to form a carrier guide part 449C.

The stationary internal gear 448 has teeth 448A on the internal surface thereof and is formed along the upper surface of the base part main body 449 and the inside circumferential surface of the cylindrical part 449A.

The bearing assembly 446 is equipped with a shaft hole 475 formed at the center of the base part main body 449 with the support part 472 being formed so as to protrude upward around the shaft hole 475.

The sun gear 450 is constructed similarly to the rotating body 201 of the second embodiment; although it does not have an output shaft or an opening, it does have a main rotating body portion 411, a supported part 413 and an upwardly protruding positioning pin 418 formed at the rotational center thereof. Teeth 450A are formed on the external surface of an annular part 450B of the sun gear 450.

The sun gear 450 is rotatably supported on the base part main body 449 of the base part 404 by the supported part 413 of the sun gear 450 being inserted into the shaft hole 475 of the ball bearing assembly 446. The sun gear 450 mates with the planet gears 451 and rotates the planet gears 451 by transmitting power to them with the teeth 450A on its outer circumferential portion.

The vibrating mechanism 420 is constructed similarly to the vibrating mechanism 320 in that it has three vibrating bodies 402 and one arm part 424. However, the rotating member 442 of the arm part 424 does not have the rotating main body part 342A of the third embodiment and, instead, comprises only a support part 442B. Consequently, the other end of the pressing force applying member 443 of the arm part 424 is stopped against the support part 442B of the rotating member 442. Each of the vibrating bodies 402 are constructed like the vibrating bodies 302, and thus, includes a reinforcing plate 421, a pair of piezoelectric elements 422 and an abutting part 423.

The moveable internal gear 454 is arranged above the stationary internal gear 448 and along the internal circumferential surface of the cylindrical part 449A, and is provided with a disc-shaped moveable internal gear main body 454A and a cylindrical part 454B that is formed around the outside circumference of the moveable internal gear main body 454A.

The moveable internal gear main body 454A has an output shaft 454C formed at the rotational center so as to project upward from the upper surface thereof and a positioning hole 454D formed at the rotational center in the lower surface thereof. The positioning pin 418 of the sun gear 450 fits into the positioning hole 454D.

The moveable internal gear 454 is rotatably supported on the sun gear 450 by the positioning hole 454D and the external surface thereof slides along the internal surface of the cylindrical part 449A. Teeth 454E are formed on the internal circumferential surface of the cylindrical part 454B.

Moreover, the center axis of the sun gear 450 and the stationary internal gear 448 and the rotational axis of the moveable internal gear 454 line on the same straight line.

The planet gears 451 have teeth 451A formed on the external circumferential surface thereof and the teeth 451A mesh with the teeth 450A of the sun gear 450, the teeth 448A of the stationary internal gear 448, and the teeth 454E of the moveable internal gear 454.

The carrier 452 supports the three planet gears 451 such that they can orbit around the sun gear 450 while maintaining equal spacing with respect to each other. The carrier 452 comprises a lower carrier 452A and an upper carrier 452B.

The lower carrier 452A has a passage hole 452C at its center and the support part 472 of the bearing assembly 446 passes through the passage hole 452C such that the lower carrier 452A is rotatably supported on the carrier guide part 449C of the base part main body 449.

The upper carrier 452B has a passage hole 452D at its center and the positioning pin 418 of the sun gear 450 passes through the passage hole 452C such that the upper carrier 452B is rotatably supported on the sun gear 450.

The lower carrier 452A and the upper carrier 452B are coupled together by coupling members (not shown) such that they sandwich the upper and lower ends of the rotary shafts of the planet gears 451 and thereby support the planet gears 451.

Now the operation of the rotary drive device 400 will be explained. When the control device 461 applies an AC voltage to the piezoelectric elements 422, the piezoelectric elements 422 elongate and contract in the lengthwise direction of the vibrating bodies 402 and the vibrating bodies 402 undergo longitudinal vibration and bending vibration simultaneously, causing the abutting parts 423 to move through the paths R.

As a result, the sun gear 450 rotates and the planet gears 451, whose teeth 451A are meshed with the teeth 450A of the sun gear 450, also rotate. Since the teeth 451A are also meshed with the teeth 448A of the stationary internal gear 448 (which does not rotate), the torque applied by the sun gear 450 causes the planet gears 451 to orbit around the sun gear 450 while following along the teeth 448A of the stationary internal gear 448 and spinning about their own rotational axes. Since the teeth 451A of the planet gears 451 also mesh with the teeth 454E of the moveable internal gear 454, the moveable internal gear 454 also rotates.

Thus, each time the planet gears 451 make one revolution around the sun gear 450, the position of the moveable internal gear 454 shifts relative to the stationary internal gear 448 and this shifting translates in to rotation of the output shaft 454C.

The reduction ratio of the rotary drive device 400 is given by the following equation:

$$ZZ = \frac{\frac{L+M}{L}}{1 - \frac{SM}{RN}}, \qquad \text{(Equation 1)}$$

where ZZ is the reduction ratio, L is the tooth count of the sun gear 450, M is the tooth count of the stationary internal gear 448, N is the tooth count of the moveable internal gear 454, R is the tooth count of the portion of the planet gears 451 that meshes with the stationary internal gear 448, and S is the tooth count of the portion of the planet gears 451 that meshes with the moveable internal gear 454.

For example, when L=56, M=65, N=68, and S=R=8, the reduction ratio of the rotary drive device 400 is 48.57.

In addition to effects (1), (2), (5), (6) and (10) of the first embodiment, effects (12) to (15) and (17) of the second embodiment, and effect (18) of the third embodiment, this embodiment also provides the following effects.

(20) When the control device 461 applies an AC voltage to the piezoelectric elements 422, the piezoelectric elements 422 elongate and contract in the lengthwise direction of the vibrating bodies 402 and the abutting parts 423 of the vibrating bodies 402 move through the paths R, causing the sun gear 450 to rotate. As a result, the planet gears 451 also rotate and the torque applied by the sun gear 450 causes the planet gears to orbit around the sun gear 450 while following along the teeth 448A of the stationary internal gear 448 and spinning about their own rotational axes. Since the planet gears 451 also mesh with the teeth 454E of the moveable internal gear 454, the moveable internal gear 454 also rotates. As a result, the rotational speed is greatly reduced and a large drive torque can be obtained.

Additionally, since the rotating body also serves as the sun gear 450, i.e., since the rotating body is the sun gear 450 of the planetary gear mechanism, the overall size of the rotary drive device 400 can be reduced when it is used as a planetary gear mechanism.

(21) Since power is transmitted with the outer circumferential part of the sun gear 450, when an external force acts on the outer circumferential part of the sun gear 450 in the radial direction thereof, the perpendicular distance from shaft hole 475, i.e., the point where the base part main body 449 supports the sun gear 450, to the line along which the external force acts can be kept short. As a result, the magnitude of moments acting about axes perpendicular to the rotational axis of the sun gear 450 can be reduced and the rotary drive device 400 can be driven in a stable manner.

Fifth Embodiment

Figure 15:
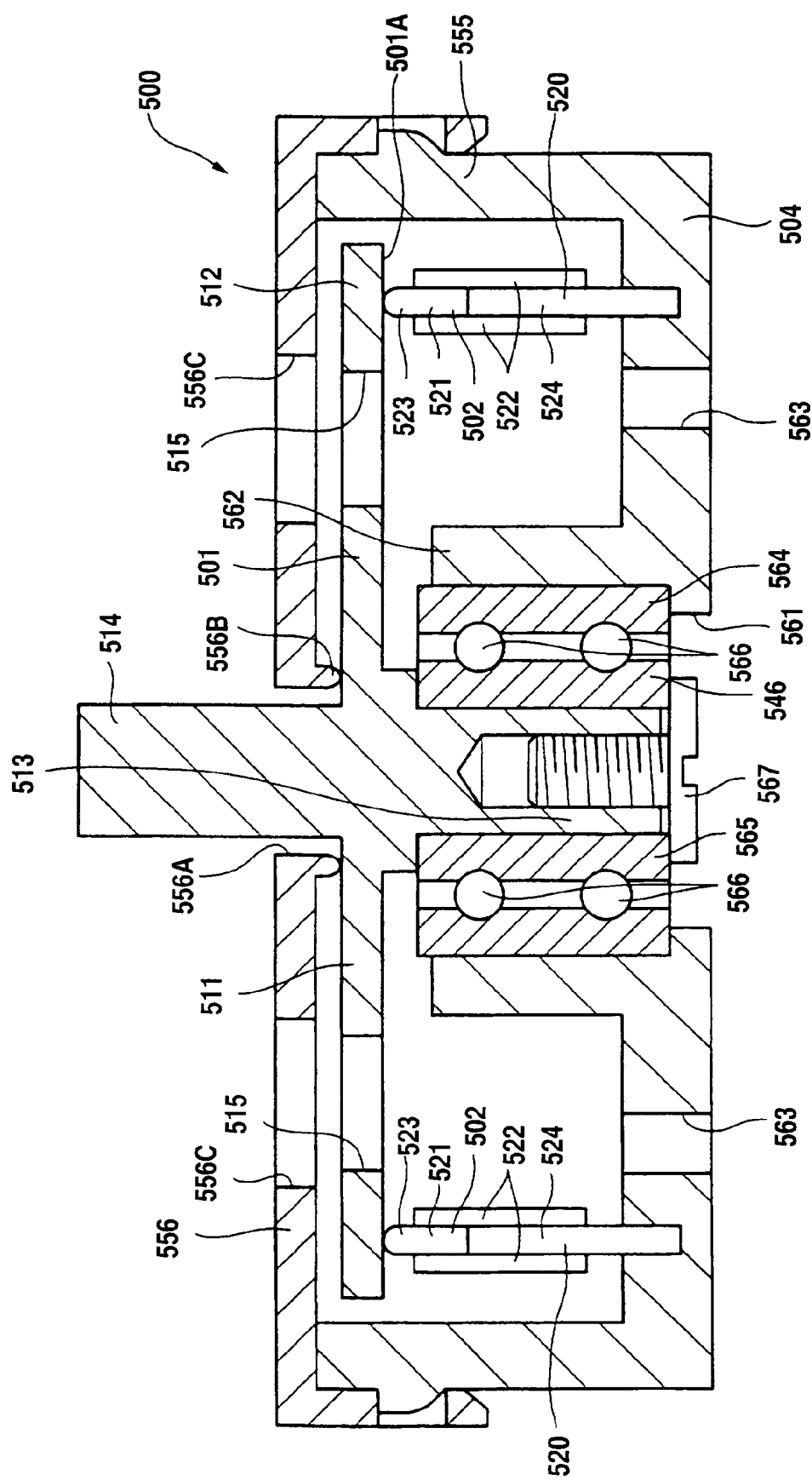
FIG. 15 is a cross sectional view of a rotary drive device in accordance with a fifth embodiment of the present invention.
Figure 16:
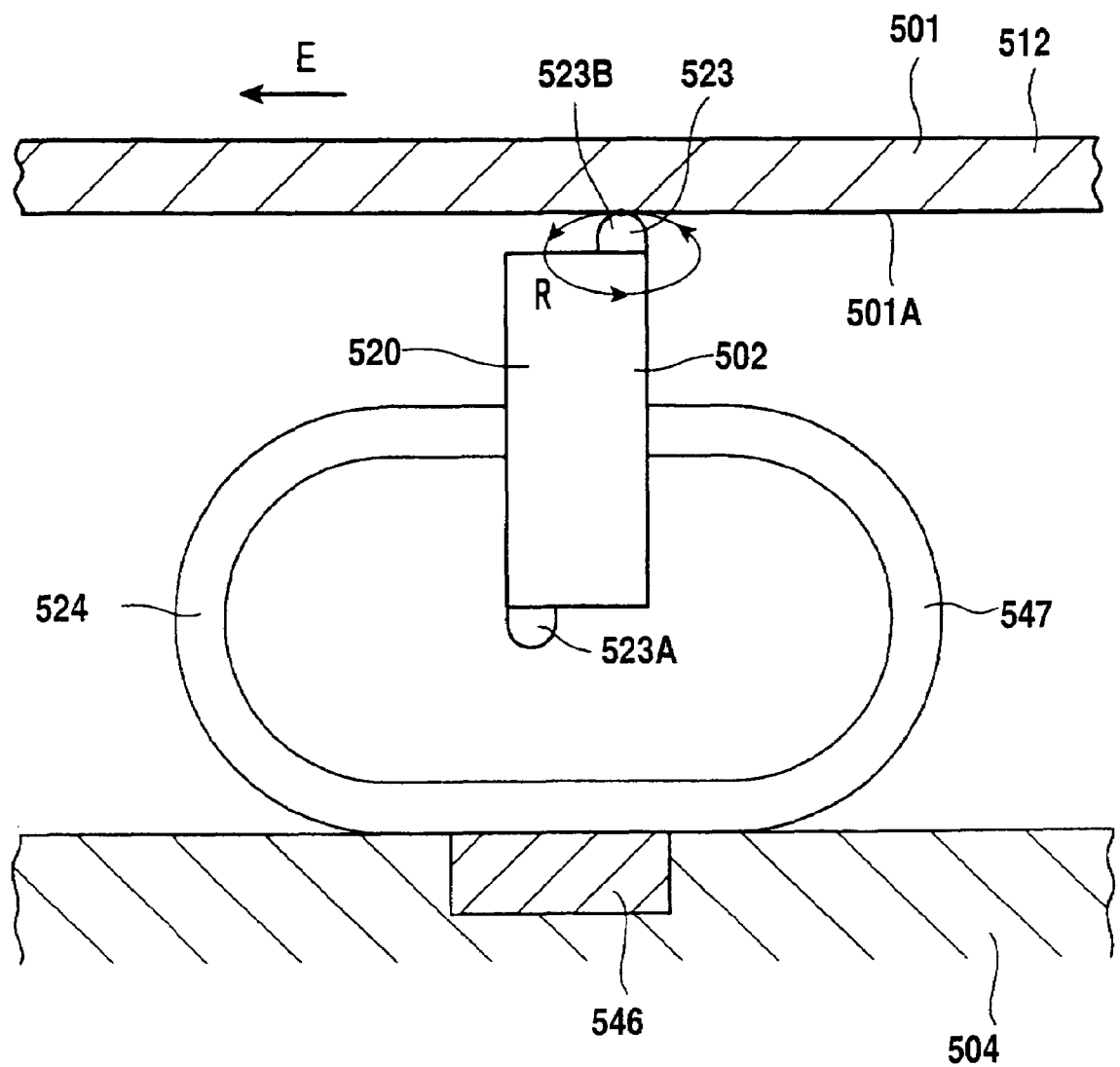
FIG. 16 is an enlarged side view of a vibrating body of the rotary drive device in accordance with the fifth embodiment.

A fifth embodiment of the present invention will now be described in reference to FIGS. 15 and 16. FIG. 15 shows a cross sectional view of a rotary drive device 500 in accordance with the fifth embodiment of the present invention, while FIG. 16 shows an enlarged side view of a vibrating mechanism 520 of the rotary drive device 500. In the following description, such words as "upper," "above," "lower," and "below" refer to the respective directions of the rotary drive device 500 as it is shown in FIG. 16.

Similarly to the rotary drive device 200 of the second embodiment, this rotary drive device 500 has a base part 504, a ball bearing assembly 546, a rotating body 501, and a vibrating mechanism 520. The rotating body 501 has a main rotating body portion 511 with an outer annular part 512 forming a contact part 501A. The rotating body 501 is supported on the base part 504 by a supported part 513. The main rotating body portion 511 has a plurality of openings 515. The ball bearing assembly 546 includes a cylindrical bearing 564, a cylindrical journal 565, and a plurality of balls 566 arranged between the bearing 564 and the journal 565. A screw 567 attaches the ball bearing assembly 546 to the rotating body 501.

This rotary drive device 500 is installed, for example, into the main body of a camera and used to drive the zoom mechanism of the lens. More specifically, in, for example, a lens zoom mechanism comprising three lenses arranged parallel to each other, the rotary drive device 500 could be used to move the middle lens back and forth between the two outside lenses. This could be accomplished by attaching a drive shaft having external threads directly onto an output shaft 514 provided at the rotational center of the rotating body 501 and connecting the drive shaft to the middle lens so as to form a ball screw arrangement. When the output shaft 514 rotates, the drive shaft of the zoom mechanism will rotate and the lens will move in a parallel manner along the external threads of the drive shaft of the zoom mechanism.

The base part 504 has a shaft hole 561, a protruding part 562, a plurality of openings 563, a wall part 555 provided around the outer circumference of the base part 504, and a cover 556 that mates with the wall part 555 and covers the base part 504.

The cover 556 is shaped like a circular disc and has a passage hole 556A provided at its center, a pressing part 556B that protrudes downward from the periphery of the passage hole 556A, and a plurality of openings 556C formed around the passage hole 556A.

The output shaft 514 of the rotating body 501 (discussed later) is passed through the passage hole 556A. The pressing part 562 presses down on the main rotating body portion 511 of the rotating body 501 and thereby prevents the rotating body 501 from changing position in the vertical direction.

The rotating body 501 is constructed in the same manner as the rotating body 501 in the second embodiment, except that the structure of the annular part 512 is different ass discussed below.

The annular part 512 is formed integrally with the main rotating body portion 511 and has the contact part 501A on its lower surface. The contact part 501A is a flat surface that is contacted at positions having a prescribed distance from the rotational center by the abutting parts 523 of the vibrating mechanism 520 (discussed later), which approach the contact part along a direction substantially parallel to the rotational axis.

The vibrating mechanism 520 has three vibrating bodies 502 that are substantially identical to the third embodiment and three arm parts 524 that support the vibrating bodies 502 such that the abutting parts 523 of the vibrating bodies 502 are pressed against the contact part 501A of the rotating body 501. Similar to the third embodiment, each vibrating body 502 has a reinforcing place 521 located between a pair of piezoelectric elements 222. The reinforcing plate 521 has a pair of protrusions 523A and 523B, with the protrusion 523B having the abutting part 523.

The positions of the vibrating bodies 502 in a plane that intersects the rotational axis of the rotating body 501 are the same as the contact part 501A and the vibrating bodies 502 are arranged at equal intervals along the contact part 501A. The vibrating bodies 502 are arranged in a substantially parallel orientation with respect to the rotational axis of the rotating body 501, and thus, the abutting parts 523 contact the contact part 501A in a perpendicular manner.

As shown in FIG. 16, each arm part 524 has a fixed part 546 that is fixed to the base part 504 and a support part (pressing force applying member) 547 that is mounted to the fixed part 546 and supports the vibrating body 502.

The support part 547 is made of an elastically deformable material shaped into the form of an elliptical ring. The portion of the support part 547 that is mounted to the fixed part 546 and the portion that supports the vibrating body 502 are positioned so as to face each other. Although the fixed part 546 is a separate member from the support part 547 in this embodiment, the invention is not limited to this arrangement and it is acceptable for the fixed part to be formed integrally with the support part 547.

When the driving device vibrates the vibrating bodies 502, the abutting parts 523 undergo longitudinal vibration and bending vibration. The arm parts 524 deform elastically in response to this motion and, while supporting the vibrating bodies 502, press the abutting parts 523 of the vibrating bodies 502 against the contact part 501A of the rotating body 501. As a result, the abutting parts 523 move through an approximately elliptical path R. Thus, the abutting parts 523 repetitively push against the contact part 501A and cause the rotating body 501 to rotate in the direction of arrow E in FIG. 16.

In addition to effects (1), (2), (5), and (10) of the first embodiment and effects (12) and (14) to (17) of the second embodiment, this embodiment also provides the following effect.

(22) There are three vibrating bodies 502 arranged at equal intervals along the contact part 501A of the rotating body 501 and the abutting parts 523 are pressed against the contact part 501A from a direction generally parallel to the rotational axis. Consequently, the contact part 501A of the rotating body 501 can be pushed by the abutting parts 523 from a direction generally parallel to the rotational axis with equal forces in a balanced manner. As a result, the rotational axis of the rotating body 501 is prevented from deviating off center and the rotary drive device 500 can be driven in a stable manner.

Sixth Embodiment

Figure 17:
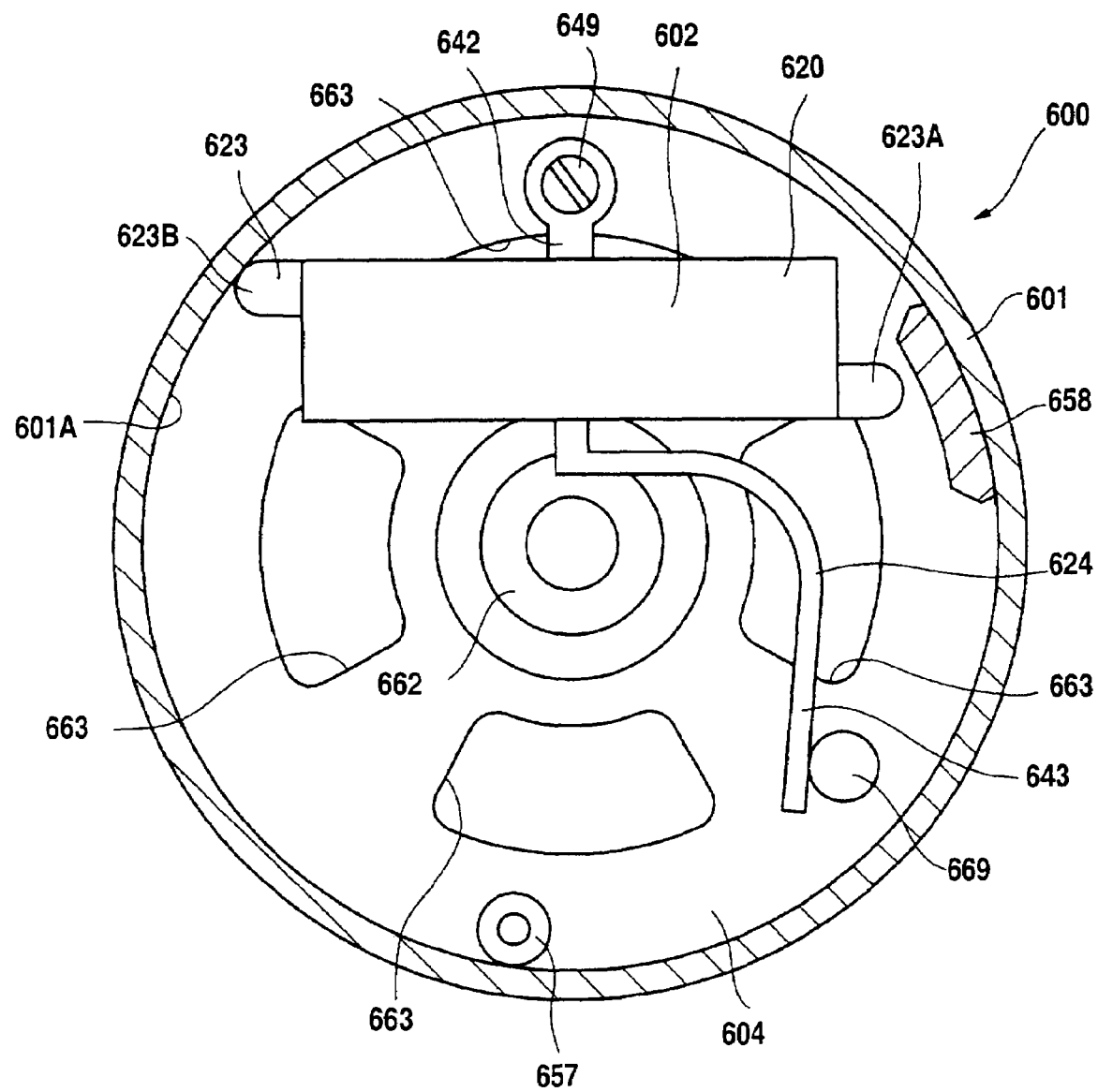
FIG. 17 is a top plan view of a rotary drive device in accordance with a sixth embodiment of the present invention.
Figure 18:
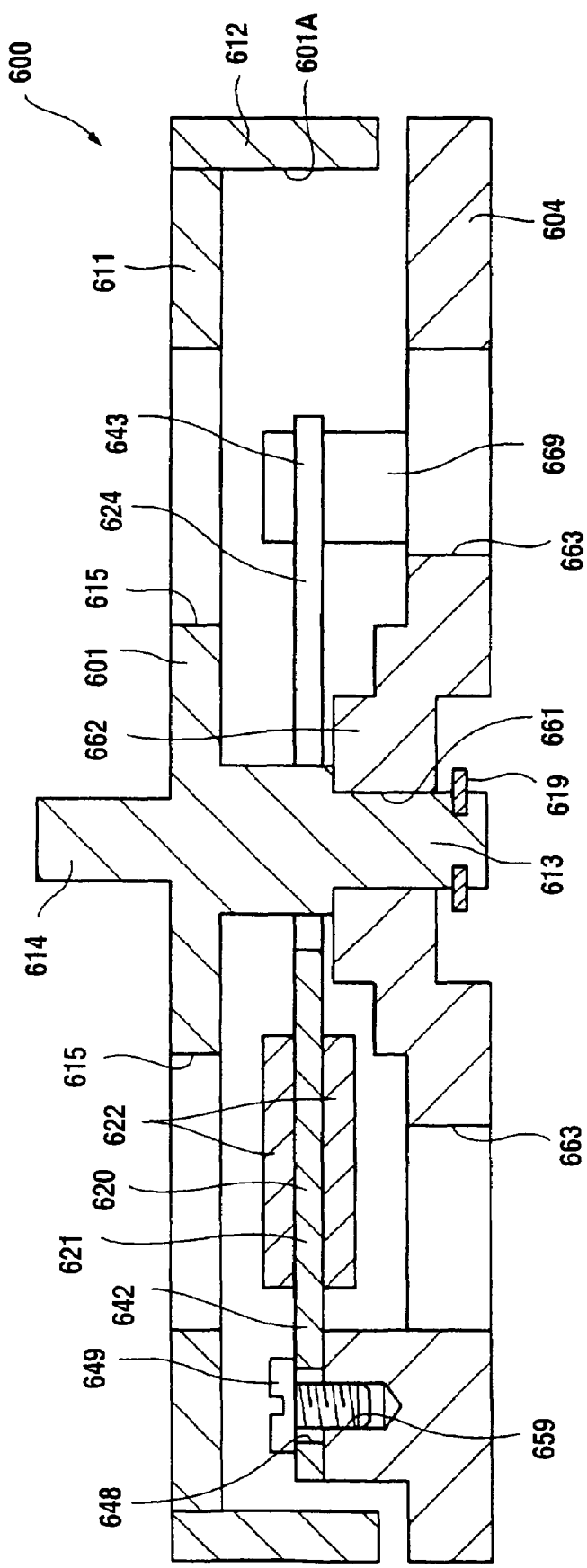
FIG. 18 is a cross sectional view of a rotary drive device in accordance with the sixth embodiment.

A sixth embodiment of the present invention will now be described in reference to FIGS. 17 and 18. FIG. 17 is a top plan view showing a rotary drive device 600 in accordance with the sixth embodiment of the present invention, while FIG. 18 is a cross sectional view of the rotary drive device 600 shown in FIG. 17. In the following description, such words as "upper," "above," "lower," and "below" refer to the respective directions of the rotary drive device 600 as it is shown in FIG. 18.

The rotating body 601 has a disc-shaped main rotating body portion 611 and an annular part 612 fixed onto the outer circumference of the main rotating body portion 611. The main rotating body portion 611 has a supported part 613 that protrudes downward along the rotational center thereof, an output shaft 614 that protrudes upward along the rotational center thereof, and a plurality of openings 615 that pass from one side surface to the other side surface of the main rotating body portion 611. The base part 604 also has a plurality of openings 663 that pass from one side surface to the other side surface of the base part 604. Thus, the base part 604 and the main rotating body portion 611 form an interior space that substantially surrounds the vibrating mechanism 620 with the openings 615 and 663 communicating between the inside of this space and the outside of this space.

Referring both to FIGS. 17 and 18, the vibrating body 602 comprises a reinforcing plate 621 that is generally rectangular in shape, and a pair of flat plate-shaped piezoelectric elements 622 that are provided on the front and back surfaces of the reinforcing plate 621. The reinforcing plate 621 has a pair of protrusions 623A and 623B with an abutting part 623 formed integrally on the protrusion 623B of the reinforcing plate 621, and an arm part 624 formed integrally on the long sides of the reinforcing plate 621.

This rotary drive device 600 is installed in, for example, a CD player. The rotational motion of an output shaft 614 provided at the rotational center of a rotating body 601 is used to rotate a CD. This rotary drive device 600 does not have the ball bearing assembly, but similarly to the rotary drive device 200 of the second embodiment, it is provided with the base part 604, the rotating body 601, and the vibrating mechanism 620.

The base part 604 has a shaft hole 661, a protruding part 662, and a plurality of openings 663. It also has a guide roller 657 and a guide part 658 that serve as a guide that touches against the contact part 601A of the rotating body 601 (discussed later) and guides the rotating body 601.

The base part 604 is made by injection molding using a mixture of polyacetal, polyamide, polyolefin, or other material with good lubricating characteristics and a strengthening material comprising potassium titanate particles that are approximately 0.3 micrometers in diameter and approximately 3 to approximately 5 micrometers in length.

The guide roller 657, the guide part 658, and the vibrating body 602 of the vibrating mechanism 620 (discussed later) are each singular in number and are arranged at equal intervals relative to each other along the contact part 601A of the rotating body 601. More specifically, the abutting part 623 of the vibrating body 602, the guide roller 657, and the guide part 658 are arranged in positions corresponding to the vertices of an equilateral triangle.

The vibrating body 602, the guide roller 657, and the guide part 658 are not limited to an equilateral triangle arrangement. It is also acceptable for them to be arranged in positions corresponding to the vertices of an isosceles triangle. In such a case, the vibrating body 602 is arranged at the vertex formed by the two sides of equal length.

The guide roller 657 has an outer circumferential part that is supported such that it can rotate freely. This outer circumferential part serves to guide the contact part 601A of the rotating body 601 by being in rolling contact with the contact part 601A.

The guide part 658 is formed integrally with the base part 604 and serves to guide the rotating body 601 by being in sliding contact with the contact part 601A. It is also acceptable to apply lubricating oil or grease to the guide part 658 as necessary.

The rotating body 601 is constructed in the same manner as the rotating body 101 of the second embodiment, except that the structure of the contact part 601A and the structure of the supported part 613 are different than for the rotating body 601 of the second embodiment.

The abutting part 623 of the vibrating mechanism 620, the guide roller 657, and the guide part 658 touch against the contact part 601A in general radial directions of the rotational center at positions that are a prescribed distance from the rotational center. The contact part 601A is a smooth surface having a concavely arced cross sectional shape that is concave with respect to the direction from which the abutting part 623 abuts there-against.

The supported part 613 is inserted into the shaft hole 661 from above and the tip portion thereof protrudes from the bottom of the shaft hole 661. A C-ring 619 is fitted onto the tip portion of the supported part 613 such that the rotating body 601 is rotatably supported on the base part 604. Also, the play of the rotating body 101 can be adjusted by adjusting the vertical position of the C-ring 619.

The vibrating mechanism 620 is provided with one vibrating body 602 like that of the second embodiment and one arm part 624. The arm part 624 has a rotating member 642 that is rotatably attached to the base part 604 and supports the vibrating body 602 and a pressing force applying part 643 that presses the abutting part 623 of the vibrating body 602 against the contact part 601A of the rotating body 601.

The rotating member 642 has a screw hole 648 at one end and is rotatably supported on the base part 604 by passing a screw 649 through the screw hole 648 and screwing it into a threaded part 659 of the base part 604. The other end of the rotating member 642 supports the lengthwise middle section of the reinforcing plate 621 of the vibrating body 602.

The pressing force applying member 643 is generally L-shaped and arranged along the outside of the protruding part. One end is supported at the lengthwise middle section of the reinforcing plate 621 of the vibrating body 602 and the other end mates with a pin 669 provided on the base part 604.

The rotating member 642 and the pressing force applying member 643 are formed integrally with the reinforcing plate 621 of the vibrating body 602.

With an arm part 624 thus constituted, the pressing force applying member 643 can cause the abutting part 623 of the vibrating body 602 to rotate clockwise about screw hole 648 of the rotating member 642 and be pressed against the contact part 601A.

In addition to effects (1), (2), (5), and (10) of the first embodiment and effects (12) and (15) to (17) of the second embodiment, this embodiment also provides the following effects.

(23) This embodiment has one vibrating body 602 and is also provided with one guide roller 657 and one guide part 658. The vibrating body 602, the guide roller 657, and the guide part 658 are arranged at equal intervals along the contact part 601A of the rotating body 601. Consequently, the vibrating body 602, the guide roller 657, and the guide part 658 can push against the contact part 601A of the rotating body 601 with equal forces in a balanced manner.

As a result, the rotational axis of the rotating body 601 is prevented from deviating off center and the rotary drive device 600 can be driven in a stable manner.

(24) Since does not have a ball bearing assembly and has only one vibrating body 602, the rotary drive device 600 can be reduced in size and cost.

(25) The rotary drive device 600 is particularly useful in a motor for toys, a general-purpose motor, or a thin vibration motor.

Seventh Embodiment

Figure 19:
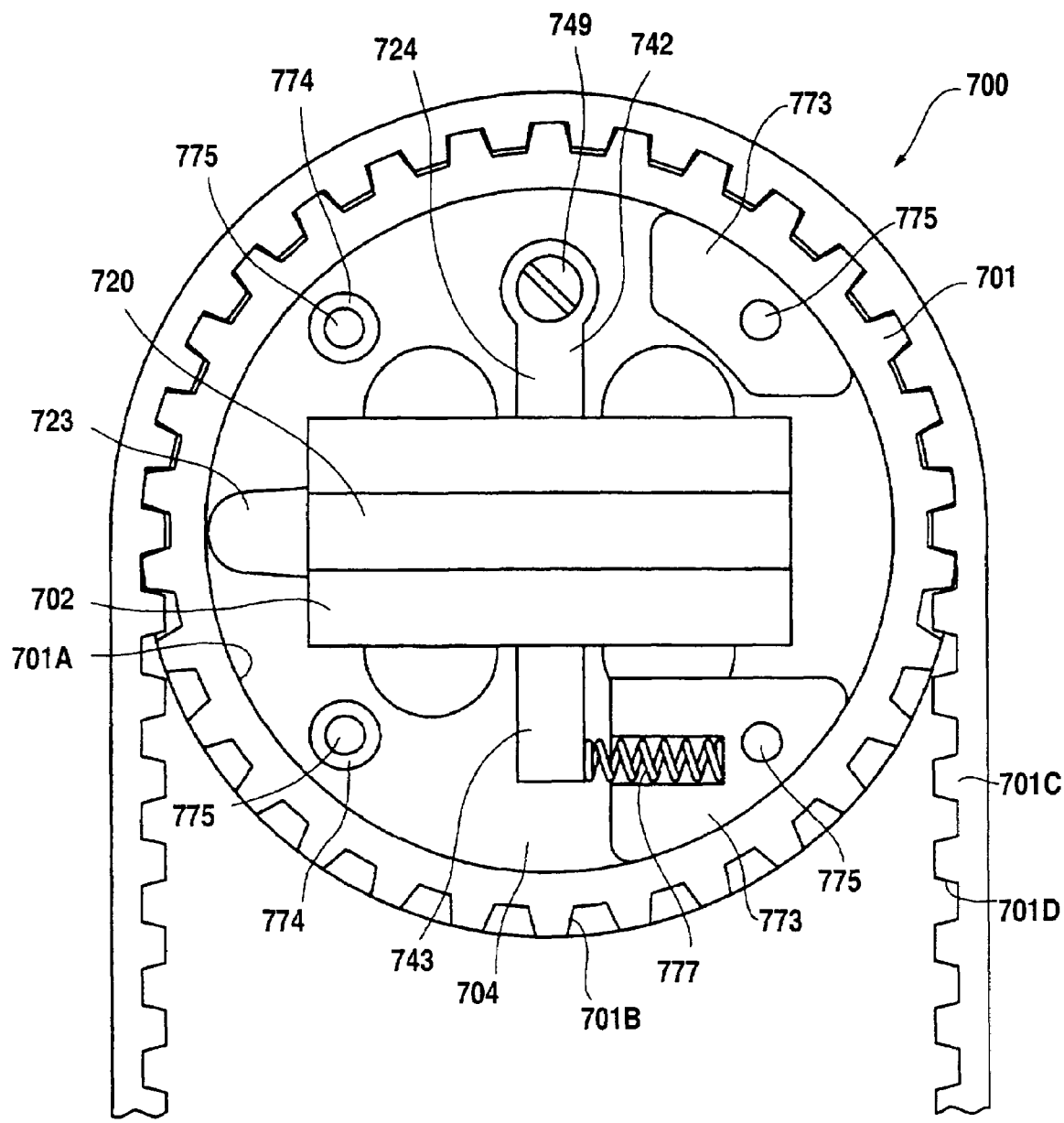
FIG. 19 is a top plan view of a rotary drive device in accordance with a seventh embodiment of the present invention.
Figure 20:
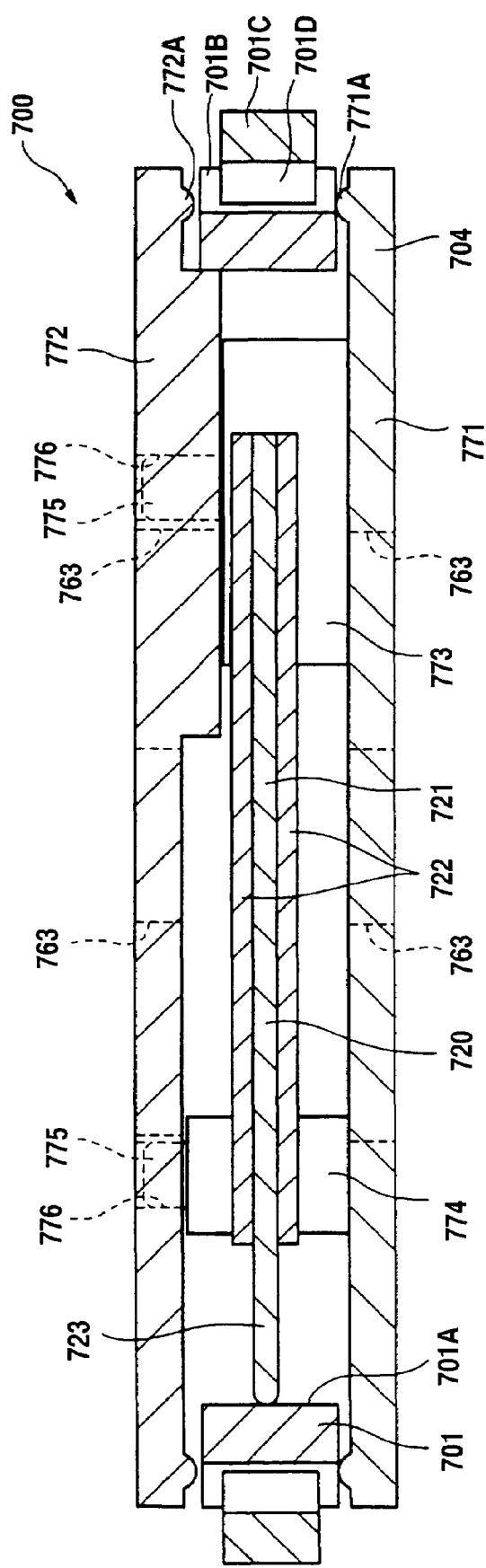
FIG. 20 is a cross sectional view of a rotary drive device in accordance with the seventh embodiment.

A seventh embodiment of the present invention will now be described in reference to FIGS. 19 and 20. FIG. 19 is a top plan view showing a rotary drive device 700 in accordance with the seventh embodiment of the present invention, while FIG. 20 is a cross sectional view of the rotary drive device 700 shown in FIG. 19. In the following description, such words as "upper," "above," "lower," and "below" refer to the respective directions of the rotary drive device 700 as it is shown in FIG. 20.

This rotary drive device 700 is installed, for example, as the drive unit for an electric-powered bicycle. A wheel of the electric bicycle is rotated by a belt 701C that mates with the outer circumference of the rotating body 701.

This rotary drive device 700 does not have the ball bearing assembly, but similarly to the rotary drive device 200 of the second embodiment, it is provided with a base part 704, a rotating body 701, and a vibrating mechanism 720.

The base part 704 includes a disc-shaped lower base part 771 and an upper base part 772 that is attached to the top of the lower base part 771. The lower base part 771 and the upper base part 772 do not have a shaft hole or a protruding part, but similarly to the base part 204 of the second embodiment, they do have a plurality of openings 763 (diagrammatically shown with dashed lines).

The lower base part 771 has a pair of guide parts 773 that touch against the contact part 701A of the rotating body 701 and serve to guide the rotating body 701 and a pair of upper base part bearings 774 that protrude upward from the upper surface of the lower base part 771. The guide parts 773 guide the rotating body 701 by being in sliding contact with the contact part 701A.

The lower base part 771 and the upper base part 772 have a plurality of pinch-holding parts 771A and 772A, respectively, provided on their inwardly facing sides of the outer circumferential portions thereof. The pinch-holding parts 771A of the lower base part 771 and the pinch-holding parts 772A of the upper base part 772 pinch-hold the rotating body 701 and prevent the rotating body 701 from shifting position along the direction of its rotational axis.

A protrusion 775 is formed on the upper surface of each guide part 773 and the upper surface of each upper base part bearing 774. The protrusions 775 fit into holes 776 formed in the upper base part 772 so that the lower base part 771 and the upper base part 772 are coupled together with the guide parts 773 and the upper base part bearings 774 sandwiched there-between.

The base part 704 is made by injection molding using a mixture of polyacetal, polyamide and polyolefin or other material with good lubricating characteristics and a strengthening material comprising potassium titanate particles that are approximately 0.3 micrometers in diameter and 3 to 5 micrometers in length.

The rotating body 701 is annularly shaped and is arranged along an outer circumferential portion of the base part 704.

A contact part 701A is formed on the inner circumferential surface of the rotating body 701 and teeth 701B are formed on the outer circumferential surface of the same so as to form a toothed pulley.

The abutting part 723 of the vibrating mechanism 720 (discussed later) and the guide parts 773 touch against the contact part 701A from the general direction of the rotational center at positions that are a prescribed distance from the rotational center. As a result, the rotating body 701 is supported by the abutting part 723 and the guide parts 773 at positions that are a prescribed distance from the rotational axis and thereby prevented from shifting position in a direction that intersects the rotational axis. In a cross sectional view, the contact part 701A is a flat surface instead of a concave arc shaped surface.

The belt 701C is wrapped around the outside circumference of the rotating body 701. The belt 701C is a toothed belt having teeth 701D on its inside surface. These teeth 701D mesh with the teeth 701B of the rotating body 701 such that power is transmitted to the belt 701C from the outer circumferential portion of the rotating body 701.

Although the rotating body 701 and the belt 701C of this embodiment form a combination of a toothed pulley and a toothed belt, other arrangements are also acceptable, e.g., a V-pulley and a V-belt, a flat pulley and a flat belt, or a sprocket and chain.

The vibrating mechanism 720 is provided with a vibrating body 702 and an arm part 724. Referring both to FIGS. 19 and 20, the vibrating body 702 comprises a reinforcing plate 721 that is generally rectangular in shape, and a pair of flat plate-shaped piezoelectric elements 722 that are provided on the front and back surfaces of the reinforcing plate 721. The reinforcing plate 721 has an abutting part 723 formed integrally on the reinforcing plate 721, with the arm part 724 formed integrally on the long sides of the reinforcing plate 721. The arm part 724 has a rotating member 742 and a pressing force applying member 743. The pressing force applying member 743 is straight in form and arranged such that it is supported at one end at the lengthwise middle section of the reinforcing plate 721 of the vibrating body 702 and the other end is contacted by the tip end of a spring 777 mounted in a guide part 773 of the base part 704. The vibrating body 702 is identical to the vibrating body 2 of the first embodiment.

In addition to effects (1), (2), (5), (7), (9) and (10) of the first embodiment, effects (12) and (17) of the second embodiment, effect (21) of the fourth embodiment, and effect (23) of the fifth embodiment, this embodiment also provides the following effects.

(26) Although the configuration is different from the first embodiment, this embodiment provides a similar effect to effect (3) of the first embodiment because the spring 777 presses the vibrating body 702 toward the rotating body 701. More specifically, the abutting part 723 can be pressed reliably against the contact part 701A and the rotating body 701 can be rotated reliably. As a result, the rotary drive device 700 can be driven in a stable manner.

Also, when the rotating body 701 is stopped, unnecessary rotation of the rotating body 701 can be suppressed when an external rotary force acts thereon because the abutting part 723 touches against the contact part 701A of the rotating body 701 and act as a stopper that resists rotation of the rotating body 701.

(27) Since the abutting part 723 of the vibrating body 702 and the guide part 773 support the rotating body 701 at positions that are a prescribed distance from the rotational axis, the vibrating body 702 can be arranged on the rotational axis and the space inside the rotating body 701 can be utilized more effectively than in cases where the rotating body is supported about its rotational axis. As a result, the size of the rotary drive device 700 can be further reduced.

(28) The rotary drive device 700 can be used as a thin motor for such applications as driving the turntable of a record player and driving a power window of a car.

Eighth Embodiment

Figure 21:
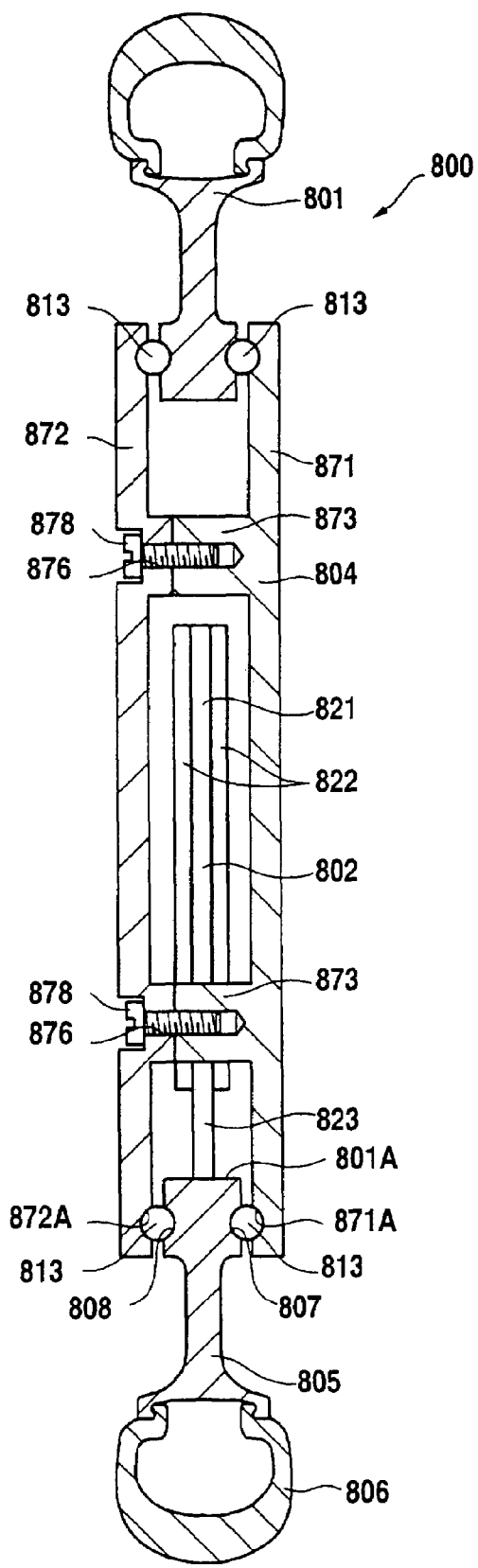
FIG. 21 is a cross sectional view of a rotary drive device in accordance with an eighth embodiment of the present invention.

An eighth embodiment of the present invention will now be described in reference to FIG. 21. FIG. 21 is a cross sectional view of a rotary drive device 800 in accordance with the eighth embodiment of the present invention. This rotary drive device 800 is basically the same as the rotary drive device 700 of the seventh embodiment, but slightly modified to be applied to the drive mechanism of an electric scooter. Preferably, the rotary drive device 800 is mounted to a scooter with suspension and the like. In other words, only the base part 804 and the rotating body 801 of this rotary drive device 800 are different from the seventh embodiment.

The base part 804 is similar to the base part 804 of the seventh embodiment, except that a lower base part 871 and an upper base part 872 are coupled together is different in this embodiment. In this embodiment, a screw 878 is passed through a hole 876 in the upper base part 872 and screwed into the upper surfaces of a plurality of guide parts 873 and a plurality of upper base part bearings (not shown in this embodiment) of the base part 804 so that the lower base part 871 and the upper base part 872 are coupled together with the guide parts 873 and its upper base part bearings (see the seventh embodiment) sandwiched therebetween.

Also, the lower base part 871 and upper base part 872 are not provided with the pinch-holding parts 711 and 721 of the seventh embodiment and, instead, are provided with grooves 871A and 872A, which follow along the rotating body 801.

The rotating body 801 has a disc-shaped wheel part 805 and a tire 806 mounted on the outside circumference of the wheel part 805. The wheel part 805 has an annular contact part or surface 801A similar to the prior embodiments. The wheel part 805 has a groove 807 that follow along the groove 871A in the lower base part 871, and a groove 808 that follow along the groove 872A in the upper base part 872.

Several balls 813 are arranged between the grooves 871A and 807 and between the grooves 872A and 808, thus forming a structure similar to that of a thrust bearing.

Referring to FIG. 21, the vibrating body 802 comprises a reinforcing plate 821 that is generally rectangular in shape, and a pair of flat plate-shaped piezoelectric elements 822 that are provided on the front and back surfaces of the reinforcing plate 821. The reinforcing plate 821 has an abutting part 823 formed integrally on the reinforcing plate 821, and an arm part formed integrally on the long sides of the reinforcing plate 821 as in the seventh embodiment. The abutting part 823 preferably has a convexly curved free end that contacts the contact part 801A in the same way as in the seventh embodiment.

This embodiment provides the same effects as the seventh embodiment.

Ninth Embodiment

Figure 22:
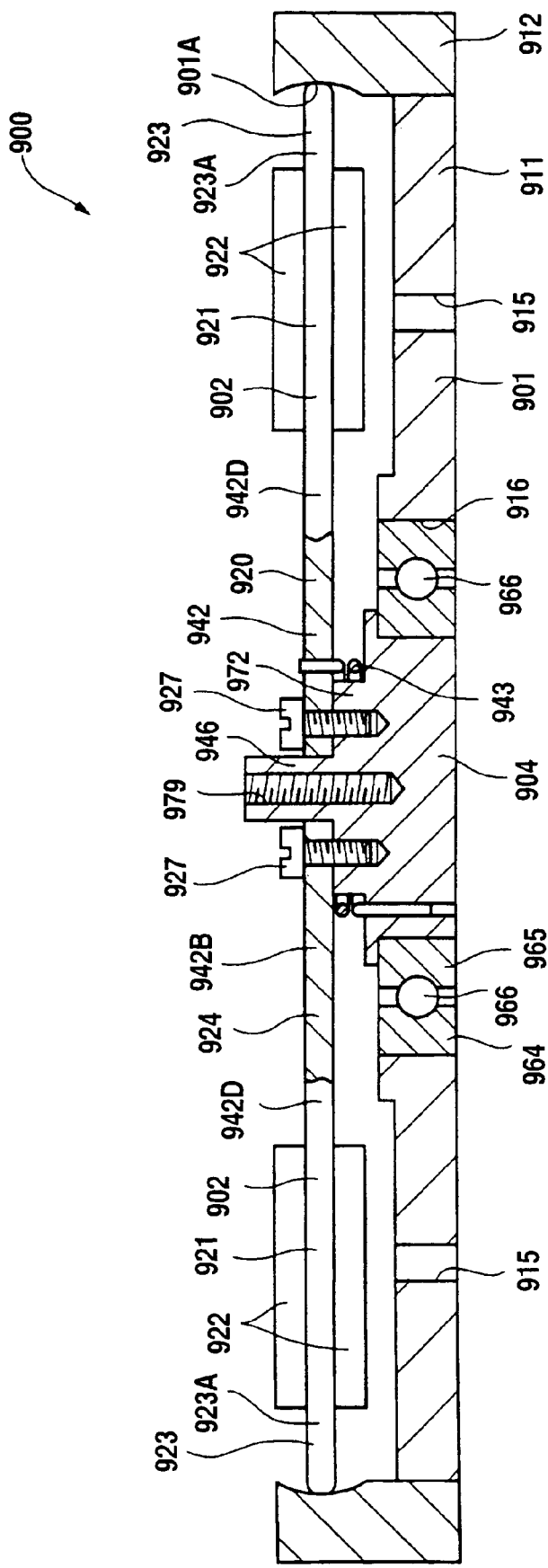
FIG. 22 is a cross sectional view of a rotary drive device in accordance with a ninth embodiment of the present invention.

A ninth embodiment of the present invention will now be described in reference to FIG. 22. FIG. 22 is a cross sectional view of a rotary drive device 900 in accordance with the ninth embodiment of the present invention. In the following description, such words as "upper," "above," "lower," and "below" refer to the respective directions of the rotary drive device 900 as it is shown in FIG. 22.

This rotary drive device 900 is built into, for example, a timepiece and delivers rotational motion for driving an indicator hand. The rotating body 901 has a toothed wheel on its outer circumference and forms a portion of a wheel train.

Similarly to the rotary drive device 200 of the second embodiment, the rotary drive device 900 of this embodiment has a base part 904, a ball bearing assembly 946, a rotating body 901, and a vibrating mechanism 920.

The base part 904 is disc-shaped and has an upwardly-protruding internally threaded part 979 formed at its center and an upwardly-protruding support part 972 formed around the circumference of the internally threaded part 979. The internally threaded part 979 is used for mounting the rotary drive device 900 to another device.

The ball bearing assembly 946 comprises a cylindrical outside bearing 964, a cylindrical inside journal 965 that is arranged on the inside of the bearing 964, and a plurality of balls 966 arranged between the bearing 964 and the journal 965. As a result, the journal 965 rotates freely with respect to the bearing 964 about the center axis of the bearing 964. The ball bearing assembly 946 is constructed similarly to the ball bearing assembly 246 of the second embodiment, but it is different in that the inside journal 965 is fitted around the outside circumference of the base part 904.

Similarly to the rotating body 201 of the second embodiment, the rotating body 901 of this embodiment has a main rotating body portion 911 and an annular part 912.

The main rotating body portion 911 does not have a supported part or an output shaft as in the second embodiment, but it does have a plurality of openings 915 and a passage hole 916 formed at its center. The shaft bearing 964 of the ball bearing assembly 946 is fitted into the passage hole 916 of the main rotating body portion 911 and thereby secured. As a result, the rotating body 901 is rotatably supported on the base part 904 through the ball bearing assembly 946.

The annular part 912 has a contact part 901A. This contact part 901A is formed on the upper part of the main rotating body portion 911.

The vibrating mechanism 920 is configured similarly to the vibration mechanism of the third embodiment, except that the structure of the rotating member is different. The vibrating mechanism 920 has three vibrating bodies 902, with each vibrating body 902 comprising a reinforcing plate 921 that is generally rectangular in shape, and a pair of flat plate-shaped piezoelectric elements 922 that are provided on the front and back surfaces of the reinforcing plate 921. The reinforcing plate 921 has an abutting part 923 formed integrally on the reinforcing plate 921, and an arm part 924 formed integrally on the long sides of the reinforcing plate 921 similar to the third embodiment. The arm part 924 includes a rotating member 942.

The rotating member 942 in this embodiment does not have a rotating member main body 242A like in the third embodiment. However, instead, the rotating member 942 in this embodiment only has a support part 942B. Consequently, the "other" end of the pressing force applying member 943 is stopped against the support part 942B of the rotating member 942.

The rotating member 942 has an oversized hole (not shown) formed along a circle that is concentric with the rotating member 901. Screws 927 are passed through the oversized hole and screwed into the upper surface of the support part 972.

With an arm part 924 thusly constituted, the pressing force applying member 943 can cause the abutting part 923 of the vibrating body 902 to rotate clockwise about rotational axis of the rotating body 901 and be pressed against the contact part 901A.

In addition to effects (1), (2), (5), (6), (7) and (10) of the first embodiment and effects (12) to (15) and (17) of the second embodiment, this embodiment also provides the following effect.

(29) The rotary drive device 900 can be used in floppy disc drives (FDDs), thin vibration motors, and other applications requiring a thin direct-drive motor.

Tenth Embodiment

Figure 23:
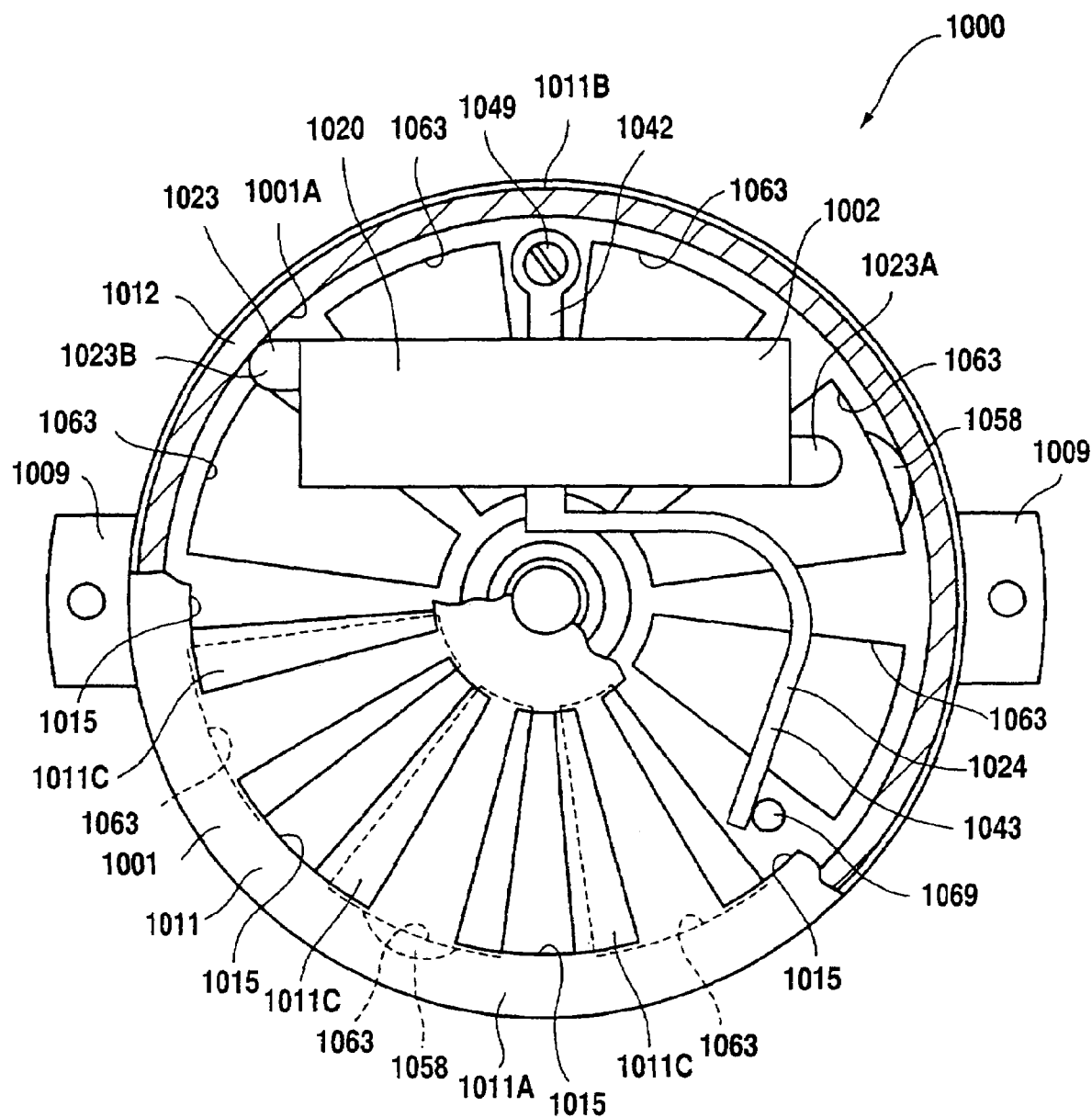
FIG. 23 is a top plan view of a rotary drive device in accordance with a tenth embodiment of the present invention.
Figure 24:
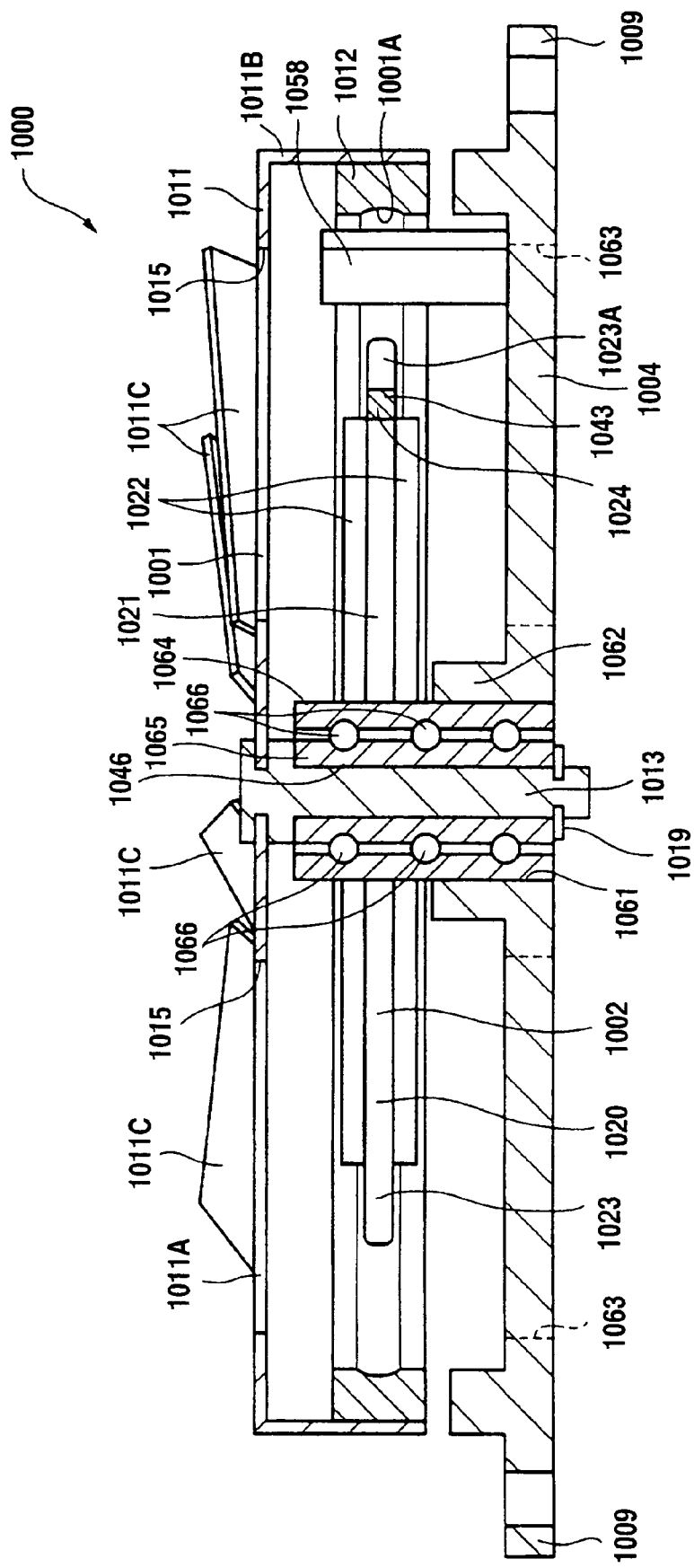
FIG. 24 is a cross sectional view of a rotary drive device in accordance with the tenth embodiment.

A tenth embodiment of the present invention will now be described in reference to FIGS. 23 and 24. FIG. 23 is a top plan view of a rotary drive device 1000 in accordance with the tenth embodiment of the present invention, while FIG. 24 is a cross sectional view of the rotary drive device 1000 shown in FIG. 23. In the following description, such words as "upper," "above," "lower," and "below" refer to the respective directions of the rotary drive device 1000 as it is shown in FIG. 24.

Similarly to the rotary drive device 200 of the second embodiment, this rotary drive device 1000 has a base part 1004, a ball bearing assembly 1046, a rotating body 1001, and a vibrating mechanism 1020. This rotary drive device 1000 is uses as an axial-flow fan in which the rotating body 1001 rotates and blows air. It is installed in, for example, a computer to cool the internal components of the computer.

The base part 1004 has a shaft hole 1061, a protruding part 1062, a plurality of openings 1063, two guide parts 1058 constructed similarly to the guide part of the sixth embodiment, and a pair of fixing parts 1009 for attaching the rotary drive device 1000 to another device. The guide parts 1058 are different from the guide part of the sixth embodiment in that they do not touch against the contact part 1001A, but rather, against the annular part 1012 of the rotating body 1001.

The two guide parts 1058 and the vibrating mechanism 1020 (discussed later) are arranged at equal intervals around the contact part 1001A of the rotating body 1001. More specifically, the vibrating body 1002 and the guide parts 1058 are arranged in positions corresponding to the vertices of an equilateral triangle.

The rotating body 1001 is constructed similarly to the rotating body 1001 of the second embodiment, except that the structure of the main rotating body portion 1011 is different.

In this embodiment, the main rotating body portion 1011 has a disc-shaped part 1011A and a collar part 1011B that extends from an outer circumferential portion of the disc-shaped part 1011A toward the base part 1004. The disc-shaped part 1011A of main rotating body portion 1011 does not have the output shaft of the second embodiment but it does have a plurality of openings 1015 and a supported part 1013. It also has fins 1011C that extend upward from the openings 1015. Thus, the rotating body 1001 comprises an axial-flow fan.

The supported part 1013 is inserted into the journal 1065 of the ball bearing assembly 1046 from above and its tip portion protrudes from the bottom of the journal 1065. A C-ring 1019 is fitted onto the tip portion of the supported part 1013 such that the rotating body 1001 is rotatably supported on the base part 1004.

With this kind of main rotating body portion 1011, the openings 1015 of the disc-shaped part 1011A, the fins 1011C, and the collar part 1011B are formed in an integral manner by deep drawing or press forming a thin piece of sheet metal. However, the forming method is not limited to deep drawing and press forming; it is also acceptable to use injection molding so that the supported part 1013 is also formed integrally. By doing so, the rotating body 1001 can be reduced in both weight and cost.

The annular part 1012 is provided along the internal surface of the collar part 1011B of the main rotating body portion 1011.

The vibrating mechanism 1020 is constructed similarly to the vibrating body mechanism 1020 of the sixth embodiment. The vibrating mechanism 1020 has a single vibrating body 1002 that comprises a reinforcing plate 1021 that is generally rectangular in shape, and a pair of flat plate-shaped piezoelectric elements 1022 that are provided on the front and back surfaces of the reinforcing plate 1021. The reinforcing plate 1021 has a pair of protrusions 1023A and 1023B with an abutting part 1023 formed integrally the protrusion 1023B of the reinforcing plate 1021, and an arm part 1024 formed integrally on the long sides of the reinforcing plate 1021 similar to the sixth embodiment. The arm part 1024 includes a rotating member 1042. The rotating member 1042 has a screw hole at one end and is rotatably supported on the base part 1004 by passing a screw 1049 through the screw hole and screwing it into a threaded part of the base part 1004. The other end of the rotating member 1042 supports the lengthwise middle section of the reinforcing plate 1021 of the vibrating body 1002. The pressing force applying member 1043 is generally L-shaped and arranged along the outside of the protruding part. One end is supported at the lengthwise middle section of the reinforcing plate 1021 of the vibrating body 1002 and the other end mates with a pin 1069 provided on the base part 1004.

The ball bearing assembly 1046 comprises a cylindrical outside bearing 1064, a cylindrical inside journal 1065 that is arranged on the inside of the bearing 1064, and a plurality of balls 1066 arranged between the bearing 1064 and the journal 1065. As a result, the journal 1065 rotates freely with respect to the bearing 1064 about the center axis of the bearing 1064.

In addition to effects (1), (2), (5), and (6) of the first embodiment, effects (12) and (15) to (17) of the second embodiment, and effect (23) of the sixth embodiment, this embodiment also provides the following effect.

(30) Since the rotating body 1001 is an axial-flow fan, air can be forcefully delivered and exhausted to and from the inside of the rotary drive device by rotating the rotating body 1001. As a result, the inside of the rotary drive device 1000 can be cooled and the temperature of the area surrounding the piezoelectric elements 1022 can be prevented from rising severely, thus allowing the rotary drive device 1000 to be driven in a stable manner.

More particularly, since openings 1063 are provided in the base part 1004, air can pass easily in and out through the openings 1063 and the rotary drive device can be driven in an even more stable manner.

Eleventh Embodiment

Figure 25:
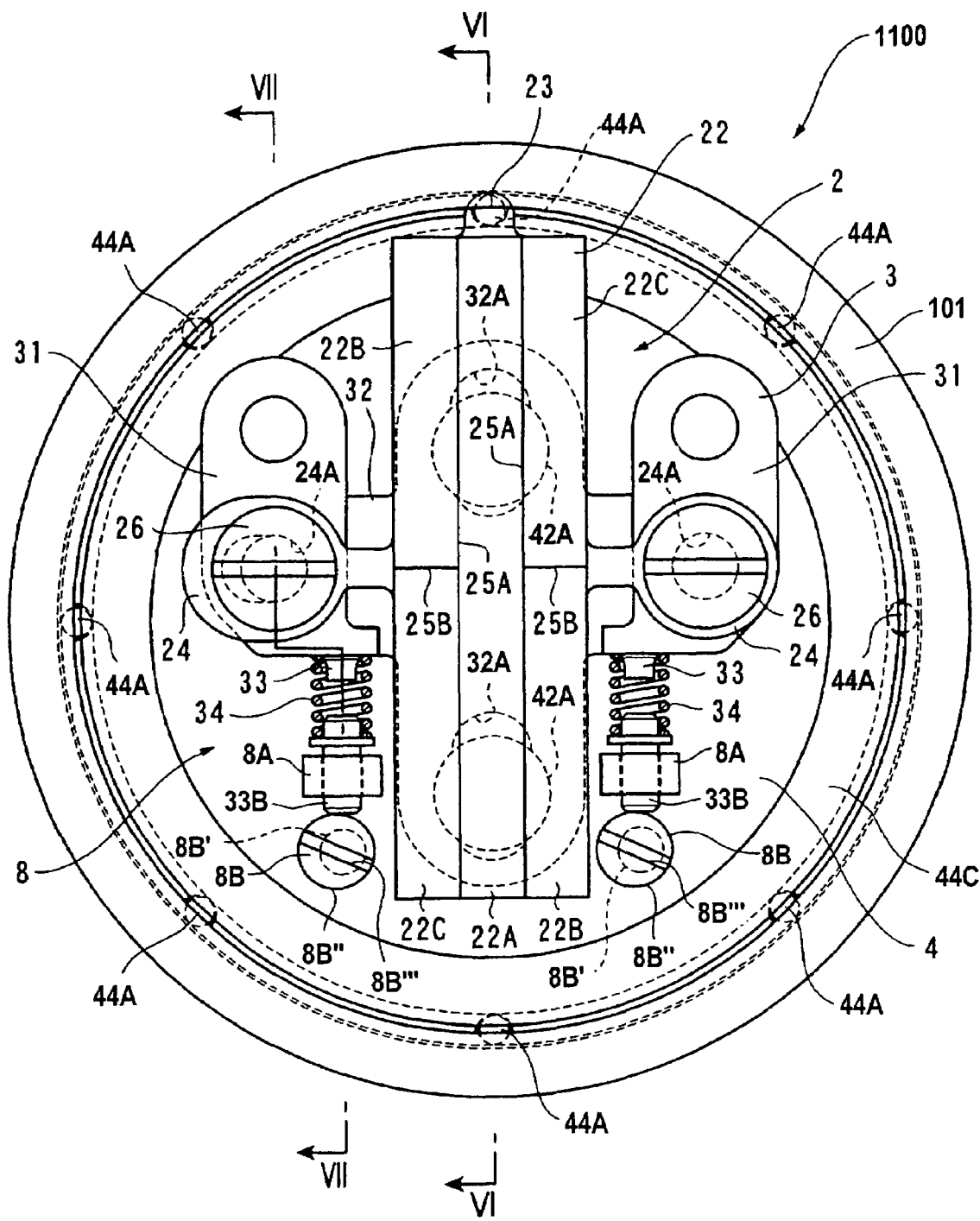
FIG. 25 is a top plan view of a rotary drive device in accordance with an eleventh embodiment of the present invention.
Figure 26:
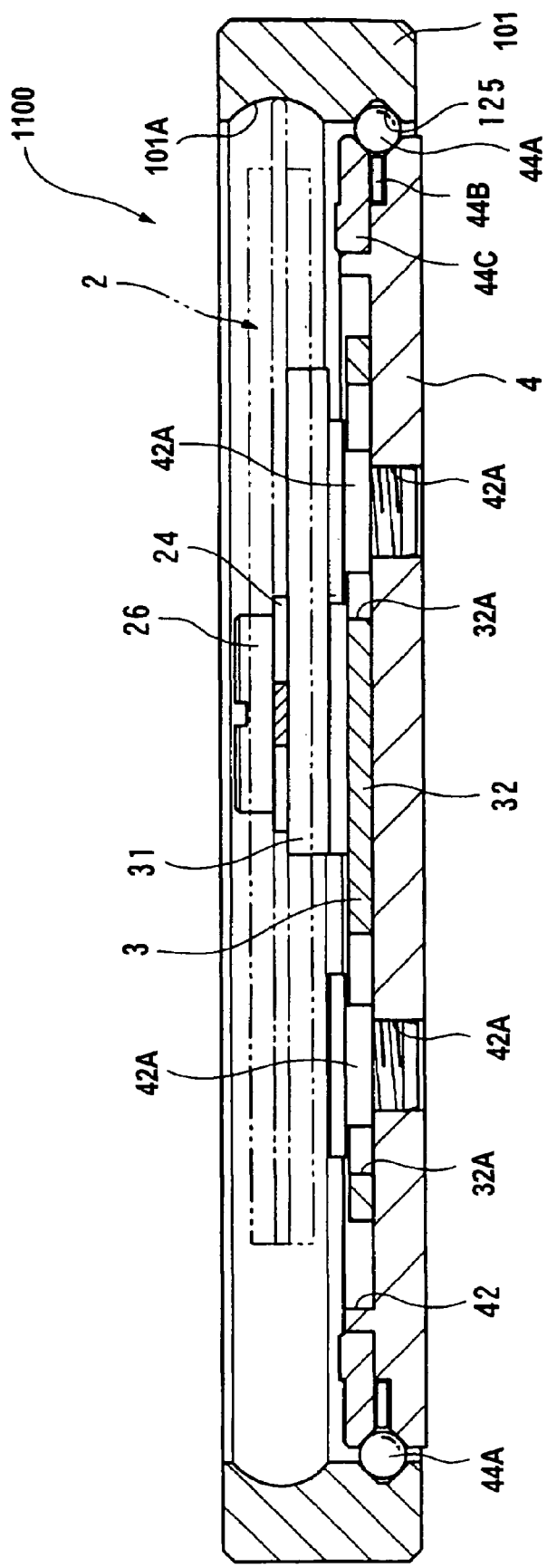
FIG. 26 is a cross sectional view of the rotary drive device taken along line VI-VI of FIG. 25 in accordance with an eleventh embodiment of the present invention.

An eleventh embodiment will now be described in reference to FIGS. 25, 26, and 27. FIG. 25 is a top plan view of a rotary drive device 1100 in accordance with the eleventh embodiment of the present invention. FIG. 26 is a cross sectional view of the rotary drive device 1100 taken along line VI-VI of FIG. 25, while FIG. 26 is a cross sectional view of the rotary drive device 1100 taken along line VII-VII of FIG. 25.

Figure 27:
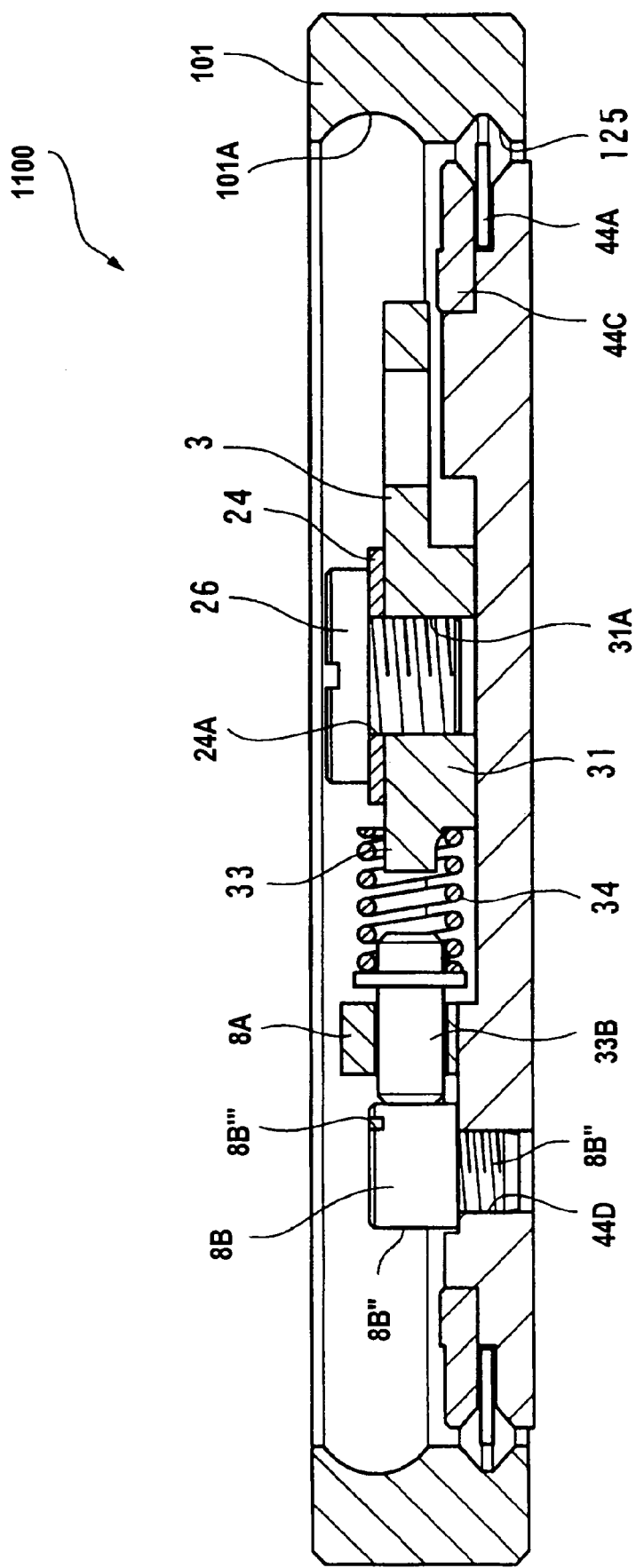
FIG. 27 is a cross sectional view of the rotary drive device taken along line VII-VII of FIG. 25 in accordance with an eleventh embodiment of the present invention.

As shown in FIGS. 25, 26 and 27, this rotary drive device 1100 is the same as the rotary drive device 1 of the first embodiment, but provided with a pressing force adjusting member 8. In view of the similarity between the first and eleventh embodiments, the parts of the eleventh embodiment that are identical or substantially identical in function to the parts of the first embodiment will be given the same reference numerals as the parts of the first embodiment. Moreover, the descriptions of the parts of the eleventh embodiment that are identical or substantially identical in function to the parts of the first embodiment may be omitted for the sake of brevity. The pressing force adjusting member 8 is configured and arranged to manually adjust the pressing force applied to the rotating body 101 by the vibrating body 2.

This rotary drive device 1100 is installed in, for example, a toy car with a rubber ring installed around the outer circumference of the rotating body 101 to serve as a tire.

The pressing force adjusting member 8 comprises two guide parts 8A that support the end parts of springs 34 in such a manner that the springs can elongate and contract and eccentric pins 8B that adjust the pressing force of the springs 34.

Each guide part 8A is fixed to the base part 4 and allows the abutting pin 33B to pass through the inner circumference thereof. The abutting pin 33B has one end of the spring 34 is secured thereto, and is supported in the guide part 8A such that it can slide in the direction in which the spring 34 elongates and contracts.

Each eccentric pin 8B comprises a turning shaft 8B' and a solid-cylindrical flange part 8B" that is eccentric with respect to the turning shaft. The turning shaft 8B' has external threads that mesh with the threaded part 44D of the base part 4 such that the eccentric pin 8B is turnably supported on the base part 4. The lateral surface of the flange part 8B" touches against the tip end of the abutting pin 33B of the spring 34. The top surface of the flange part 8B" is provided with a recessed operating groove 8B'" into which a screwdriver or the like can be inserted.

Thus, one end of each spring 34 abuts against the support body 3 and the other end of each spring 34 is secured to the abutting pin 33B, which abuts against the lateral surface of the flange part 8B". The springs 34 push the support body 3 toward the rotating body 101, and thus, the abutting part 23 of the vibrating body 2 is pressed against the rotating body 101 with an appropriate pressing force. In short, the pressing force adjusting member 8 functions as an "abutting force" adjusting means that adjusts the pressing force with which the vibrating body 2 abuts against the rotating body 101.

The base part 4 is not provided with a substrate similar to that of the first embodiment. Instead, the electrodes 22A, 22B and 22C and the reinforcing plate 21 of the vibrating body 2 are each provided with a lead wire connected to a driving device (not shown) provided on the opposite side of the base part 4 as the vibrating body 2.

The plurality of balls 44A arranged at equal intervals around the inner circumference of the rotating body 101 are housed in a groove 125 formed in the inner circumference of the rotating body 101 by being pinched between the groove 125, a slanted portion formed on the outer circumference of the base part 4, and a slanted portion formed on an annular pressing plate 44C that is fixed to the base part 4. The annular ball holding part 44B is disposed between the base part 4 and the pressing plate 44C. Generally semicircular notches equal in number to the balls 44A are formed in the outer circumference of the ball holding part 44B. The balls 44A are arranged in these notches and thereby held at a prescribed spacing around the outer circumference of the base part 4.

This rotary drive device 1100 operates as follows. An AC voltage is applied to the piezoelectric elements 22 of the vibrating body 2 by the driving device and the vibrating body 2 vibrates. When the voltage is applied only to electrodes 22A and 22C, the vibrating body 2 undergoes longitudinal vibration and bending vibration simultaneously and vibrates along a generally elliptical path. The abutting part 23 presses against the contact part 101A of the rotating body 101 as it moves through a portion of the elliptical path and the friction force it applies against the rotating body 101 intermittently causes the rotating body 101 to rotate in the circumferential direction. By repeating this action at a prescribed frequency, the rotating body 101 can be rotated at a prescribed rotational speed in a single direction.

The rotational speed of the rotating body 101 is changed by operating the pressing force adjusting member 8. For example, in order to reduce the rotational speed of the rotating body 101, a screwdriver or the like is mated with the operating grooves 8B''' of the eccentric pins 8B and the eccentric pins 8B are turned such that the springs 34 become longer. More specifically, by turning the eccentric pins 8B to a position where the distance from the turning shaft 8B' to the lateral surface of the flange part 8B'' is shorter, the abutting pins 33B, which follow said lateral surface, move in such a manner that the springs 34 elongate and the force with which the springs 34 press against the support body 3 is relaxed. This pressing force is transmitted to the vibrating body 2 through the support body 3 and the force with which the abutting part 23 of the vibrating body 2 presses against the rotating body 101 decreases. As a result, the portion of the elliptical path along which the abutting part 23 can contact the rotating body 101 and drive the rotating body 101 with a friction force is shortened and the rotational torque transmitted is reduced, thus decreasing the rotational speed of the rotating body 101.

Conversely, in order to increase the rotational speed of the rotating body 101, the eccentric pins 8B are turned such that the springs 34 are compressed. When this is done, the force with which the abutting part 23 presses against the rotating body 101 increases, the transmitted rotational torque increases, and the rotational speed of the rotating body 101 increases.

When the rotating body 101 is to be rotated in the opposite direction, the electrodes of the piezoelectric elements 22 to which the voltage is applied are switched in a linearly symmetrical manner with respect to the longitudinal centerline of the vibrating body 2. In other words, a voltage of a prescribed frequency is applied to the electrodes 22A and 22B of the piezoelectric elements 22 and the abutting part 23 is made to vibrate through an elliptical path oriented in the opposite direction. As a result, the rotating body 101 is driven so as to rotate in the opposite direction.

In addition to effects (1) to (6) and (9) to (11) of the first embodiment, the eleventh embodiment also provides the following effects.

(31) Since the rotary drive device 1101 is provided with a pressing force adjusting member 8, the motion speed of the rotating body 101 can be adjusted easily by adjusting the force with which the vibrating body 2 presses against the rotating body 101. Since the vibrating body 2 abuts against the rotating body 101 continuously at a prescribed frequency, the unstable vibrational state associated with energizing and stopping the vibrating body 2 can be eliminated. Thus the vibrating body 2 can always maintain stable contact with the rotating body 101 and declining of the rotational torque (drive force) can be prevented.

(32) Since the pressing force adjusting member is provided with the guide parts 8A and the eccentric pins 8B, the pressing force can be adjusted easily by simply twisting the operating grooves 8B''' and thereby turning the eccentric pins 8B. Also, the pressing force can be adjusted in a stepless manner by adjusting the turning angle of the eccentric pins 8B because the flange parts 8B'' are formed in a cylindrical shape. Thus, if scales were drawn on the base part 4 around the perimeters of the eccentric pins 8B, the desired pressing force could be obtained at any time. Additionally, the rate at which the pressing force changes with respect to the turning angle of the eccentric pins 8B can be established by appropriately selecting the shape, i.e., in this embodiment, the radius of the cylindrical shape, of the lateral surface of the flange part 8B''. In this way, fine tuning of the pressing force can be accomplished with ease.

Furthermore, since the pressing force can be adjusted by hand by manually turning the eccentric pins 8B, the pressing force adjusting member 8 constructed with a simple structure. As a result, the rotary drive device 1101 is easy to maintain and can be manufactured inexpensively.

(33) Since the abutting part 23 of the vibrating body 2 abuts against the inner circumference of the rotating body 101, the vibrating body 2 can be housed on the inside of the rotating body 101. This helps promote size reduction of the rotary drive device 1100.

(34) Since there are two springs 34 and two eccentric pins 8B (i.e., two pressing force adjusting member 8 provided with respect to one vibrating body 2, the load placed on each spring 34 and each eccentric pin 8B can be reduced and the durability of these members can be improved. Since the spring force required from each spring 34 is smaller, springs whose spring force changes at a smaller rate can be selected to facility fine tuning of the pressing force.

Twelfth Embodiment

Figure 28:
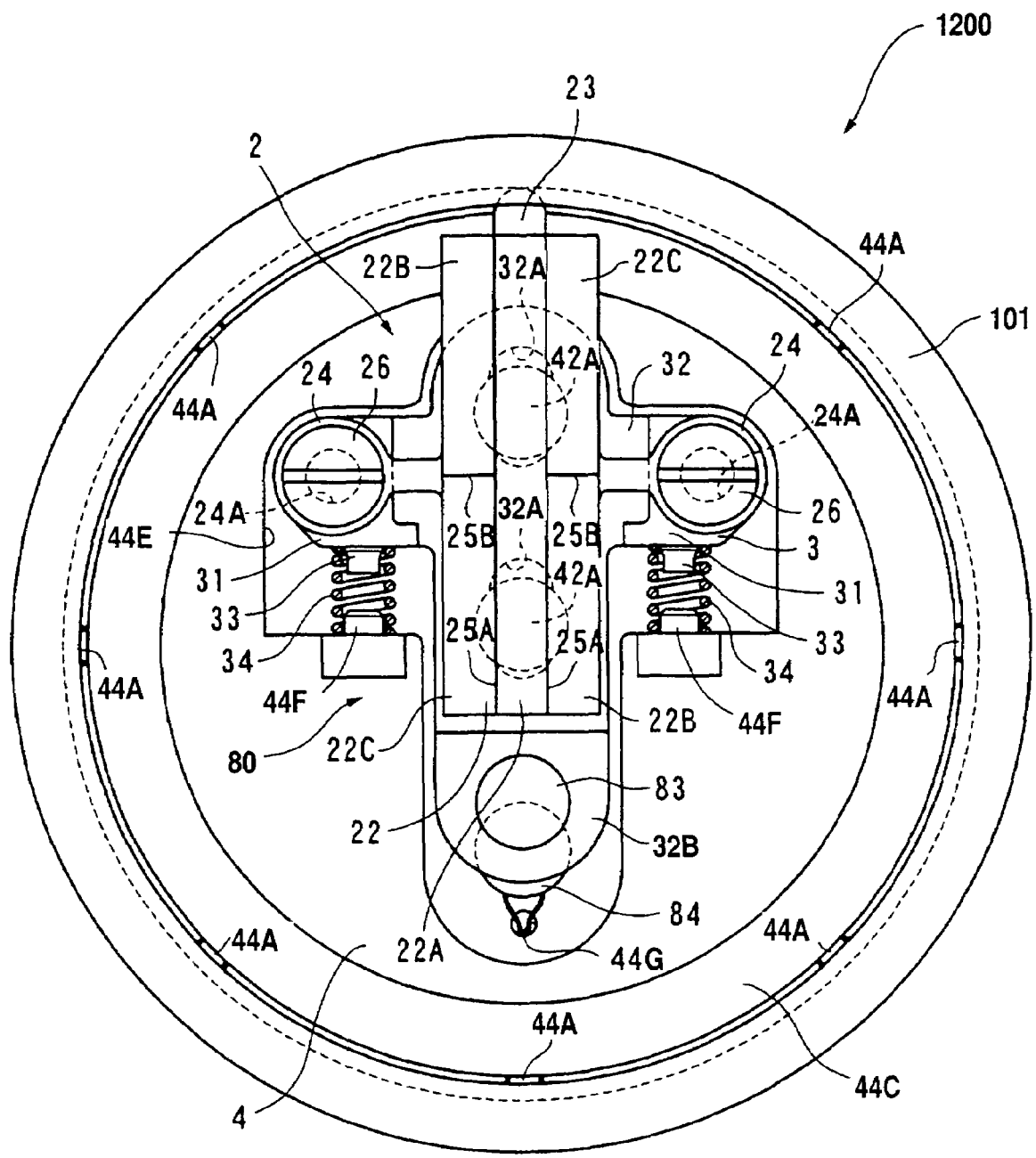
FIG. 28 is a top plan view of a rotary drive device in accordance with a twelfth embodiment of the present invention.
Figure 29:
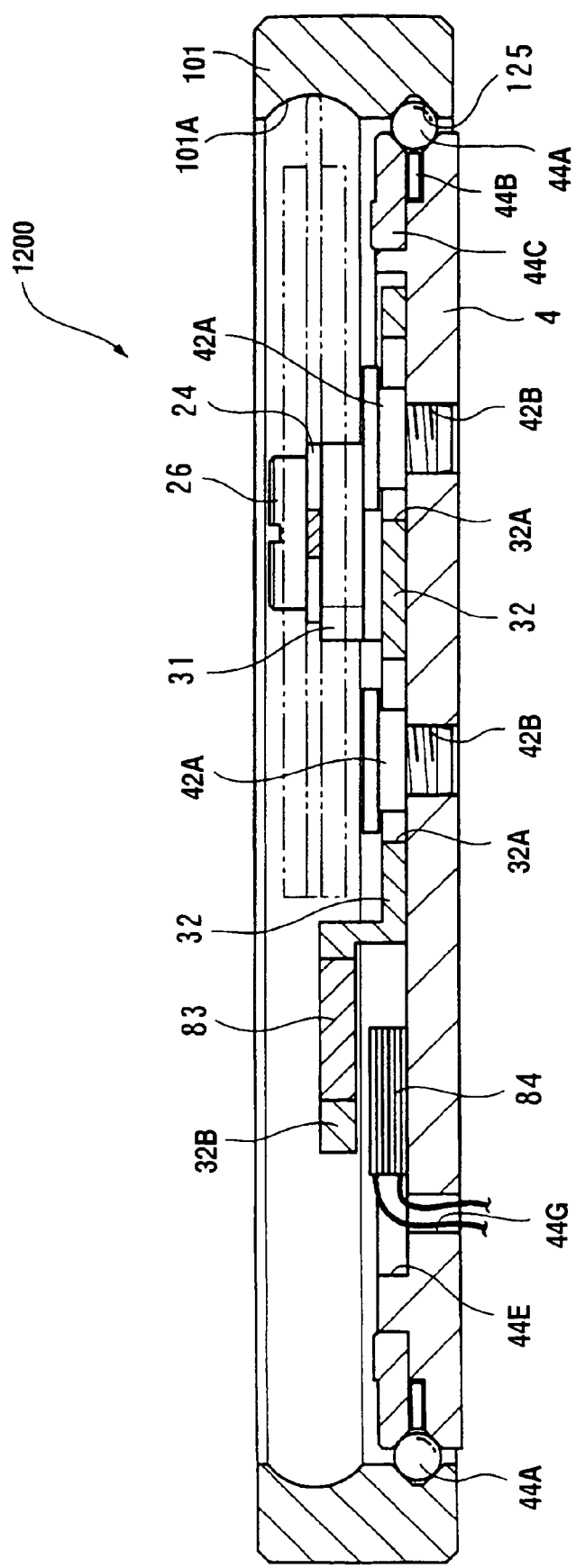
FIG. 29 is a cross sectional view of a rotary drive device in accordance with the twelfth embodiment.

A twelfth embodiment of the present invention will now be described in reference to FIG. 28 and FIG. 29. FIG. 28 is a top plan view of a rotary drive device 1200 in accordance with the twelfth embodiment of the present invention, while FIG. 29 is a cross sectional view of the rotary drive device 1200 shown in FIG. 28. The rotary drive device 1200 shown in FIGS. 28 and 29 has a different pressing force adjusting member 80 than the eleventh embodiment. In other words, this rotary drive device 1200 is the same as the rotary drive device 1100 of the eleventh embodiment, except for the pressing force adjusting member 80. In view of the similarity between the eleventh and twelfth embodiments, the parts of the twelfth embodiment that are identical or substantially identical in function to the parts of the eleventh embodiment will be given the same reference numerals as the parts of the eleventh embodiment. Moreover, the descriptions of the parts of the twelfth embodiment that are identical or substantially identical in function to the parts of the eleventh embodiment may be omitted for the sake of brevity.

This rotary drive device 1200 is, for example, made into a cooling fan by attaching a fan to the rotating body 101 and used to cool components of a computer that become hot.

A recessed part 44E is formed in the base part 4 so as to generally follow the contour of the support body 3. The one end of each spring 34 is fixed to a spring mounting part 44F that is provided so as to protrude from the recessed part 44E. The springs 34 push the support body 3 toward the rotating body 101 with a preset spring force.

The pressing force adjusting member 80 is provided with a magnet 83 that is fixed to the support body 3 and a coil 84 that is fixed to the base part 4. A magnet mounting part 32B is formed integrally in the support body 3 at the end thereof that is far from the abutting part 23 of the vibrating body 2. The magnet mounting part 32B has a prescribed spacing with respect to the base part 4 and a surface that is parallel to the base part 4. The magnet 83 is fitted into the surface of the magnet mounting part 32B that faces the base part 4.

The coil 84 is formed by winding a conductive wire into a cylindrical form and its center axis is perpendicular to the surface of the magnet mounting part 32B. It is fixed in a position generally facing the magnet 83. The magnet 83 and coil 84 are aligned along the direction in which the vibrating body 2 approaches toward and retracts from the rotating body 101 and the magnet 83 is positioned closer to the abutting part 23 than is the coil 84. On the opposite side of a hole 44G provided in the base part 4, the ends of the conductive wire of the coil 84 are connected to a current generating device (not shown) that delivers current to the coil 84.

With this rotary drive device 1200, the rotating body 101 rotates when a repetitive voltage is applied to the piezoelectric elements 22 and the vibrating body 2 vibrates. The abutting part 23 of the vibrating body 2 is pressed against the rotating body 101 by the pressing force of the springs 34. In order to adjust the force with which the abutting part 23 presses against the rotating body 101, the current generating device is turned ON and current is fed to the coil 84. A magnetic field is generated in the coil 84 and this magnetic field pulls the magnet 83 such that the support body 3 moves away from the rotating body 101 against the force of the springs 34. As a result, the force with which the abutting part 23 presses against the rotating body 101 relaxes and the rotational speed of the rotating body 101 decreases.

In addition to effects (1) to (6) and (9) to (11) of the first embodiment and effects (31) and (33) of the eleventh embodiment, the twelfth embodiment also provides the following effect.

(35) Since the pressing force adjusting member 80 is provide with the magnet 83 and the coil 84, the pressing force can be adjusted easily by passing a current through the coil 84. Since the pressing force can be adjusted in an automated manner even when the rotating body 101 is rotating, the rotational speed of the rotating body 101 can be changed while it is rotating. Consequently, the rotational speed of the rotary drive device 1200 can be adjusted in a flexible manner and the applicability of the rotary drive device 1200 can be broadened.

Additionally, since the pressing force adjusting member 80 comprises a magnet 83 and a coil 84, there is no sliding contact between the components when the pressing force is adjusted. As a result, part wear is reduced and the durability of the rotary drive device 1200 can be improved.

Thirteenth Embodiment

Figure 30:
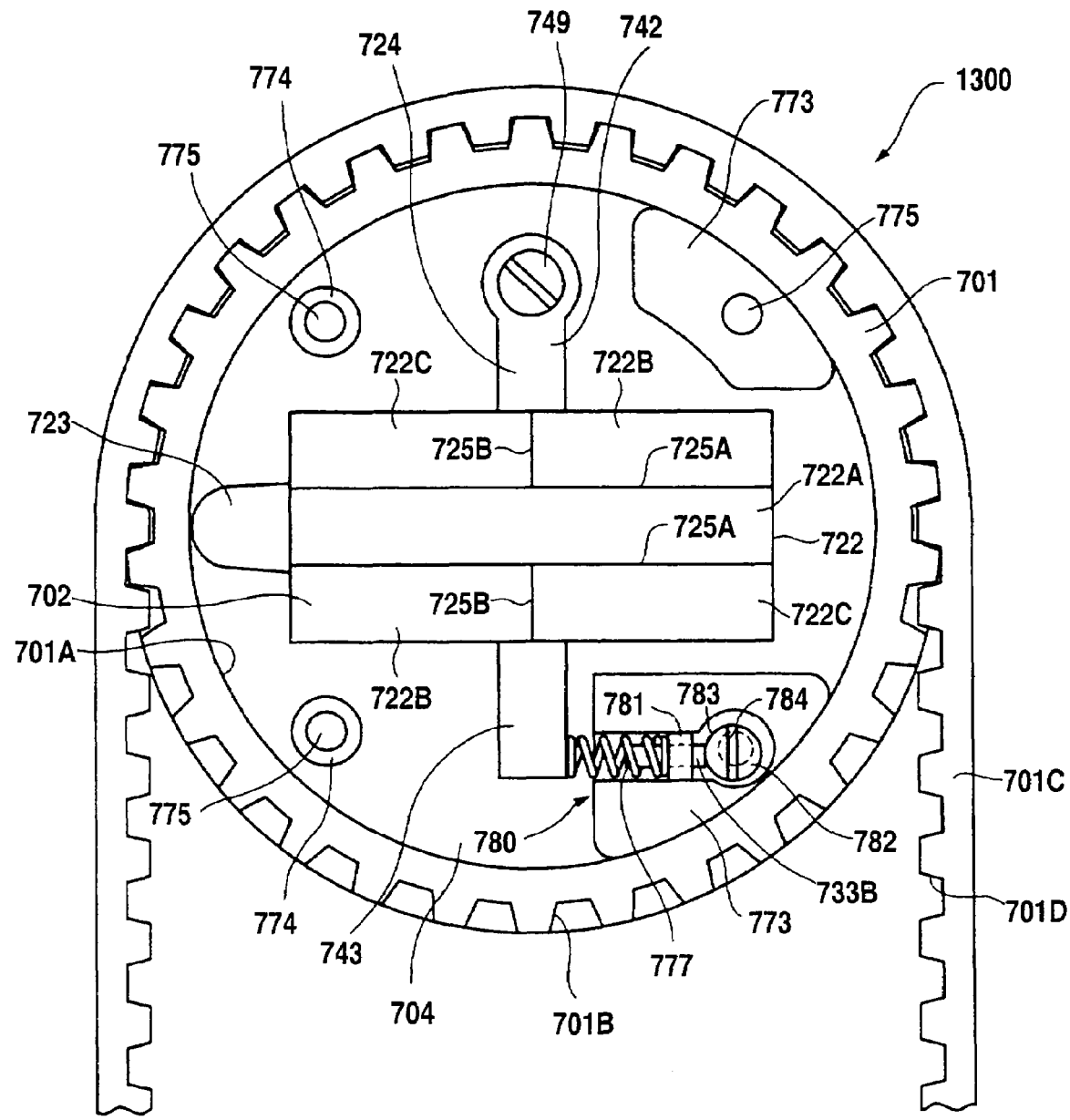
FIG. 30 is a top plan view of a rotary drive device in accordance with a thirteenth embodiment of the present invention.
Figure 31:
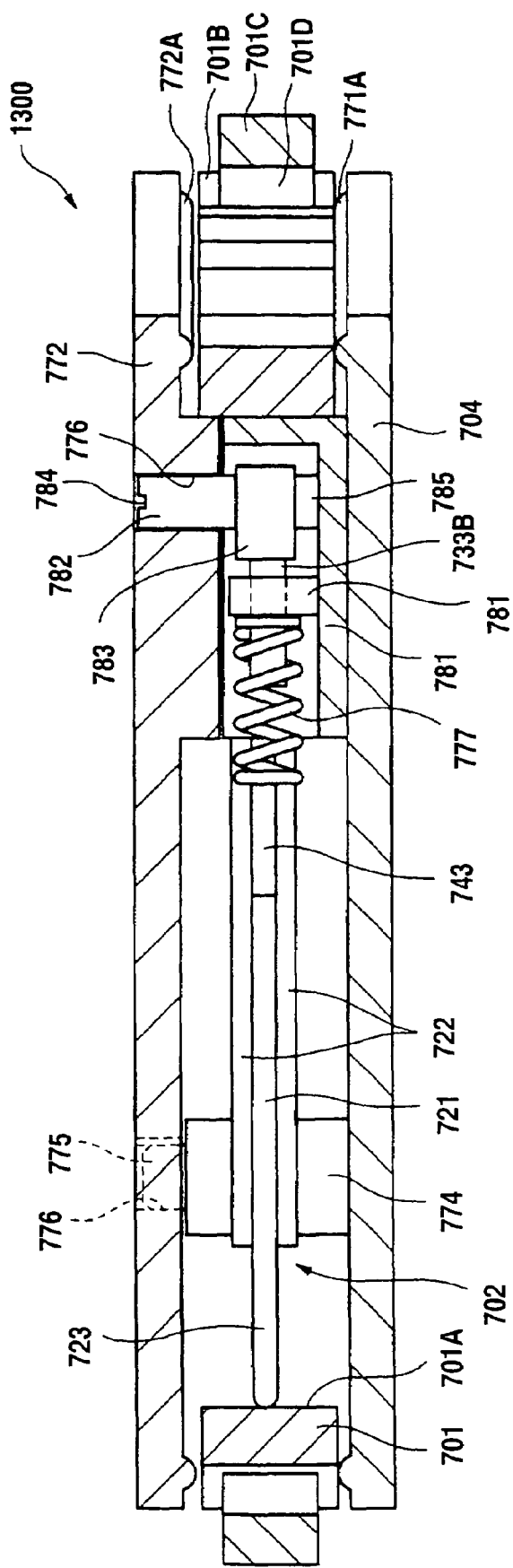
FIG. 31 is a cross sectional view of a rotary drive device in accordance with the thirteenth embodiment.

A thirteenth embodiment of the present invention will now be described in reference to FIGS. 30 and 31. FIG. 30 is a top plan view of a rotary drive device 1300 in accordance with the thirteenth embodiment of the present invention, while FIG. 31 is a cross sectional view of the rotary drive device 1300 shown in FIG. 30. The thirteenth embodiment is the same as the rotary drive device 700 of the seventh embodiment, except for a pressing force adjusting member 780. In view of the similarity between the seventh and thirteenth embodiments, the parts of the thirteenth embodiment that are identical or substantially identical in function to the parts of the seventh embodiment will be given the same reference numerals as the parts of the seventh embodiment. Moreover, the descriptions of the parts of the thirteenth embodiment that are identical or substantially identical in function to the parts of the seventh embodiment may be omitted for the sake of brevity.

Similarly to the seventh embodiment, this rotary drive device 1300 is used, for example, as the drive unit for an electric-powered bicycle.

In FIGS. 30 and 31, the piezoelectric elements 722 on the front and back surfaces of the vibrating body 702 are provided with five electrodes 722A, 722B, 722C with grooves 725A and 72B in the same manner as in the first embodiment. The rotating member 742 that comprises one end of the arm part 724 is secured to the base part 704 with the screw 749, and the pressing force applying member 743 that comprises the other end.

The pressing force adjusting member 780 basically includes a guide part 781 and an eccentric pin 782 with a flange part 783 and a recessed operating groove 784. The pressing force adjusting member 780 adjusts the pressing force of the spring 777 against the pressing force applying member 743. In particular, the pressing force applying member 743 has one end of the spring 777 fixed thereto. The other end of the spring 777 is fixed to the abutting pin 733B. The tip end of the abutting pin 733B abuts against the lateral surface of the flange part 783 of the eccentric pin 82. The one end of the turning shaft 785 of the eccentric pin 782 is rotatably supported in the base part 704 and the other end passes through a hole 776 provided in the upper base part 772 so that the tip part is exposed to the outside of the upper base part 772. The recessed operating groove 784 is formed in the tip part of the turning shaft 785 and can be operated from the outside of the upper base part 772. Here, the fit between the hole 776 and the turning shaft 785 is designed to secure sufficient frictional force that the eccentric pin 782 does not turn due to the spring force of the spring 777 or the vibration of the rotary drive device 1300. It is also acceptable to provide the hole 776 and the turning shaft 785 with screw threads and screw them together.

The base part 704 is different from the seventh embodiment in that it is not provided with the openings 715 and 763.

With this rotary drive device 1300, the rotating body 701 rotates while in sliding contact with the guide part 773 when a repetitive voltage is applied to the vibrating body 702. The teeth 701D of the belt 701C mesh with the teeth 701B of the rotating body 701 and the rotation of the rotating body causes the belt 701C to move. In order to change the rotational speed of the rotating body 701, i.e., change the moving speed of the belt 703, a screwdriver or the like is mated with the operating groove 784 from the outside of the upper base part 772 and used to turn the eccentric pin 782. The pressing force of the spring 777 changes and the vibrating body 702 swings about the screw 749 so as to move closer toward or farther from the rotating body 701. As a result, the force with which the vibrating body 702 presses against the rotating body 701 changes and the rotating speed of the rotating body 701 changes.

The thirteenth embodiment also combines the following effects: effects (1), (2), (5), (7), (9), (10), and (11) of the first embodiment, effect (17) of the second embodiment, effects

(26) to (28) of the seventh embodiment, and effects (31) and (34) of the eleventh embodiment.

Fourteenth Embodiment

Figure 32:
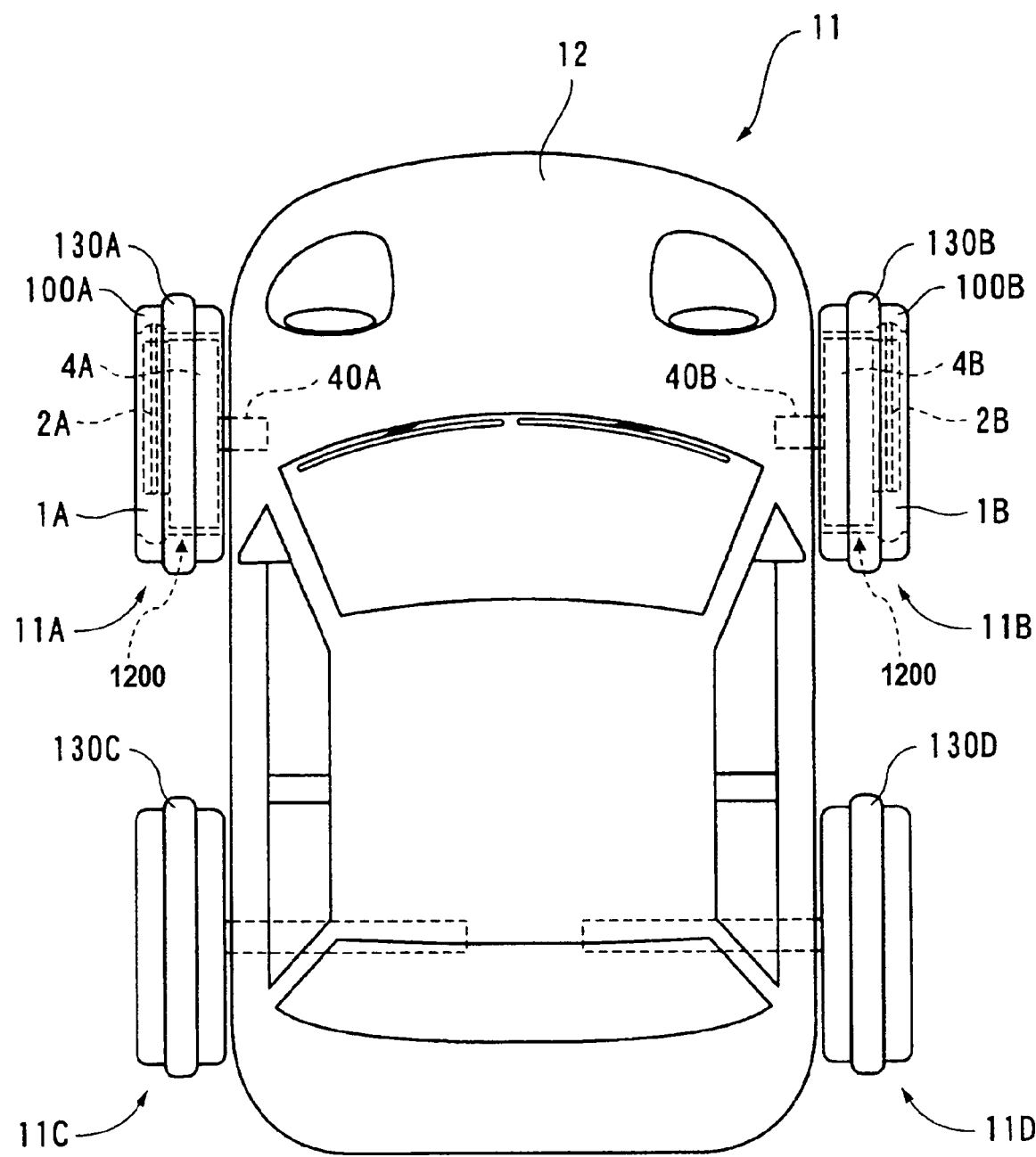
FIG. 32 is a top plan view of a car utilizing a rotary drive device in accordance with a fourteenth embodiment of the present invention.
Figure 33:
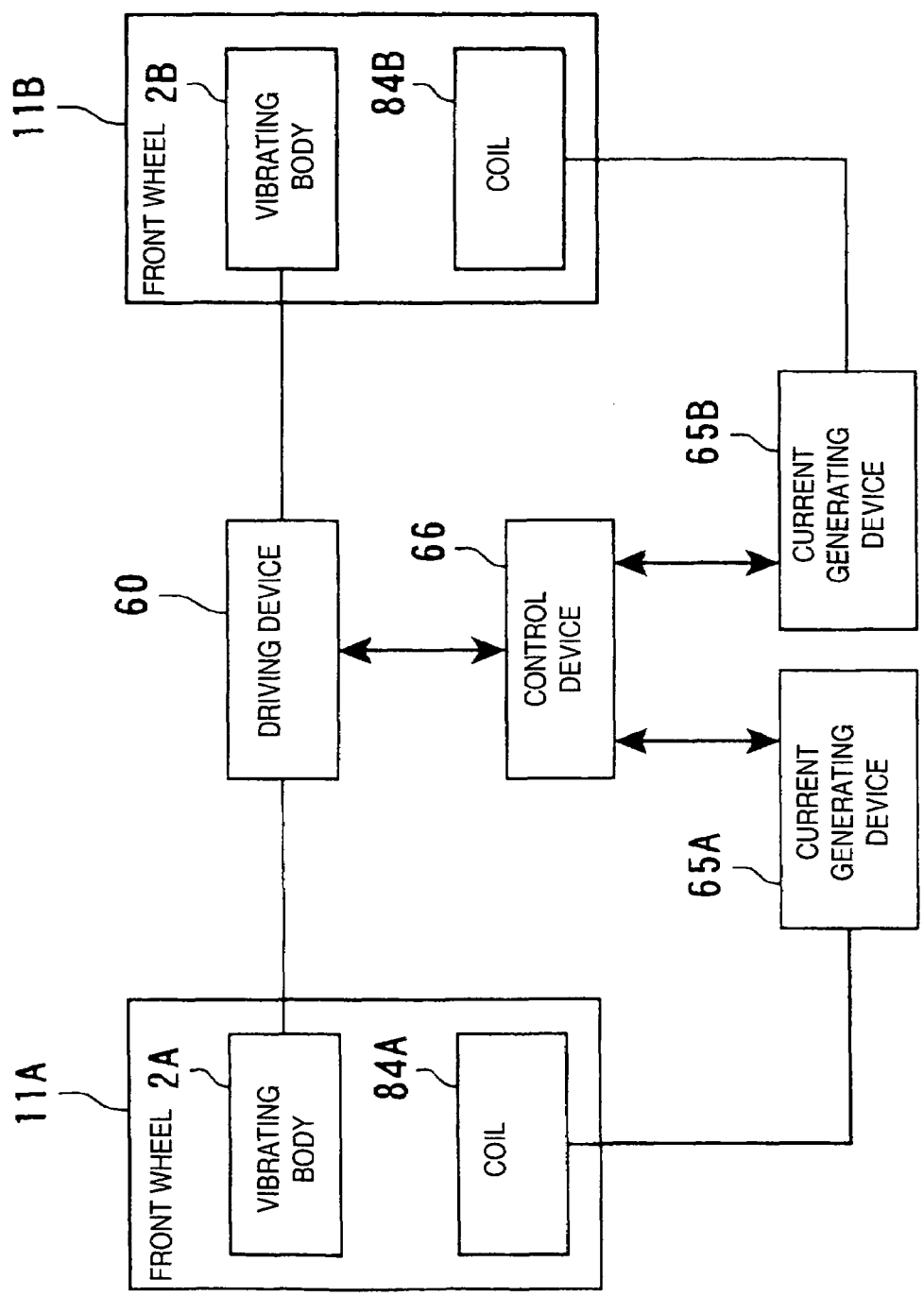
FIG. 33 is a block diagram of a car utilizing a rotary drive device in accordance with the fourteenth embodiment.

A fourteenth embodiment of the present invention will now be described in reference to FIGS. 32 and 33. FIG. 32 is an overall view of a car (device) 11 in accordance with the fourteenth embodiment of the present invention, while FIG. 33 is a block diagram of selected components of the car 11. The fourteenth embodiment preferably applies the previously described rotary drive device 1200 in accordance with the present invention to a toy car.

In FIG. 32, the car 11 is provided with a pair of front wheels 11A and 11B, and a pair of rear wheels 11C and 11D that are attached to a car body 12. The front wheels 11A and 11B are each provided with a rotary drive device 1A and 1B, respectively, in accordance with the twelfth embodiment. The front wheels 1A and 11B are secured to the car body 12 by axles 40A and 40B, respectively that are provided at the centers of the base parts 4A and 4B. Rubber rings 130A and 130B are fitted in grooves formed around the outer circumference of the rotating bodies 100A and 100B and serve as tires that increase the frictional force between the wheels and the ground surface. Meanwhile, the rear wheels 11C and 11D comprises disc-shaped members having rubber rings 130C and 130D fitted around the outer circumference thereof and are rotatably supported on the car body 12.

Lead wires connected to the electrodes of the vibrating bodies 2A and 2B of the front wheels 11A and 11B are passed through holes (not shown) formed through the centers of the axles 40A and 40B. As shown in FIG. 33, the lead wires are connected to a common driving device 60 mounted to the car body 12. Also, the coils 84A and 84B (see FIG. 28) pass through the axles 40A and 40B and connect current generating devices 65A and 65B of the car body 12. The driving device 60 and the current generating devices 65A and 65B are electrically connected to a control device 66 that controls the operation of the car 11.

This car 11 operates as follows. The control device 66 sends a travel signal to the driving device 60, and then the driving device 60 applies a voltage to the vibrating bodies 2A and 2B simultaneously. The vibrating bodies 2A and 2B drive the rotating bodies 100A and 100B at the same rotational speed in the forward direction of the car 11 and the car 11 moves forward. When a low-speed travel signal is issued from the control device 66, the current generating devices 65A and 65B receive the signal to turn ON, and deliver current to the coils 84A and 84B. As a result, the force with which the vibrating bodies 2A and 2B press against the rotating bodies 100A and 100B is adjusted and the traveling speed decreases.

When a right turn signal is issued from the control device 66, the current generating device 65A turns OFF and the current generating device 65B turns ON. More specifically, the pressing force for the front wheel 11B only is adjusted such that the rotational speed of the right wheel 11B is slower than the rotational speed of the left wheel 11A. As a result, the car 11 turns to the right. Meanwhile, in order to turn left, the current generating device 65A turns ON and the current generating device 65B turns OFF. As a result, the left front wheel 11A rotates more slowly and the car 11 turns to the left.

When a reverse signal is issued from the control device 66, the driving device 60 changes which electrodes of the vibrating bodies 2A and 2B it energizes and the vibrating bodies 2A and 2B vibrate in the opposite direction. As a result, the rotating bodies 100A and 100B rotate in the opposite direction and the car 11 moves backward. Low-speed travel, right turn, and left turn can also be executed during reverse travel by issuing signals from the control device 66.

The fourteenth embodiment uses the rotary drive device 1200 from the twelfth embodiment, and therefore, provides effects that are similar to the effects of the twelfth embodiment. Since the rotary drive device 1200 uses a vibrating body having a piezoelectric element, the rotary drive device 1200 can be made with a thin profile and can be mounted on such small components as a wheel of the car 11. Since the car body 12 is provided with the control device 66 that controls the operation of the driving device 60 and the current generating devices 65, the car 11 can be operated in an automated manner by controlling timing at which voltage is applied to the vibrating bodies 2A and 2B and controlling the current value of the current delivered to the coils 84A and 84B. Remote control can also be accomplished by using a remote controller to issue commands wirelessly to the control device 66.

Fifteenth Embodiment

Figure 34:
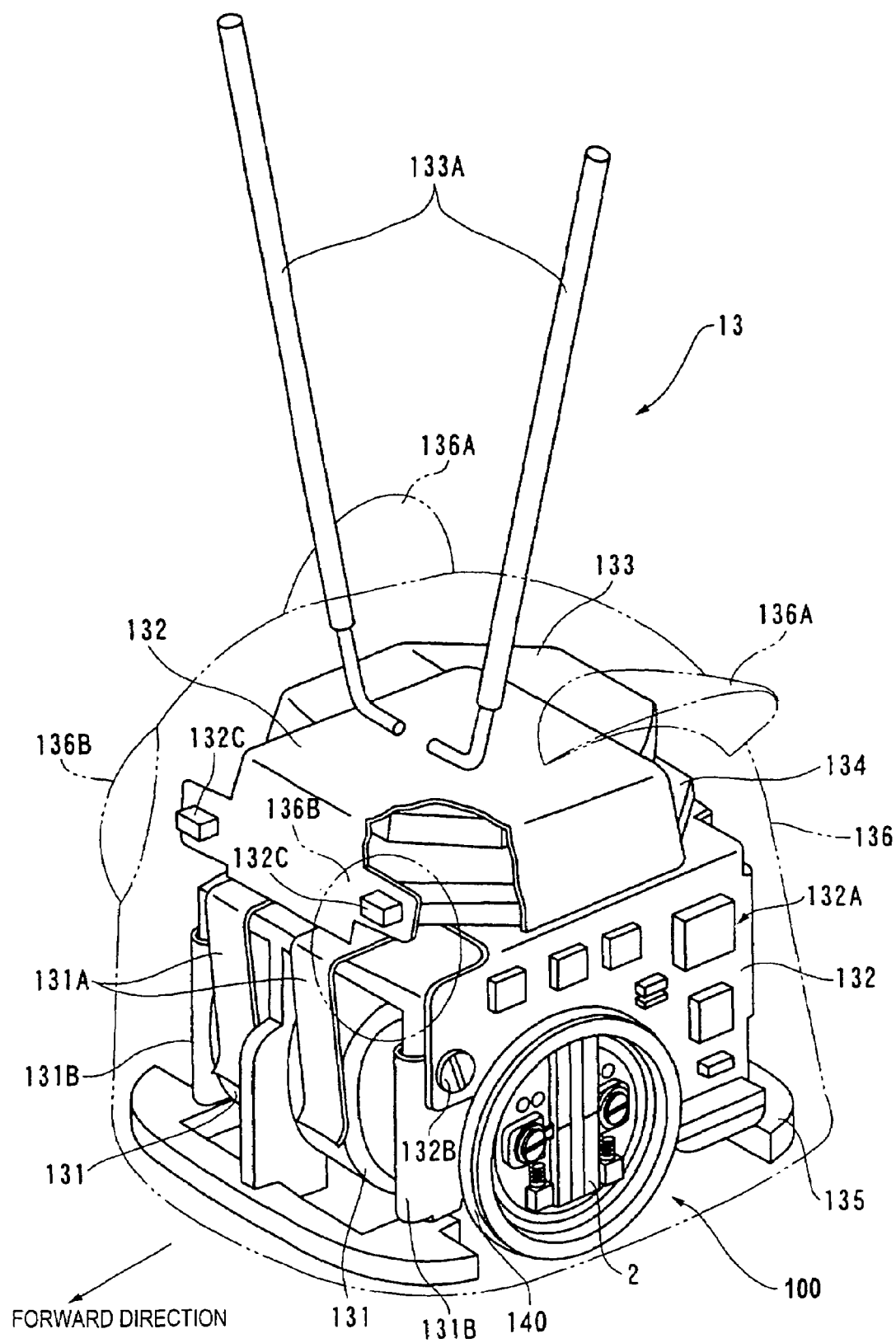
FIG. 34 is a perspective view of a robot utilizing a rotary drive device in accordance with the fifteenth embodiment of the present invention.

A fifteenth embodiment will now be described in reference to FIG. 34 and FIG. 35. The fifteenth embodiment applies the rotary drive device 100 in accordance with the present invention to a robot used as a toy or amusement device. FIG. 34 is an overall perspective view of a robot (device) 13 in accordance with the fifteenth embodiment, while FIG. 35 is a block diagram of selected components of the robot 13.

Figure 35:
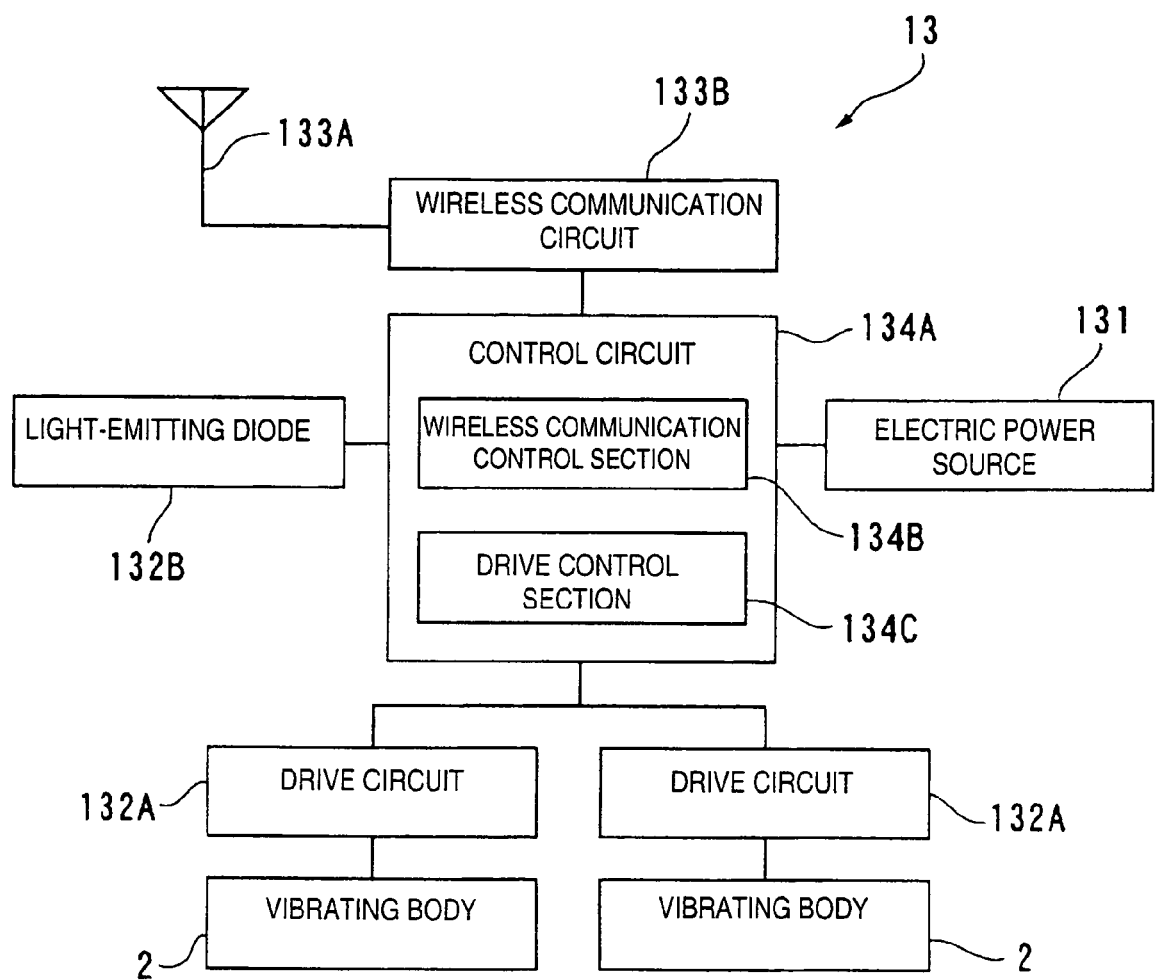
FIG. 35 is a block diagram of a car utilizing a rotary drive device in accordance with the fifteenth embodiment.

In FIGS. 34 and 35, the robot 13 has the following: an electric power source 131; the rotary drive devices 100 that are driven by electric power from the electric power source 131; a drive circuit board 132 on which a drive circuit 132A for driving the rotary drive devices 100 is mounted; a wireless communication circuit board 133 having an antenna 133A and a wireless communication circuit 133B; and a control circuit board 134 on which a control circuit 134A is mounted for controlling the operation of the drive circuit 132A and the wireless communication circuit 133B. These components are housed inside an external casing 136 that is secured to a frame 135.

The frame 135 is made of plastic or other electrically insulating material that has been formed by injection molding or other forming process. The aforementioned components installed inside and outside thereof are appropriately insulated from each other by the frame 135.

Here, the robot 13 is made so that the rotary drive device 100 can move it forward in the leftward direction of FIG. 34. Thus, in this embodiment, the face corresponding to the leftward direction in FIG. 34 (i.e., forward advance direction of the robot 13) is called the "front face" and the face corresponding to the rightward direction in FIG. 34 (i.e., the rearward advance direction of the robot 13) is called the "rear face." The face corresponding to the upper face in FIG. 34 is called the "top face" and the face corresponding to the lower face is called the "bottom face."

A pair of primary batteries or power sources 131 can be used as the power for the robot 13. The power sources 131 are arranged in one side of the frame 135 at approximately the middle thereof in such a manner that they can be inserted and removed freely through the open end of the frame 135. A plus power terminal 131A and a minus power terminal 131B are provided on the respective sides of each power source 131 such that power is drawn from the power sources 131 by the contact of these terminals with the power sources 131.

There are two rotary drive devices 100, one provided on each side of the frame 135. The rotary drive devices 100 are configured in the similarly to that of the first embodiment previously discuss. A slip-prevention member 140 made of silicone rubber or the like is provided around the circumference of each rotating body 101 to serves as a tire. The rotational center of each rotating body 101 is positioned by a positioning hole provided in the base part 4, and the rotary drive device 100 is secured to the frame 135 with screws using the mounting holes 45. When this securing is done, the substrate 37 (FIG. 3) disposed on the opposite side of the base part 4 as the vibrating body 2 is put into pressing contact with an end part of the drive circuit board 132, thus establishing an electrical connection between the vibrating body 2 and the drive circuit 132A of the drive circuit board 132.

One drive circuit board 132 is provided for the two vibrating body 2 of each of the two rotary drive devices 100. Each drive circuit board 132 comprises a flexible substrate made of polyimide resin or the like and has on both sides thereof a drive circuit 132A comprising and electronic circuit for driving the vibrating body 2. One drive circuit board 132 is fixed to a lateral face of the frame 135 and the other drive circuit board 132 is fixed to the top face of the frame 135. In order to reduce size, the drive circuit boards 132 are folded along the contour of the frame 135. The end parts of the drive circuit boards 132 are fastened to the power terminals 131A and 131B with fastening screws 132B, and thereby electrically connected to the power sources 131 so that they can receive electric power from the power sources 131.

Two light emitting diodes 132C are provided on one of the drive circuit boards 132 on the surface thereof that corresponds to the front face of the robot 13. A plurality of terminals (two in this embodiment) for mounting an antenna 133A is provided on the drive circuit board 132 on the surface thereof that corresponds to the top face of the robot. A plurality of antennas 133A (two in this embodiment) is attached to these terminals with solder. The antennas 133A are arranged so as to protrude from the external casing 136. The number, dimensions, mounting angle, and mounting spacing of the antennas 133A are determined as appropriate in order to achieve good transmission and reception of signals with the outside.

The wireless communication circuit board 133 comprises a glass epoxy substrate having electronic components mounted on both sides thereof so as to form a wireless communication circuit 133B. The wireless communication circuit 133B is designed to demonstrate characteristics in compliance with Bluetooth standards. More specifically, it is designed to receive and transmit wireless signals and to modulate and demodulate signals. The wireless communication circuit 133B is connected to the two antennas 133A with coaxial cables (not shown). The wireless communication circuit 133B is electrically connected to the control circuit board 134, which comprises a flexible substrate, etc.

The control circuit board 134 comprises a glass epoxy substrate having electronic components mounted on both sides thereof so as to form a control circuit 134A and is mounted to the side of the frame 135 that corresponds to the rear face. The control circuit board 134 is secured to the drive circuit board 132 with screws or the like such that the two circuit boards are electrically connected together. As a result, the electric power from the electric power source 131 is delivered to the drive circuit 132A, the control circuit 134A, and the wireless communication circuit 133B.

The control circuit 134A is provided with a wireless communication control section 134B for controlling the wireless communication circuit 133B and a drive control section 134C for controlling the drive circuit 132A.

The wireless communication control section 134B is designed to execute control in compliance with Bluetooth standards with respect to a signal from the wireless communication circuit 133B. More specifically, it performs such tasks as determining the signal frequency, determining the timing of signal reception and transmission, converting data, generating packet data, and extracting data from packet data.

Based on the signal extracted by the wireless communication control section 134B, the drive control section 134C is issues drive command signals for driving the vibrating bodies 2 and flashing command signals for flashing the light emitting diodes 132C to the drive circuit 132A. The drive control section 134C is equipped with an auxiliary memory device (not shown) that stores oscillation condition (drive condition) data for driving the vibrating bodies 2.

In addition to having the wireless communication control section 134B and the drive control section 134C, the control circuit 134A is designed such that it can monitor the voltages of the electric power sources 131 and wirelessly communicate that voltage information to an external device through the wireless communication circuit 133B.

The external casing 136 is made of plastic or other material and formed by injection molding or other forming method into the shape of an insect, a popular character, or any other form. The external surface of the external casing 136 is painted with a paint having a metallic luster and ear members 136A formed on the top face and eye members 136B formed on the front face serve to give it the appearance of a living creature. The eye members 136B are made of semitransparent or transparent plastic so that the light from the internal light emitting diodes 132C can be seen from the outside. The external casing 136 is fastened to the frame 135 with screws or the like.

The robot 13 operates as follows. The wireless communication circuit 133B receives a wireless signal from an external device through the antennas 133A and extracts the necessary data from the wireless signal. Based on the extracted data, the drive control section 134C controls the vibrating bodies 2 of the rotary drive devices 1 by using the oscillation condition data from the auxiliary memory device to issue drive signals that cause the vibrating bodies 2 to vibrate in an appropriate manner so as to drive the rotating bodies 101. For example, when both rotating bodies 101 are to be rotated in the forward advance direction, the robot 13 advances forward. Meanwhile, when the drive control section 134C changes the electrodes of the vibrating bodies 2 to which voltage is applied, the rotating bodies 101 are both driven in the opposite direction and the robot 13 moves backward. If one of the rotating bodies 101 is driven and the other is stopped, the robot 13 will turn about the point of contact between the stopped rotating body 101 and the ground; this enables the robot to turn left and right. Finally, if one rotating body 101 is driven forward and the other rotating body 101 is driven rearward, the robot 13 will spin while remaining in the same place.

When the drive control section 134C causes the light emitting diodes 132C to flash, the light from the light emitting diodes 132C can be seen through the eye members 136B of the external casing 136 and the robot 13 can be given facial expressions. Through the combination of the flashing of the light emitting diodes 132C and the movements of the robot 13, the illusion that the robot 13 is communicating with its environment can be created.

Since the wireless communication circuit 133B enables the robot 13 to send and receive signals, the robot 13 can be operated remotely. Furthermore, by having the control circuit 134A monitor the voltage of the electric power sources 131, a wireless signal that recommends changing the battery can be issued to an external device when the remaining capacity of the electric power sources 131 is low and the remaining capacity of the electric power sources 131 can be reported on a regular basis.

Since the fifteenth embodiment uses the rotary drive device 100 of the first embodiment, it provides the same effects as the first embodiment. The use of this rotary drive device 100 as the means by which the robot 13 moves from place to place enables the size of the robot 13 to be reduced. By using two rotary drive devices 100, the robot 13 is enabled to turn left, turn right, and spin in one place, thus improving is operational performance. Additionally, the wireless communication circuit 133B enables the operations of the robot 13 to be controlled and monitored from a remote position.

Sixteenth Embodiment

Figure 36:
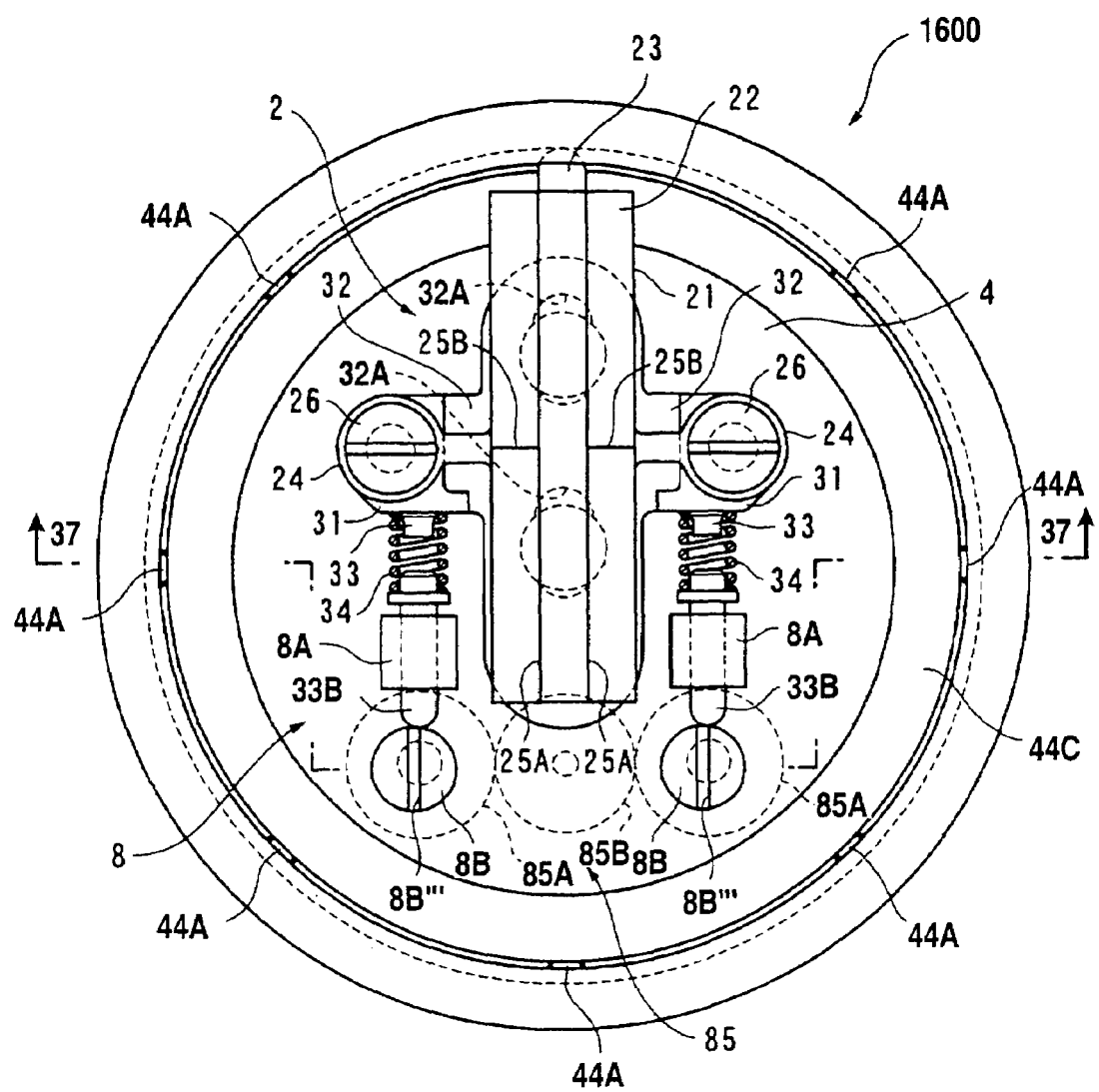
FIG. 36 is a top plan view of a rotary drive device in accordance with a sixteenth embodiment of the present invention.
Figure 37:
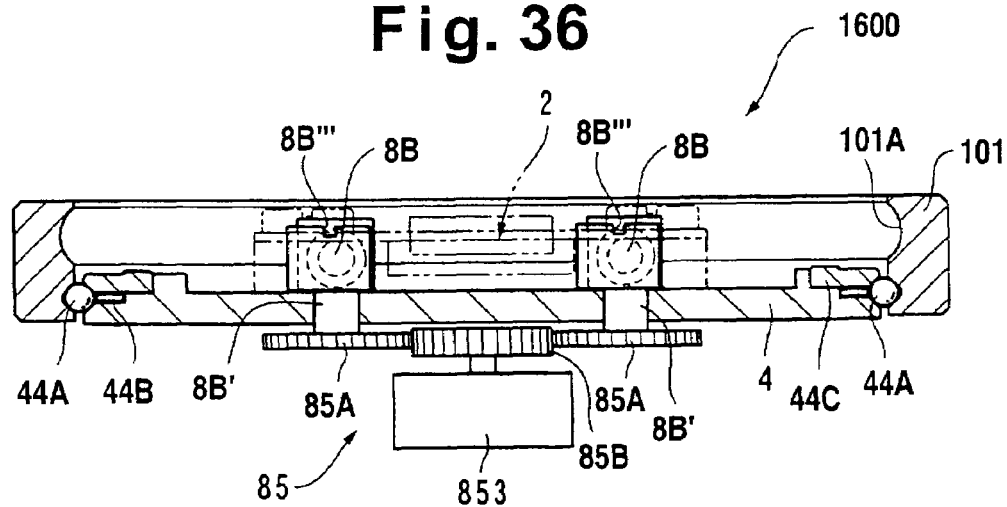
FIG. 37 is a cross sectional view of the rotary drive device of FIG. 36 taken along line 37-37 of FIG. 36 in accordance with the sixteenth embodiment of the present invention.

Referring now to FIGS. 36 and 37, a rotary device 1600 will be described in accordance with a sixteenth embodiment of the present invention. Basically, this rotary drive device 1600 is the same as the rotary drive device 1100 of the eleventh embodiment, except that the pressing force adjusting member 8 has been modified to be automatically adjusted. In view of the similarity between the eleventh and sixteenth embodiments, the parts of the sixteenth embodiment that are identical or substantially identical in function to the parts of the eleventh embodiment will be given the same reference numerals as the parts of the eleventh embodiment. Moreover, the descriptions of the parts of the sixteenth embodiment that are identical or substantially identical in function to the parts of the eleventh embodiment may be omitted for the sake of brevity.

In the eleventh embodiment, the eccentric pins 8B are turned manually by inserting a screwdriver into the operating grooves 8B''', but the invention is not limited to this arrangement and it is acceptable to adjust the pins in an automated manner. For example, the pressing force adjusting member 8 could be automatically adjusted by driving the pressing force adjusting member 8 with a drive mechanism 85, as shown in FIGS. 36 and 37.

FIGS. 36 and 37 shows a variation of the pressing force adjusting member 8 of the rotary drive device 1100. FIG. 36 is a top plan view of the rotary drive device 1600, while FIG. 37 is a cross sectional view of the rotary drive device 1600 taken along line 37-37 of FIG. 36. In FIGS. 36 and 37, the drive mechanism 85 has toothed gears 85A that are fixed to the turning shafts 8B' of the two eccentric pins 8B on the opposite side of the base part 4, a toothed gear 85B that meshes with these toothed gears 85A, and a motor 85C (e.g., stepping motor) whose rotary shaft is secured to the toothed gear 85B. When the motor 85C turns through a prescribed rotational angle, the toothed gear 85B fixed to its shaft turns and the resulting torque is transmitted to the toothed gears 85A, causing the eccentric pins 8B to turn through a prescribed rotational angle. In this way, the force with which the abutting part 23 presses against the rotating body 101 can be adjusted in an automated manner. In the rotary drive device 1600 with this kind of drive mechanism 85, the two eccentric pins 8B can be driven simultaneously with a single motor 85C so as to turn through the same angle. Consequently, the pressing forces of the springs 34 on both sides of the support body can be made the same and good balance between the left and right pressing forces can always be maintained.

Similarly, in all of the embodiments disclosed herein, a pressing force adjusting member can be used with either manual adjustment or automated adjustment.

Seventeenth Embodiment

Figure 38:
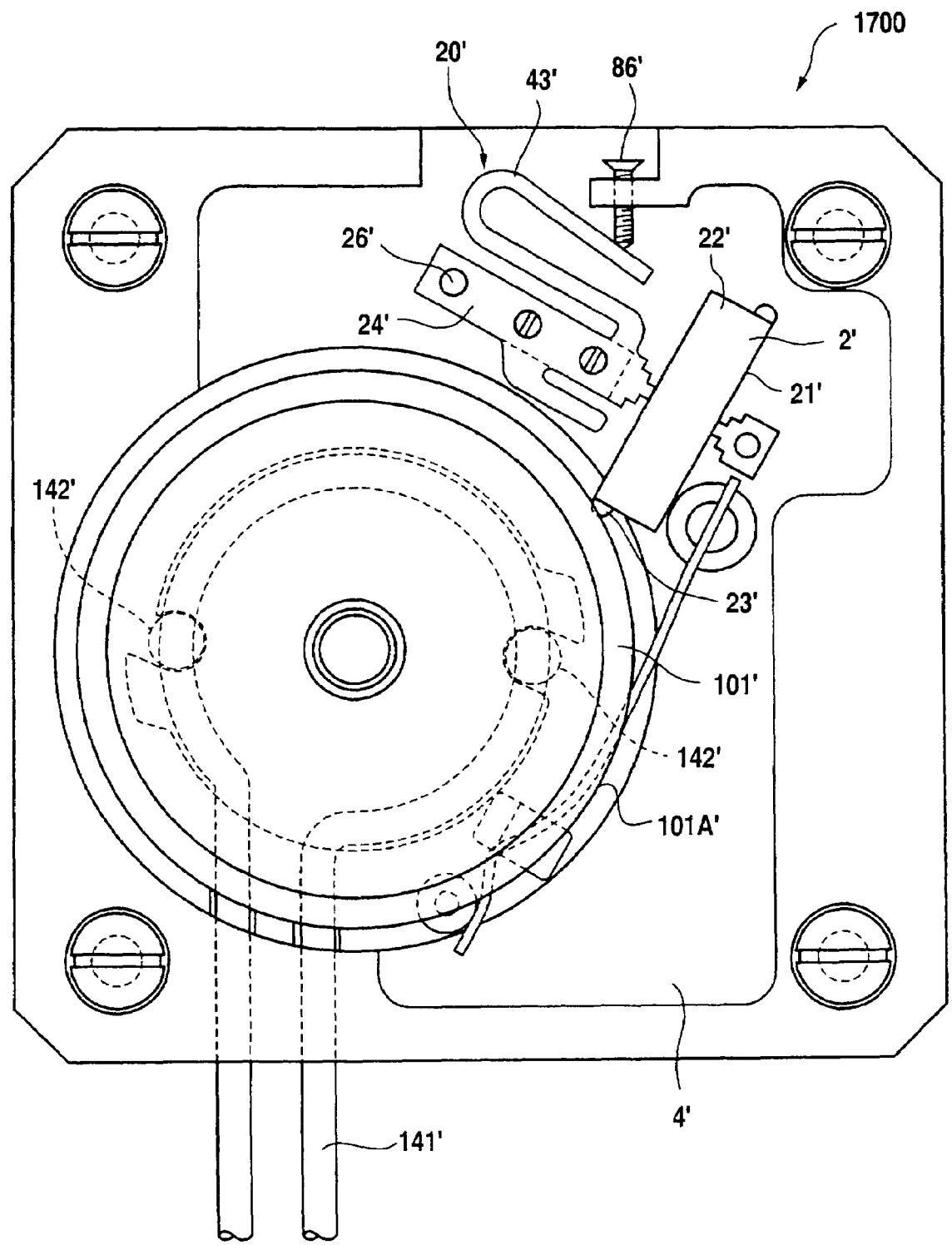
FIG. 38 is a top plan view of a rotary drive device in accordance with a seventeenth embodiment of the present invention.

Referring now to FIG. 38, a rotary drive device 1700 is illustrated in accordance with a seventh embodiment of the present invention. Basically, this rotary drive device 1700 uses the same principles as the prior embodiments. In view of the similarity between this embodiment and the prior embodiments, the descriptions of the parts of this embodiment that are identical or substantially identical in function to the parts of the prior embodiments may be omitted for the sake of brevity. In other words, the constructions of the parts of this embodiment are identical or substantially identical to the construction of the corresponding part of the prior embodiments. For example, this rotary drive device 1700 basically includes a vibrating body 2' movably mounted on a base part 4' and an annular rotating body or rotor 101' rotatably mounted on a base part 4'. The rotating body 101' is driven by the vibrations of the vibrating body 2'. The vibrating body 2' is mounted to the base part 4' in such a manner that the vibrating body 2' can vibrate. The rotating body 101' is provided on the outer circumference of the base part 4' in such a manner that it can rotate relative to the vibrating body 2'.

The vibrating body 2' comprises a reinforcing plate 21' that is generally rectangular in shape, and a pair of flat plate-shaped piezoelectric elements 22' that are provided on the front and back surfaces of the reinforcing plate 21'. The reinforcing plate 21' has at least one abutting part 23' formed integrally on one of the short ends of the reinforcing plate 21', and an arm part 24' coupled to the reinforcing plate 21'. The free edge of the abutting part 23' has a generally convex arc shaped free end as in the other embodiments (e.g., see FIG. 5). The reinforcing plate 21' is arranged such that the tip of the abutting part 23' abuts against an inside concaved circumferential surface of a contact part 101A' of the rotating body 101'.

In the prior embodiments, the vibrating bodies touched against the annular rotating body from the inside, but the invention is not limited to this arrangement and it is also acceptable to drive the rotating body from the outside. For example, the rotary drive device 1600 is part of a liquid feeding apparatus 14 as shown in FIG. 38, in which the vibrating body 2' abuts against the outer circumference of the rotor (rotating body) 101'.

FIG. 38 is a variation of a rotary drive device of the present invention. In FIG. 38, the liquid feeding apparatus is provided with a tube 141' that delivers the liquid, a pair of balls 142' that roll on top of the tube 141' to sequentially pump the liquid inside the tube, and a rotor 101' that presses the balls 142' against the tube 141' while rolling the same. An abutting part 23' of a vibrating body 2' touches against the outside circumferential surface of the rotor 101'. The vibrating body 2' is supported at its approximate lengthwise middle from both sides by an arm part 24'. The arm part 24' is secured to the base part 4' by screws 26'. A generally U-shaped pressing force applying member (pressing force applying means) 43' is formed integrally on the arm part 24'. The tip of a screw 86' touches against the edge of the pressing force applying member 24' from the side at an acute angle. The screw 86' mates with the base part 4' with screw threads and is thereby supported such that its tip can move toward and away from the pressing force applying member 24'.

When the vibrating body 2' vibrates and causes the rotor 101' to rotate, the pressure of the rotor 101' causes the balls 142' to roll while squeezing down the tube 141'. The liquid inside the portion of the tube 141' between the two balls 142' is pushed out sequentially and discharged through the open end of the tube 141'. The force with which the abutting part 23' abuts against the rotor 101' can be adjusted by turning the screw 86' and advancing or retracting its tip, thereby changing the pressing force applied by the pressing force applying member 24'. In response, the vibrating body 2' turns about the screw 26' and its abutting force with respect to the rotor 101' changes.

By driving the rotor 101' from the outside in this manner, the rotor 101' and the vibrating body 2' can be arranged in the same plane and the thickness of the liquid feeding apparatus can be reduced. Also, the positional relationship between the vibrating body 2' and the rotating body or rotor 101' is unrestricted because, similarly to the embodiments, the rotational speed can be changed without a decline in driving force even when the rotor 101' is driven from the outside.

Eighteenth Embodiment

Figure 39:
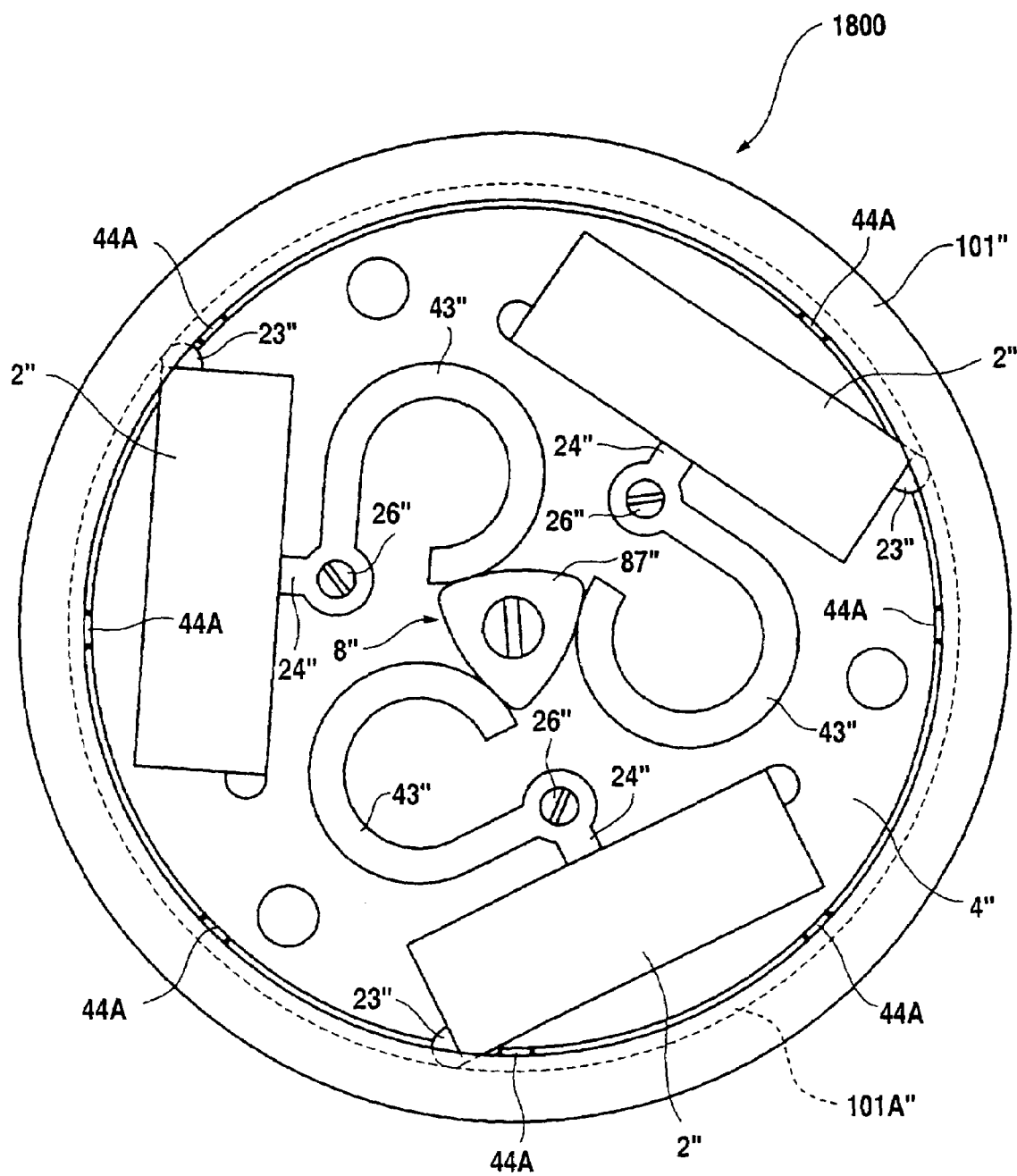
FIG. 39 is a top plan view of a rotary drive device in accordance with an eighteenth embodiment of the present invention.

Referring now to FIG. 39, a rotary drive device 1800 is illustrated in accordance with an eighteenth embodiment of the present invention. Basically, this rotary drive device 1800 uses the same principles as the prior embodiments. In view of the similarity between this embodiment and the prior embodiments, the descriptions of the parts of this embodiment that are identical or substantially identical in function to the parts of the prior embodiments may be omitted for the sake of brevity. In other words, the constructions of the parts of this embodiment are identical or substantially identical to the construction of the corresponding part of the prior embodiments. For example, this rotary drive device 1800 basically includes a plurality of vibrating bodies 2" movably mounted on a base part 4" and an annular rotating body 101" rotatably mounted on a base part 4". The rotating body 101" is driven by the vibrations of the vibrating bodies 2". The vibrating bodies 2" are mounted to the base part 4" in such a manner that the vibrating bodies 2" can vibrate. The rotating body 101" is provided on the outer circumference of the base part 4" in such a manner that it can rotate relative to the vibrating bodies 2".

Each vibrating body 2" is constructed similar to the vibrating bodies 202 of second embodiment, and comprises a reinforcing plate that is generally rectangular in shape, and a pair of flat plate-shaped piezoelectric elements that are provided on the front and back surfaces of the reinforcing plate. The reinforcing plate has at least one abutting part 23" formed integrally on one of the short ends of the reinforcing plate, and an arm part 24" coupled to the reinforcing plate. The free edge of the abutting part 23" has a generally convex arc shaped free end as in the other embodiments (e.g., see FIG. 5). The reinforcing plate 21" is arranged such that the tip of the abutting part 23" abuts against an inside concaved circumferential surface of a contact part 101A" of the rotating body 101".

The present invention is not limited to an arrangement in which there is one pressing force adjusting member 8" for one vibrating body. For example, as shown in FIG. 39, it is acceptable to use one pressing force adjusting member 8" to adjust the pressing force of a plurality of vibrating bodies 2" simultaneously.

FIG. 39 is a top plan view of the rotary drive device 1800 of the present invention. In FIG. 39, three vibrating bodies 2" are fastened to a base part 4" with an abutting part 23" of each vibrating body 2" touching against the rotating body 101" at a prescribed angle. An arm part 24" that is rotatably fastened to the base part 4" by a screw 26" supports each vibrating body 2" on one side at the approximate lengthwise middle thereof. Each arm part 24" has an arc-shaped pressing force applying member (pressing force applying means) 43" formed integrally thereon and one end of the pressing force applying member 43" touches against the lateral surface of a generally triangular eccentric pin 87". The eccentric pin 87" is rotatably supported on the base part 4" with a threaded rotary shaft or the like and thereby constitutes a pressing force adjusting member 8".

In this rotary drive device 1800, voltage is applied to three vibrating bodies 2" simultaneously to drive the rotating body 101". To adjust the force with which the abutting parts 23" press against the rotating body 101", the eccentric pin 87" is turned and the pressing forces of the pressing force applying members 43" are changed. In response, the vibrating bodies 2" turn about the screws 26" and the force with which they press against the rotating body 101" changes. Since this rotary drive device 1800 has a plurality of vibrating bodies 2" driving one rotating body 101", the driving force of each vibrating body 2" can be reduced and the durability of the vibrating bodies 2" can be improved.

With this arrangement, the pressing forces of a plurality of vibrating bodies 2" can be adjusted easily with one pressing force adjusting member 8". Since the pressing forces of the vibrating bodies 2" are uniform, the rotating body 101" can be driven with excellent power transmission efficiency. The pressing force adjusting member 8" can be manually rotated to simultaneously adjust the vibrating bodies 2". Alternatively, the center shaft or screw of the pressing force adjusting member 8" is attached to a motor (e.g., stepping motor similar to a motor 85C) to automatically rotate the pressing force adjusting member 8" to simultaneously adjust the vibrating bodies 2" automatically.

Thus, the shape of the eccentric pin is not limited to the circular shape used in the prior embodiments. In addition to the generally triangular shaped just described, it is acceptable to use any other shape that is appropriate in consideration of the application and the pressing force adjustment range.

The cross sectional shape of the coil is not limited to the circular shape used in the embodiments. The cross sectional shape, number of windings, cross sectional area, etc., of the coil are selected as appropriate in consideration of such factors as the weight of the support body and vibrating body and the range over which the pressing force of the vibrating body against the rotating body is to be adjusted. It is also acceptable to insert an iron core or the like into the coil.

Other Variations

In the preceding descriptions, shapes, materials, etc., were limited to specific examples for the purpose of making the invention readily understandable and these examples were not intended to limit the invention. Thus, the present invention includes any and all descriptions using member names from which a portion of the limitations on shapes, materials, etc., have been removed or from which all limitations have been removed in which the constituent features are presented using terminology that eliminates all or a portion of the limitations on shapes, materials, etc.

In the prior embodiments, the springs that applied the pressing force were fixed to the end part of the support body that is opposite the side where the abutting part is disposed, but the present invention is not limited to such configuration. For example, it is acceptable to arrange springs on the same side of the support body as the abutting part and operate the springs in tension such that the abutting part is pressed against the rotating body. Also, although two springs were arranged on both sides of the support body in the embodiments, it is also acceptable to provide one spring at the approximate middle of the support body to push it toward the rotating body.

When using a pressing force adjusting member having a magnet and a coil, it is also acceptable for the coil to be positioned closer to the abutting part than the magnet. In such a case, the pressing force is adjusted by passing a current through the coil and thereby pulling the magnet such that the abutting part is pressed against the rotating body. Although in the embodiments the magnet was fixed to the support body and the coil was fixed to the base part, it is also acceptable to mount the coil to the support body and the magnet to the base part. It is also acceptable to use a plurality of magnets and coils.

The pressing force adjusting member has been described as comprising springs and eccentric pins or a magnet and a coil, but the invention is not limited to such configurations. For example, in the eleventh embodiment, it is also acceptable to adjust the position of the support body directly without using springs. In short, any structure that allows the force with which the vibrating body presses against the rotating body to be adjusted is acceptable.

Moreover, the invention is not limited to a pressing force adjusting member that can adjust in a stepless manner. For example, in the eleventh embodiment, it is also acceptable to abut the abutting pin of the spring against a catching part formed on the base part and adjust the spring force of the spring by inserting blocks of prescribed thicknesses between the abutting pin and the catching part. In this way, the spring force of the spring is adjusted according to the thickness and number of blocks and thus the pressing force of the abutting part against the rotating body can be adjusted through multiple levels in a step-like manner.

Conversely, in the twelfth and fourteenth embodiments the abutting force was adjusted to one of only two levels by turning the current generating device ON or OFF, but the invention is not limited to such a configuration. For example, it is also acceptable to adjust the value of the current passed through the coil in a stepless manner and thereby adjust the force with which the abutting part presses against the rotating body to any desired value.

More specifically, the structure, material, and shape of the rotary drive device are not limited to those of the previously described embodiments. For example, the previously described embodiments are provided with a pressing force member, but the shape and material of the pressing force applying member are not limited to those described. It is also acceptable not to provide a pressing force applying member.

Openings were provided in the base part and the rotating body of the embodiments, but the positions and shapes of the openings are not limited to those previously described. It is also acceptable not to provide openings.

In the embodiments, the vibrating bodies, guide rollers, and guide parts were arranged around the contact part of the rotating body at equal intervals, but the invention is not limited to such arrangements. So long as the rotating body can rotate smoothly, any appropriate interval arrangement is acceptable. The number of vibrating bodies, guide rollers, and guide parts can also be determined as appropriate. For example, it is acceptable to arrange a plurality of vibrating bodies stacked on top of each other in order to increase the driving force.

In the embodiments, the abutting part was shaped like a convex arc in a cross sectional view and the contact part was shaped like a concave arc in a cross sectional view, but the invention is not limited to this configuration. It is also acceptable to give the abutting part a convex arc shape in a cross sectional view and the contact part a flat planar shape or to give the abutting part a concave arc shape in a cross sectional view and the contact part a convex arc shape in a cross sectional view.

In the previously described embodiments, the abutting part of the vibrating body moves through a generally elliptical path R, but the present invention is not limited to such movement. It is also acceptable for the vibrating body to undergo longitudinal vibration only or bending vibration only.

The invention is not limited to driving the vibrating bodies with one drive signal either. It is acceptable to drive the vibrating bodies with separate drive signals.

The shapes of the reinforcing plate and the piezoelectric element (of the vibrating body) are not limited to those described in the embodiments. For example, it is acceptable to provide the abutting part and the reinforcing plate as separate members.

The shape of the electrodes of the piezoelectric element and the distribution of the drive electrodes and vibration detecting electrodes are not limited to those described in the embodiments.

The material of the base part and the rotating body can be resin, metal, or other material selected appropriately based on such factors as insulating characteristics, strength, workability, cost, lubrication characteristics, etc.

Although in the embodiments the rotating body was an entity that underwent rotational motion, the invention is not limited to such motion; linear motion, for example, is also acceptable. For example, it is acceptable to adopt a structure in which an abutting part of a vibrating body is put in direct contact with a lateral face of a rod-shaped member and the rod-shaped member is made to move in the lengthwise direction by vibrating the vibrating body. Here again, similarly to the embodiments, the speed can be changed without a decline in the drive force. In short, there are no limits on the shape of the driven body. It is also possible to provide tooth-like protrusions on the outer circumference of the rotating body and provide a rod-shaped member that mates with the protrusions so that the rotational motion of the rotating body can be converted into linear motion.

Also, in the embodiments, the method of driving the rotating body was to vibrate a vibrating body along an elliptical path and make the vibrating body contact the rotating body during a portion of said path such that the rotating body was moved by a friction force, but the invention is not limited to such a method. For example, the vibrating body and the rotating body can be arranged so as to be in constant contact and the voltage applied to the vibrating body can be adjusted such that the vibrating body deforms rapidly when it elongates and slowly when it returns. The rotating body can then be moved in an intermittent manner by making the vibrating body slide with respect to the rotating body when it elongates and move the rotating body with a friction force when it returns. In short, the rotating body can be driven using any method so long as it is driven by vibrating the vibrating body against the rotating body to rotate the rotating body.

Rotary drive devices in accordance with the present invention were applied to a toy car in the fourteenth embodiment and a robot in the fifteenth embodiment, but the invention is not limited to such applications. For example, the rotary drive device can be installed in various and sundry apparatuses, such as the previously described liquid feeding apparatus. When applied to other devices as well, the same effects as described in the embodiments can still be obtained and the size of the rotary drive device can be reduced while delivering a prescribed drive torque. Furthermore, the speed of the rotating body can be changed without a decline in the drive force.

Other modes of the present invention are presented below.

A first mode is a drive mechanism in which a vibrating body provided with a piezoelectric element abuts against a driven body and the driven body is driven by the vibration of the vibrating body, the drive mechanism being provided with a pressing force adjusting member or means that adjusts the force with which the vibrating body presses against the driven body.

A second mode is a drive mechanism as recited in the first mode, wherein the tip the vibrating body moves through a generally elliptical path and abuts against the driven body along a portion of the elliptical path and the driven body is driven by the friction force between the vibrating body and the driven body.

A third mode is a drive mechanism as recited in the first or second modes, wherein the pressing force adjusting member is provided such that the pressing force can be adjusted manually.

A fourth mode is a drive mechanism as recited in the first mode or second mode, wherein the pressing force adjusting member is provided such that the pressing force can be adjusted in an automated manner.

A fifth mode is a drive mechanism as recited in any one of the first through fourth modes, wherein the driven body is a rotating body and the vibrating body abuts against the driven body from the inside of the rotating body.

A sixth mode is a drive mechanism as recited in any one of the first through fourth modes, wherein the driven body is a rotating body and the vibrating body abuts against the driven body from the outside of the rotating body.

A seventh mode is a drive mechanism as recited in any one of the first through sixth modes, wherein the pressing force adjusting member can adjust the force with which the vibrating body abuts against the driven body.

An eighth mode is a drive mechanism as recited in any one of the first through seventh modes, wherein the pressing force adjusting member is provided with the following: a support member that supports the vibrating body; a stationary body that supports the support member in such a manner that the support member can advance toward and retract away from the driven body; a spring that is fixed at one end to the support member and presses against the support body; and an eccentric pin that is provided on the stationary body and adjusts the pressing force of the spring.

A ninth mode is a drive mechanism as recited in any one of the first through seventh modes, wherein the pressing force adjusting member is provided with the following: a support member that supports the vibrating body; a stationary body that supports the support member in such a manner that the support member can advance toward and retract away from the driven body; a spring that is fixed at one end to the support member and presses against the support body; and a magnet and coil that attract and repel each other with magnetic force, the magnet or the coil being fixed to the support member and the coil or the magnet (which ever is not fixed to the support part) being fixed to the stationary body.

A tenth mode is a drive mechanism as recited in any one of the first through ninth modes, wherein a plurality of pressing force adjusting member are provided with respect to the vibrating body.

An eleventh mode is a drive mechanism as recited in any one of the first through tenth modes, wherein a plurality of vibrating bodies are provided with respect to the driven body.

A twelfth mode is a drive mechanism as recited in any one of the first through eleventh modes, wherein a plurality of vibrating bodies are provided with respect to the pressing force adjusting member.

A thirteenth mode is an apparatus equipped with a drive mechanism as recited in any one of the first through twelfth modes.

In the first mode, when the force with which the vibrating body presses against the driven body is adjusted by the pressing force adjusting member, the drive force that the vibrating body exerts against the driven body changes, and thus, the movement speed of the driven body changes. Since the drive force is changed by adjusting the force with which the vibrating body is pressed against the driven body, it is not necessary to vibrate the vibrating body in an intermittent manner. Instead, the vibrating state of the vibrating body is kept stable and declines in drive force are prevented.

In the second mode, the vibrating body contacts the driven body during a portion of its elliptical path and causes the driven body to move in the direction of the path. Since the vibrating body moves along an elliptical path, the force with which the tip if the vibrating body contacts the driven body decreases when it moves in the opposite direction as the direction in which the driven body moves. Thus, a decline in the drive force is prevented to an even larger degree. Also, wear of the tip of the vibrating body and wear of the driven body are reduced and the durability of the drive mechanism is improved. This mode is particular useful when the driven body is a rotating body because forces in a direction that hinders the inertial force of the driven body are reduced.

In the third mode, the pressing force is adjusted manually, and thus, the construction of the pressing force adjusting member is simple. As a result, maintenance of the drive mechanism is easy and manufacturing is inexpensive.

In the fourth mode, the pressing force is adjusted in an automated manner. As a result, the force with which the vibrating body abuts against the driven body can be adjusted dynamically while the driven body is moving and the movement speed can be adjusted in a flexible manner.

In the fifth mode, the driven body is a rotating body and, consequently, the driven body tries to maintain its state of movement (i.e., rotation) due to inertia when it is moving (i.e., rotating). Here again, since the vibrating body is vibrating continuously, the vibrating body does not contact the driven body while in a stopped state and reduce the rotational torque of the driven body, as occurs in the prior art. Also, since the vibrating body abuts against the driven body from the inside, the vibrating body is enclosed within the rotational radius of the driven body and the size of the drive mechanism can be reduced.

In the sixth mode, the driven body is a rotating body and, consequently, the driven body tries to maintain its state of movement (i.e., rotation) due to inertia when it is moving (i.e., rotating). Here again, since the vibrating body is vibrating continuously, the vibrating body does not contact the driven body while in a stopped state and reduce the rotational torque of the driven body, as occurs in the prior art. Also, since the vibrating body abuts against the driven body from the outside, the driven body and the vibrating body can be arranged in the same plane and the thickness of the drive mechanism can be reduced.

In the seventh mode, the pressing force can be adjusted in a stepless manner. As a result, the movement speed of the driven body can be set in a stepless manner and fine tuning of the movement speed is simple.

In the eighth mode, the length of the spring changes when the eccentric pin is turned. As the spring force changes, the support member fixed to one end of the spring moves toward or away from the driven body, and thus, the vibrating body moves closer to or farther away from the driven body. As a result, the force with which the vibrating body presses against the driven body is adjusted. The operation is simple because the pressing force is adjusted by merely turning the eccentric pin. Also, since the turning angle of the eccentric pin corresponds to the pressing force of the vibrating body against the driven body, the pressing force can be easily managed and adjusted.

In the ninth mode, a magnetic field is generated inside the coil when a current is passed through the coil and the magnet is attracted or repelled depending on the direction of the current. Since the magnet or the coil is fixed to the support member and the coil or the magnet (which ever is not fixed to the support part) being fixed to the stationary body, the support member and vibrating body are moved toward or away from the driven body. As a result, the force with which the vibrating body presses against the driven body is adjusted. The structure of the pressing force adjusting member is simple because the pressing force is adjusted by merely passing a current through the coil. Also, since the pressing force depends on the current value, the pressing force can be easily managed and adjusted.

In the tenth mode, the load born by a single pressing force adjusting member is reduced because a plurality of pressing force adjusting members is used to adjusted the pressing force of the vibrating body. As a result, the durability of the pressing force adjusting members is improved. Also, fine tuning of the pressing force is easier because the rate at which each pressing force adjusting member changes the pressing force can be set to a smaller rate.

In the eleventh mode, the drive force required from a single vibrating body is reduced because a plurality of vibrating bodies is provided with respect to the driven body. As a result, wear of the portion of the vibrating body that contacts the driven body is reduced and the durability of the drive mechanism is improved.

In the twelfth mode, a plurality of vibrating bodies can be adjusted with one pressing force adjusting member. As a result, the number of parts is reduced and the drive mechanism can be manufactured less expensively. Also, since the vibrating bodies all press against the driven body with a uniform pressing force, the efficiency of power transmission to the driven body is good.

In the thirteenth mode, any of a variety of devices is made using the drive mechanism described in any of the first to twelfth modes. Such a device benefits from the previously described effects. Also, the drive force of the driven body is prevented from declining and the movement speed of the driven body can be adjusted easily.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. In other words, the best configurations and methods of working the present invention have been disclosed in herein, but the present invention is hot limited to these disclosures. Furthermore, the foregoing descriptions of the embodiments according to the present invention are provided for illustration only, and not for the purpose of limiting the invention as defined by the appended claims and their equivalents. In other words, the present invention has been described using mainly prescribed embodiments and drawings, but, so long as the technical concept and object of the invention are not deviated from, those skilled in the art can made various modifications to the previously described embodiments regarding shapes, materials, numbers of parts, and other specific constituent features. Thus, the scope of the invention is not limited to the disclosed embodiments.

What is claimed is:

1. A drive apparatus for driving a driven body, comprising:
   a vibrating body having a piezoelectric element and an abutting part driving the driven body by vibration of the vibration body by application of voltage to the piezoelectric element;
   a control circuit configured to control the application of the voltage to the piezoelectric element;
   a first electrode being configured on a surface of the piezoelectric element, the first electrode being one in the center of three electrodes divided in the width direction of the piezoelectric element;
   a second electrode being configured on the surface of the piezoelectric element, the second electrode being one pair of four electrodes that are divided from two electrodes each of which is configured each longitudinal side of the first electrode, the pair of electrodes being diagonally configured with the first electrode intervening;
   a third electrode being the other pair of the four electrodes; and
   the control circuit switching between a first drive condition and a second drive condition, the first drive condition where the abutting part elliptically oscillates in a first way by application of voltage only to the first electrode and the second electrode, the second drive condition where the abutting part elliptically oscillates in a second way opposite to the first way by application of voltage only to the first electrode and the third electrode.

2. The drive apparatus according to claim 1, wherein
   a width of the first electrode is same as a width of each of the pair of second electrodes and a width of each of the pair of third electrodes, and
   a length of each of the pair of the second electrodes is same as a length of each of the third electrodes.

3. A drive apparatus comprising:
   a base part;
   a rotating body being rotatably configured on the base part and having a contact part configured about a rotational center axis;
   a vibrating body being configured on the base part and having an abutting part;

a piezoelectric element being configured to vibrate upon application of voltage in order for the abutting part to abut repeatedly the contact part to rotate the rotating body;
a control circuit configured to control the application of the voltage to the piezoelectrie element;
a first electrode being configured on a surface of the piezoelectric element, the first electrode being one in the center of three electrodes divided in the width direction of the piezoelectric element;
a second electrode being configured on the surface of the piezoelectric element, the second electrode being one pair of four electrodes that are divided from two electrodes each of which is configured each longitudinal side of the first electrode, the pair of electrodes being diagonally configured with the first electrode intervening; and
a third electrode being the other pair of the four electrodes,
the control circuit switching between a first drive condition and a second drive condition, the first drive condition where the abutting part elliptically oscillates in a first way by application of voltage only to the first electrode and the second electrode, the second drive condition where the abutting part elliptically oscillates in a second way opposite to the first way by application of voltage only to the first electrode and third electrode.

4. The drive apparatus according to claim 3, wherein
a width of the first electrode is same as a width of each of the pair of second electrodes and a width of each of the pair of third electrodes, and
a length of each of the pair of the second electrodes is same as a length of each of the third electrodes.

5. A device comprising:
a drive apparatus having
  a vibrating body having a piezoelectric element and an abutting part driving a driven body by vibration of the vibration body by application of voltage to the piezoelectric element,
  a first electrode being configured on a surface of the piezoelectric element, the first electrode being one in the center of three electrodes divided in the width direction of the piezoelectric element,
  a second electrode being configured on the surface of the piezoelectric element, the second electrode being one pair of four electrodes that are divided from two electrodes each of which is configured each longitudinal side of the first electrode, the pair of electrodes being diagonally configured with the first electrode intervening;
  a third electrode being the other pair of the four electrodes, and
  a the control circuit switching between a first condition and a second condition, the first condition where the contact part elliptically oscillates in a first way by application of voltage only to the first electrode and the second electrode, the second drive condition where the contact part elliptically oscillates in a second way opposite to the first way by application of voltage only to the first electrode and the third electrode.

6. The device according to claim 5, further comprising an indicator hand connected to and driven by the drive apparatus to show time information.

7. The device according to claim 5, further comprising a centrifugal fan being connected to and driven by the drive apparatus to blow air.

8. The device according to claim 5, further comprising,
a case configured to house the drive apparatus, and
a tire configured on the case and connected to and driven by the drive apparatus to move.

9. The drive apparatus according to claim 1, wherein
the abutting part elliptically oscillates by bending vibration and longitudinal vibration of the vibrating body, and
a ratio of a resonance frequency of the bending vibration of the vibrating body to a resonance frequency of the longitudinal vibration of the vibrating body is from 1.00 to 1.03.

10. The drive apparatus according to claim 3, wherein
the abutting part elliptically oscillates by bending vibration and longitudinal vibration of the vibrating body, and
a ratio of a resonance frequency of the bending vibration of the vibrating body to a resonance frequency of the longitudinal vibration of the vibrating body is from 1.00 to 1.03.

11. The device according to claim 5, wherein
the abutting part elliptically oscillates by bending vibration and longitudinal vibration of the vibrating body, and
a ratio of a resonance frequency of the bending vibration of the vibrating body to a resonance frequency of the longitudinal vibration of the vibrating body is from 1.00 to 1.03.

* * * * *